(12) United States Patent
Jeon et al.

(10) Patent No.: US 11,528,036 B2
(45) Date of Patent: Dec. 13, 2022

(54) METHOD AND DEVICE FOR CARRYING OUT CHANNEL CODING USING LOW DENSITY PARITY CHECK MATRIX IN WIRELESS COMMUNICATION SYSTEM

(71) Applicant: LG Electronics Inc., Seoul (KR)

(72) Inventors: Kijun Jeon, Seoul (KR); Sangrim Lee, Seoul (KR); Hojae Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 17/421,210

(22) PCT Filed: Dec. 5, 2019

(86) PCT No.: PCT/KR2019/017094
§ 371 (c)(1),
(2) Date: Jul. 7, 2021

(87) PCT Pub. No.: WO2020/145516
PCT Pub. Date: Jul. 16, 2020

(65) Prior Publication Data
US 2022/0069842 A1 Mar. 3, 2022

(30) Foreign Application Priority Data
Jan. 7, 2019 (KR) .................. 10-2019-0001708
Jul. 3, 2019 (KR) .................. 10-2019-0079999

(51) Int. Cl.
*H03M 13/11* (2006.01)
*H04L 1/00* (2006.01)
*H04L 1/20* (2006.01)

(52) U.S. Cl.
CPC .......... *H03M 13/11* (2013.01); *H04L 1/0061* (2013.01); *H04L 1/20* (2013.01)

(58) Field of Classification Search
CPC ........ H03M 13/11; H04L 1/0061; H04L 1/20; H04L 1/00
See application file for complete search history.

(56) References Cited

U.S. PATENT DOCUMENTS

2008/0178065 A1* 7/2008 Khandekar ........ H03M 13/1137
714/E11.002
2009/0210767 A1 8/2009 Myung et al.
(Continued)

FOREIGN PATENT DOCUMENTS

| WO | WO2008092040 | 7/2008 |
|---|---|---|
| WO | WO2018082290 | 5/2018 |
| WO | WO2018143743 | 8/2018 |

OTHER PUBLICATIONS

International Search Report in International Appln. No. PCT/KR2019/017094, dated Mar. 23, 2020, 16 pages.

*Primary Examiner* — Thien Nguyen
(74) *Attorney, Agent, or Firm* — Fish & Richardson P.C.

(57) ABSTRACT

A method for transmitting an information block on the basis of a low density parity check (LDPC) code in a wireless communication system, according to the present disclosure, may comprise: encoding an information block on the basis of a LDPC basegraph H_BG including [MATRIX]; and transmitting the encoded information block. Each element of H_BG is either zero ("0") or one ("1"), and each element which is "0", among the elements of H_BG, may represent a Z×Z zero matrix, and each element which is "1", among the elements of H_BG, may represent a Z×Z matrix acquired on the basis of a circular permutation matrix acquired by circularly shifting a Z×Z identity matrix to the left or right. The submatrix T_BG of H_BG may be a dual diagonal matrix, and the submatrix D_BG of H_BG may be a dual diagonal matrix. The encoding of the information block on the basis of H_BG may comprise encoding the information (Continued)

block on the basis of a parity check matrix (PCM) H which corresponds to H_BG.

20 Claims, 33 Drawing Sheets

(56) References Cited

U.S. PATENT DOCUMENTS

| | | | |
|---|---|---|---|
| 2013/0013973 A1 | 1/2013 | Livshitz | |
| 2018/0048330 A1* | 2/2018 | Park | H03M 13/116 |
| 2018/0226989 A1* | 8/2018 | Soriaga | H03M 13/1137 |
| 2018/0337691 A1* | 11/2018 | Kalachev | H03M 13/6516 |
| 2019/0260390 A1* | 8/2019 | Shutkin | H03M 13/114 |

\* cited by examiner

| | Matrix description | Inverse matrix description | Impementation description of inverse matrix multiplication | Complexity order |
|---|---|---|---|---|
| T | | | $p = T^{-1} \times x$ | $O(k)$ |
| Φ | | | $p = \Phi^{-1} \times x$ | $O(k)$ |

☐ : $I_Z^{-1}$

▨ : $I^0$

▦ : $I^0 + I_Z^0$

▩ : $A$

| submatix description of $\Phi^{-1}$ | description of $p = \Phi^{-1} \times x$ |
|---|---|
| | $p_1 = \boxtimes \times x_1$ |
| ▦ = ▩ × ▩ | $p_2 = \boxtimes \times (p_1 + x_2)$ |
| ▦ = ▩ × ▦ | $p_3 = \boxtimes \times (p_2 + x_3)$ |
| ▦ = ▩ × ▦ | $p_4 = \boxtimes \times (p_3 + x_4)$ |
| ▦ = ▩ × ▦ | $p_5 = \boxtimes \times (p_4 + x_5)$ |
| ▦ = ▩ × ▦ | $p_6 = \boxtimes \times (p_5 + x_6)$ |

$p = [p_1 \, p_2 \, p_3 \, p_4 \, p_5 \, p_6]$ $x = [x_1 \, x_2 \, x_3 \, x_4 \, x_5 \, x_6]$

RJA code erase edge in the
protograph-level

Protograph with degree-3 VNs

FIG. 27
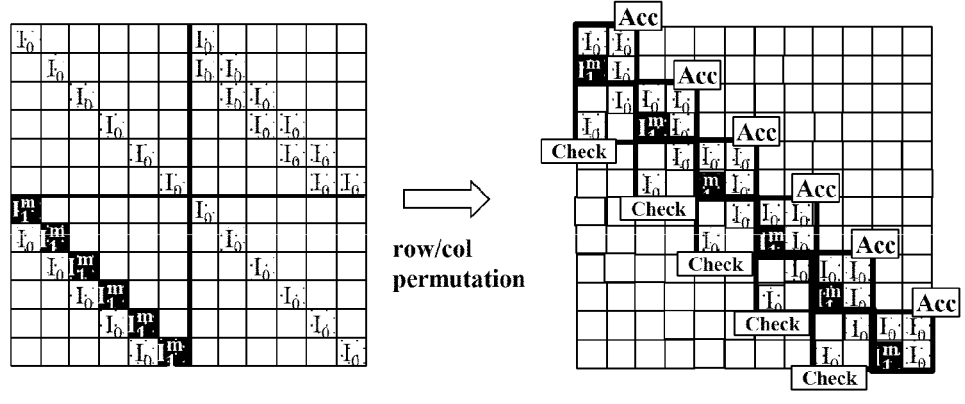
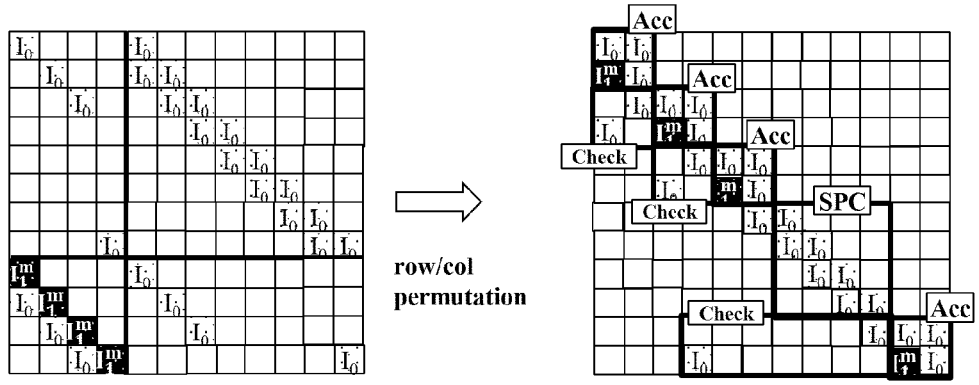

METHOD AND DEVICE FOR CARRYING OUT CHANNEL CODING USING LOW DENSITY PARITY CHECK MATRIX IN WIRELESS COMMUNICATION SYSTEM

CROSS-REFERENCE TO RELATED APPLICATIONS

This application is a National Stage application under 35 U.S.C. § 371 of International Application No. PCT/KR2019/017094, filed on Dec. 5, 2019, which claims the benefit of Korean Application Nos. 10-2019-0079999, filed on Jul. 3, 2019, and 10-2019-0001708, filed on Jan. 7, 2019. The disclosures of the prior applications are incorporated by reference in their entirety.

TECHNICAL FIELD

The present disclosure relates to a wireless communication system, and more particularly to a method and device for performing channel coding based on a low-density parity check matrix.

BACKGROUND

Low density parity check (LPDC) codes and iterative decoding algorithms were introduced in 1962 by Gallager, and were rediscovered in 1996 by MacKay and Neal.

In information theory, LDPC codes are linear error correction codes, are used in a noise transmission channel, and are also referred to as linear block codes. Based on a bipartite graph, LDPC codes can be designed. The LDPC codes may be referred to as capacity access codes because they can provide performance close to the Shannon limit using iterative soft-decision algorithms. In legacy 3GPP-based communication systems (e.g., LTE, LTE-A, LTE-A pro, etc.), capacity access codes called turbo codes are used. It is well known in the art that the LDPC code has a bit error rate (BER) that is close to the Shannon limit in a binary additive white Gaussian noisy (AWGN) channel. By using the LDPC coding method, a low error rate having a relatively low complexity can be achieved.

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

SUMMARY

An object of the present disclosure is to provide a method and device for performing channel coding based on a low density parity check (LDPC) matrix in a wireless communication system.

It will be appreciated by persons skilled in the art that the objects that could be achieved with the present disclosure are not limited to what has been particularly described hereinabove and the above and other objects that the present disclosure could achieve will be more clearly understood from the following detailed description.

In accordance with an aspect of the present disclosure, a method for transmitting an information block based on a low density parity check (LDPC) code in a wireless communication system may include encoding the information block based on a LDPC basegraph (H_BG) including $$\begin{pmatrix} A\_BG & B\_BG & T\_BG \\ C\_BG & D\_BG & E\_BG \end{pmatrix},$$

and transmitting the encoded information block. Each element of the LDPC basegraph (H_BG) may be '0' or 'I'. Each element '0' from among elements of the LDPC basegraph (H_BG) may represent a (Z×Z) zero matrix. Each element 'I' from among elements of the LDPC basegraph (H_BG) may represent a (Z×Z) matrix obtained based on a circular permutation matrix that is obtained by cyclic-shifting a (Z×Z) identity matrix to the left or to the right. A submatrix (T_BG) of the LDPC basegraph (H_BG) may be a dual diagonal matrix. A submatrix (D_BG) of the LDPC basegraph (H_BG) may be a dual diagonal matrix.

The encoding the information block based on the LDPC basegraph (H_BG) may include encoding the information block based on a parity check matrix (PCM) (H) corresponding to the LDPC basegraph (H_BG).

A (Z×Z) matrix represented by each diagonal element of the submatrix (D_BG) may be configured in a manner that all elements of a first row of a corresponding (Z×Z) circular permutation matrix are '0'.

A submatrix (A_BG) and a submatrix (C_BG) may correspond to an information part, and a submatrix (B_BG), a submatrix (D_BG), a submatrix (T_BG), and a submatrix (E_BG) may correspond to a parity part. The submatrix (B_BG) may be an (M×M) identity matrix (where M is a natural number). The submatrix (E_BG) may be an (M×M) identity matrix. The submatrix (D_BG) may be an (M×M) matrix. The submatrix (T_BG) may be an (M×M) matrix.

A submatrix (A_BG) and a submatrix (C_BG) may correspond to an information part. A submatrix (B_BG), a submatrix (D_BG), a submatrix (T_BG), and a submatrix (E_BG) may correspond to a parity part. The submatrix (D_BG) may be an (M1×M1) matrix (where M1 is a natural number). The submatrix (T_BG) may be an (M2×M2) matrix (where M2 is a natural number). The submatrix (B_BG) may be an (M2×M1) matrix. An element of a last row of a last column of the submatrix (B_BG) may be '1', each of elements included in remaining rows of the last column may be '0', one element included in each of columns from a first column to an (M1−1)-th column of the submatrix (B_BG) may be '1', and remaining elements included in each of the columns from the first column to the (M1−1)-th column of the submatrix (B_BG) may be '0'. The submatrix (E_BG) is an (M1×M2) matrix. An element of a last column of a last row of the submatrix (E_BG) may be '1', each of elements included in remaining columns of the last row of the submatrix (E_BG) may be '0', one element included in each of rows from a first row to an (M1−1)-th row of the submatrix (E_BG) may be '1', and remaining elements included in each of the rows from the first row to the (M1−1)-th row of the submatrix (E_BG) may be '0'.

In accordance with another aspect of the present disclosure, a method for receiving an information block based on a low density parity check (LDPC) code in a wireless communication system may include receiving an encoded information block, and decoding the information block based on a LDPC basegraph (H_BG) including $$\begin{pmatrix} A\_BG & B\_BG & T\_BG \\ C\_BG & D\_BG & E\_BG \end{pmatrix}.$$

Each element of the LDPC basegraph (H_BG) may be '0' or '1'. Each element '0' from among elements of the LDPC basegraph (H_BG) may represent a (Z×Z) zero matrix. Each element '1' from among elements of the LDPC basegraph (H_BG) may represent a (Z×Z) matrix obtained based on a circular permutation matrix that is obtained by cyclic-shifting a (Z×Z) identity matrix to the left or to the right. A submatrix (T_BG) may be a dual diagonal matrix. A submatrix (D_BG) may be a dual diagonal matrix.

In accordance with another aspect of the present disclosure, a device for transmitting an information block based on a low density parity check (LDPC) code in a wireless communication system may include a transceiver, a memory, and at least one processor connected to the transceiver and the memory.

The memory may be configured to store instructions causing, when executed, the at least one processor to perform a specific operation. The specific operation comprises encoding the information block based on a low density parity check (LDPC) basegraph (H_BG) including $$\begin{pmatrix} A\_BG & B\_BG & T\_BG \\ C\_BG & D\_BG & E\_BG \end{pmatrix},$$

and transmitting the encoded information block.

Each element of the LDPC basegraph (H_BG) may be '0' or '1'. Each element '0' from among elements of the LDPC basegraph (H_BG) may represent a (Z×Z) zero matrix. Each element '1' from among elements of the LDPC basegraph (H_BG) may represent a (Z×Z) matrix obtained based on a circular permutation matrix that is obtained by cyclic-shifting a (Z×Z) identity matrix to the left or to the right. A submatrix (T_BG) of the LDPC basegraph (H_BG) may be a dual diagonal matrix, and a submatrix (D_BG) of the LDPC basegraph (H_BG) may be a dual diagonal matrix.

The transmitting device may be mounted or embedded in an autonomous driving device that is configured to communicate with at least one of a mobile terminal, a base station (BS), and an autonomous vehicle.

As is apparent from the above description, the embodiments of the present disclosure can efficiently perform channel coding by performing channel coding based on a low density parity check (LDPC) matrix.

The embodiments of the present disclosure can provide a method for improving performance of a wireless communication system designed to use LDPC coding.

The embodiments of the present disclosure can perform LDPC encoding/decoding that has an efficient decoding threshold along with an error flow.

It will be appreciated by persons skilled in the art that the effects that can be achieved with the present disclosure are not limited to what has been particularly described hereinabove and other advantages of the present disclosure will be more clearly understood from the following detailed description taken in conjunction with the accompanying drawings.

BRIEF DESCRIPTION OF THE DRAWINGS

The accompanying drawings, which are included to provide a further understanding of the disclosure and are incorporated in and constitute a part of this specification, illustrate embodiments of the disclosure.

FIG. 13 is a diagram illustrating an example of a parity check matrix that is represented as a model matrix and a basegraph.

FIG. 21 is a conceptual diagram illustrating a method for efficiently implementing the inverse matrix $(T^{-1})$ of the matrix (T) and the inverse matrix $(\varphi^{-1})$ of the matrix $(\varphi)$.

FIG. 27 illustrates the results of examples in which SRJA code can be considered to be RMACA code.

DETAILED DESCRIPTION

Figure 1A:
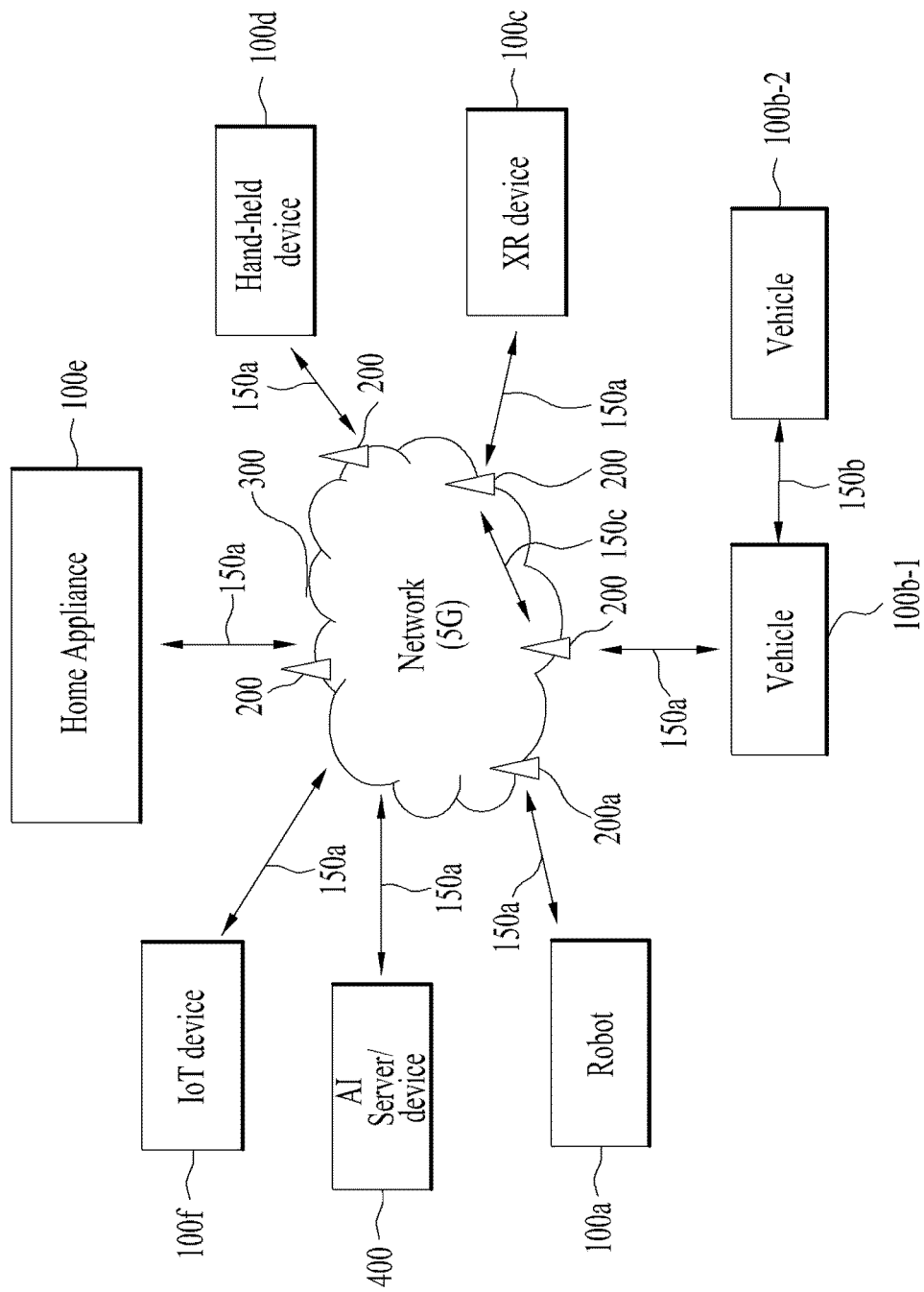
FIG. 1A illustrates a communication system applied to the present disclosure.

Reference will now be made in detail to the preferred embodiments of the present disclosure, examples of which are illustrated in the accompanying drawings. In the following detailed description of the disclosure includes details to help the full understanding of the present disclosure. Yet, it is apparent to those skilled in the art that the present disclosure can be implemented without these details. For instance, although the following descriptions are made in detail on the assumption that a mobile communication system includes 3GPP LTE system and 3GPP LTE-A, the following descriptions are applicable to other random mobile communication systems in a manner of excluding unique features of the 3GPP LTE and 3GPP LTE-A.

Occasionally, to prevent the present disclosure from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like.

The following lists represent the references cited in this document.

[1] 3GPP, "Feasibility study on new services and markets technology enablers for critical communications," 3GPP TR 22.862 V14.1.0, September 2016.

[2] M. Shirvanimoghaddam et al., "Short block-length codes for ultra-reliable low-latency communications," submitted to IEEE Commun. Mag., February 2018.

[3] 3GPP, "5G; Study on scenarios and requirements for next generation access technologies," 3GPP TR 38.913 V14.2.0, May 2017.

[4] R1-1812110 (R2-1816043), TSG RAN WG2, "LS on TSN requirements evaluation," 3GPP TSG RAN WG1 #95, Spokane, USA, 12-16 Nov. 2018.

[5] 3GPP, "Multiplexing and channel coding," 3GPP TS 38.212 V1.2.1, December 2017.

[6] D. Divsalar et al., "Capacity-approaching protograph codes," IEEE Jour. Sel. Areas Commun. (JSAC), vol. 27, no. 6, August, 2009.

[7] D. Divsalar et al., "Protograph based LDPC codes with minimum distance linearly growing with block size," in Proc. IEEE Global Telecommun. Conf., St. Louis, Mo., USA, November/December 2005.

[8] C. Ravazzi and F. Fagnani, "Spectra and minimum distances of repeat multiple-accumulate," IEEE Trans. Inf. Theory, vol. 55, no. 11, pp. 4905-4924, November 2009.

[9] K. J. Jeon and K. S. Kim, "Accumulate repeat accumulate check accumulate codes," IEEE Trans. Commun., vol. 65, no. 11, pp. 4585-4599, November 2017.

[10] K. J. Jeon and K. S. Kim, "Rate-compatible ARACA codes," Elect. Lett., vol. 54, no. 6, pp. 398-400, March 2018.

[11] K. Andrews, S. Dolinar, and J. Thorpe, "Encoders for block-circulant LDPC codes," in Proc. Int. Symp. Inf. Theory (ISIT), September 2005, pp. 2300-2304.

[12] T. J. Richardson and R. L. Urbanke, "Efficient encoding of low-density parity-check codes," IEEE Trans. Inf. Theory, vol. 47, no. 2, pp. 638-656, February 2011.

[13] G. Liva and M. Chiani, "Protograph LDPC codes design based on EXIT analysis," in Proc. Globecom, Washington, D.C., November 2007.

In 3GPP TS 38.212 (Reference [5]) serving as a 5G/NR technology standard, an LDPC coding method has been adopted in transport channels (TrCH) such as UL-SCH (uplink shared channel), DL-SCH (downlink shared channel), PCH (paging channel), etc. In addition, LDPC coding can be utilized in ultra-reliable low-latency communication (URLLC) acting as one of 5G use cases. In a communication environment requiring high reliability and low latency, the LDPC coding method has been actively researched as an efficient coding method.

In recent wireless communication systems, strict requirements regarding latency and reliability have been proposed. In particular, ultra-reliable low-latency communication (URLLC) from among various usage scenarios for use in 5G wireless communication systems has been actively studied. In URLCC usage scenarios, in order to shorten decoding latency for URLCC, a new LDPC encoding parity check matrix (PCM) has been proposed.

In the present disclosure, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a BS will be referred to as an eNB regardless of type or version of communication technology.

In the present disclosure, a node refers to a fixed point capable of transmitting/receiving a radio signal through communication with a UE. Various types of eNBs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be an eNB. For example, the node may be a radio remote head (RRH) or a radio remote unit (RRU). The RRH or RRU generally has a lower power level than a power level of an eNB. Since the RRH or RRU (hereinafter, RRH/RRU) is generally connected to the eNB through a dedicated line such as an optical cable, cooperative communication between RRH/RRU and the eNB can be smoothly performed in comparison with cooperative communication between eNBs connected by a radio line. At least one antenna is installed per node. The antenna may mean a physical antenna or mean an antenna port or a virtual antenna.

In the present disclosure, a cell refers to a prescribed geographical area to which one or more nodes provide a communication service. Accordingly, in the present disclosure, communicating with a specific cell may mean communicating with an eNB or a node which provides a communication service to the specific cell. In addition, a DL/UL signal of a specific cell refers to a DL/UL signal from/to an eNB or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between an eNB or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region. A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Specifically, the "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency is the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both an eNB and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are used as the UL physical channels, and a demodulation reference signal (DM RS) for a UL control/ data signal and a sounding reference signal (SRS) used for UL channel measurement are used as the UL physical signals.

In the present disclosure, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present disclosure, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present disclosure, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of an eNB is conceptually identical to downlink data/DCI transmission on PDCCH/PCFICH/PHICH/PDSCH, respectively.

For terms and technologies which are not described in detail in the present disclosure, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.xxx. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present disclosure, the corresponding technology is referred to as a new RAT (NR) or 5G RAT, for convenience.

A 5G communication system demands that much better performance than a legacy fourth generation (4G) system be supported in terms of data rate, capacity, latency, energy consumption, and cost. Accordingly, the 5G system needs to make progress in terms of bandwidth, spectrum, energy, signaling efficiency, and cost per bit. 5G needs to use efficient waveforms in order to satisfy these requirements.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc. UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE.

Moreover, in the following description, specific terminologies are provided to help the understanding of the present disclosure. And, the use of the specific terminology can be modified into another form within the scope of the technical idea of the present disclosure.

FIG. 1A illustrates a communication system 1 applied to the present disclosure.

Referring to FIG. 1A, the communication system 1 applied to the present disclosure includes wireless devices, BSs, and a network. The wireless devices refer to devices performing communication by radio access technology (RAT) (e.g., 5G New RAT (NR) or LTE), which may also be called communication/radio/5G devices. The wireless devices may include, but no limited to, a robot 100a, vehicles 100b-1 and 100b-2, an extended reality (XR) device 100c, a hand-held device 100d, a home appliance 100e, an IoT device 100f, and an artificial intelligence (AI) device/server 400. For example, the vehicles may include a vehicle equipped with a wireless communication function, an autonomous driving vehicle, and a vehicle capable of performing vehicle-to-vehicle (V2V) communication. The vehicles may include an unmanned aerial vehicle (UAV) (e.g., a drone). The XR device may include an augmented reality (AR)/virtual reality (VR)/mixed reality (MR) device, and may be implemented in the form of a head-mounted device (HMD), a head-up display (HUD) mounted in a vehicle, a television (TV), a smartphone, a computer, a wearable device, a home appliance, a digital signage, a vehicle, a robot, and so on. The hand-held device may include a smartphone, a smartpad, a wearable device (e.g., a smartwatch or smart glasses), and a computer (e.g., a laptop). The home appliance may include a TV, a refrigerator, and a washing machine. The IoT device may include a sensor and a smart meter. For example, the BSs and the network may be implemented as wireless devices, and a specific wireless device 200a may operate as a BS/network node for other wireless devices.

The wireless devices 100a to 100f may be connected to the network 300 via the BSs 200. An AI technology may be applied to the wireless devices 100a to 100f, and the wireless devices 100a to 100f may be connected to the AI server 400 via the network 300. The network 300 may be configured by using a 3G network, a 4G (e.g., LTE) network, or a 5G (e.g., NR) network. Although the wireless devices 100a to 100f may communicate with each other through the BSs 200/network 300, the wireless devices 100a to 100f may perform direct communication (e.g., sidelink communication) with each other without intervention of the BSs/network. For example, the vehicles 100b-1 and 100b-2 may perform direct communication (e.g. V2V/vehicle-to-everything (V2X) communication). The IoT device (e.g., a sensor) may perform direct communication with other IoT devices (e.g., sensors) or other wireless devices 100a to 100f.

Wireless communication/connections 150a, 150b, or 150c may be established between the wireless devices 100a to 100f and the BSs 200, or between the BSs 200. Herein, the wireless communication/connections may be established through various RATs (e.g., 5G NR) such as UL/DL communication 150a, sidelink communication 150b (or, D2D communication), or inter-BS communication 150c (e.g. relay, integrated access backhaul (IAB)). A wireless device and a BS/a wireless devices, and BSs may transmit/receive radio signals to/from each other through the wireless communication/connections 150a, 150b, and 150c. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

Figure 1B:
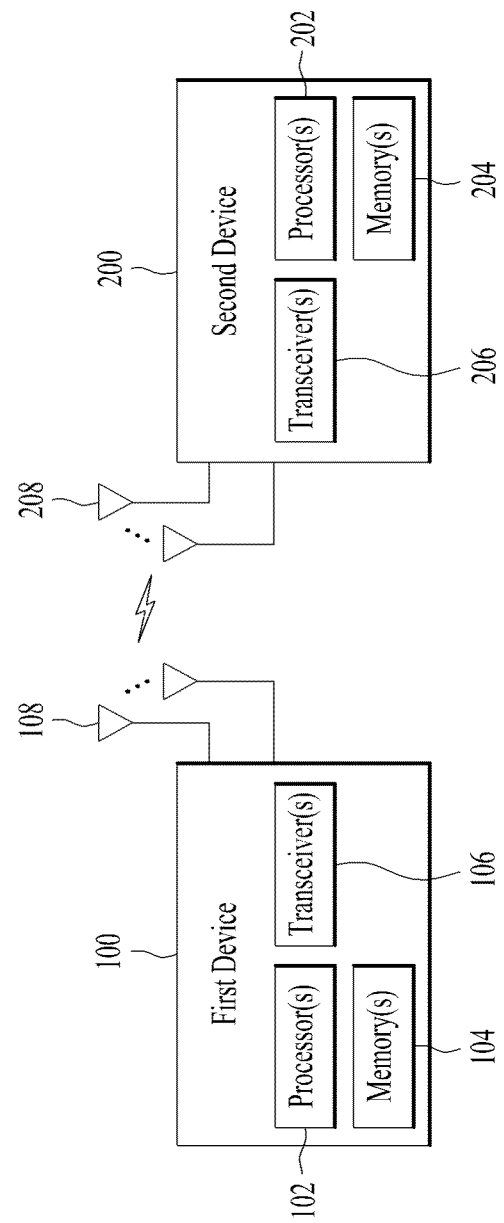
FIG. 1B illustrates wireless devices applicable to the present disclosure.

FIG. 1B illustrates wireless devices applicable to the present disclosure.

Referring to FIG. 1B, a first wireless device 100 and a second wireless device 200 may transmit radio signals through a variety of RATs (e.g., LTE and NR). Herein, {the first wireless device 100 and the second wireless device 200} may correspond to {the wireless devices 100a to 100f and the BSs 200} and/or {the wireless devices 100a to 100f and the wireless devices 100a to 100f} of FIG. 1A.

The first wireless device 100 may include at least one processor 102 and at least one memory 104, and may further include at least one transceiver 106 and/or at least one antenna 108. The processor 102 may control the memory 104 and/or the transceiver 106 and may be configured to implement the descriptions, functions, procedures, proposals, methods, and/or operational flowcharts disclosed in this document. For example, the processor 102 may process information within the memory 104 to generate first information/signal and then transmit a radio signal including the first information/signal through the transceiver 106. The processor 102 may receive a radio signal including second information/signal through the transceiver 106 and then store information obtained by processing the second information/signal in the memory 104. The memory 104 may be coupled to the processor 102 and store various types of information related to operations of the processor 102. For example, the memory 104 may store software code including commands for performing a part or all of processes controlled by the processor 102 or for performing the descriptions, functions, procedures, proposals, methods, and/or operational flowcharts disclosed in this document. Herein, the processor 102 and the memory 104 may be a part of a communication modem/circuit/chip designed to implement an RAT (e.g., LTE or NR). The transceiver 106 may be coupled to the processor 102 and transmit and/or receive radio signals through the at least one antenna 108. The transceiver 106 may include a transmitter and/or a receiver. The transceiver 106 may be interchangeably used with an RF unit. In the present disclosure, a wireless device may refer to a communication modem/circuit/chip.

The second wireless device 200 may include at least one processor 202 and at least one memory 204, and may further include at least one transceiver 206 and/or at least one antenna 208. The processor 202 may control the memory 204 and/or the transceiver 206 and may be configured to implement the descriptions, functions, procedures, proposals, methods, and/or operational flowcharts disclosed in this document. For example, the processor 202 may process information within the memory 204 to generate third information/signal and then transmit a radio signal including the third information/signal through the transceiver 206. The processor 202 may receive a radio signal including fourth information/signal through the transceiver 206 and then store information obtained by processing the fourth information/signal in the memory 204. The memory 204 may be coupled to the processor 202 and store various types of information related to operations of the processor 202. For example, the memory 204 may store software code including commands for performing a part or all of processes controlled by the processor 202 or for performing the descriptions, functions, procedures, proposals, methods, and/or operational flowcharts disclosed in this document. Herein, the processor 202 and the memory 204 may be a part of a communication modem/circuit/chip designed to implement an RAT (e.g., LTE or NR). The transceiver 206 may be coupled to the processor 202 and transmit and/or receive radio signals through the at least one antenna 208. The transceiver 206 may include a transmitter and/or a receiver. The transceiver 206 may be interchangeably used with an RF unit. In the present disclosure, a wireless device may refer to a communication modem/circuit/chip.

Hereinafter, hardware elements of the wireless devices 100 and 200 will be described in greater detail. One or more protocol layers may be implemented by, but not limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more protocol data units (PDUs) and/or one or more service data units (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented in hardware, firmware, software, or a combination thereof. For example, one or more application specific integrated circuits (ASICs), one or more digital signal processors (DSPs), one or more digital signal processing devices (DSPDs), one or more programmable logic devices (PLDs), or one or more field programmable gate arrays (FPGAs) may be included in the one or more processors 102 and 202. The descriptions, functions, procedures, proposals, methods, and/or operational flowcharts disclosed in this document may be implemented in firmware or software, which may be configured to include modules, procedures, or functions. Firmware or software configured to perform the descriptions, functions, procedures, proposals, methods, and/or operational flowcharts disclosed in this document may be included in the one or more processors 102 and 202, or may be stored in the one or more memories 104 and 204 and executed by the one or more processors 102 and 202. The descriptions, functions, procedures, proposals, methods, and/or operational flowcharts disclosed in this document may be implemented as code, instructions, and/or a set of instructions in firmware or software.

The one or more memories 104 and 204 may be coupled to the one or more processors 102 and 202 and store various types of data, signals, messages, information, programs, code, instructions, and/or commands. The one or more memories 104 and 204 may be configured as read-only memories (ROMs), random access memories (RAMs), electrically erasable programmable read-only memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be coupled to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be coupled to the one or more processors 102 and 202 and transmit and receive radio signals. For example, the one or more processors 102 and 202 may control the one or more transceivers 106 and 206 to transmit user data, control information, or radio signals to one or more other devices. The one or more processors 102 and 202 may control the one or more transceivers 106 and 206 to receive user data, control information, or radio signals from one or more other devices. The one or more transceivers 106 and 206 may be coupled to the one or more antennas 108 and 208 and configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

Figure 1C:
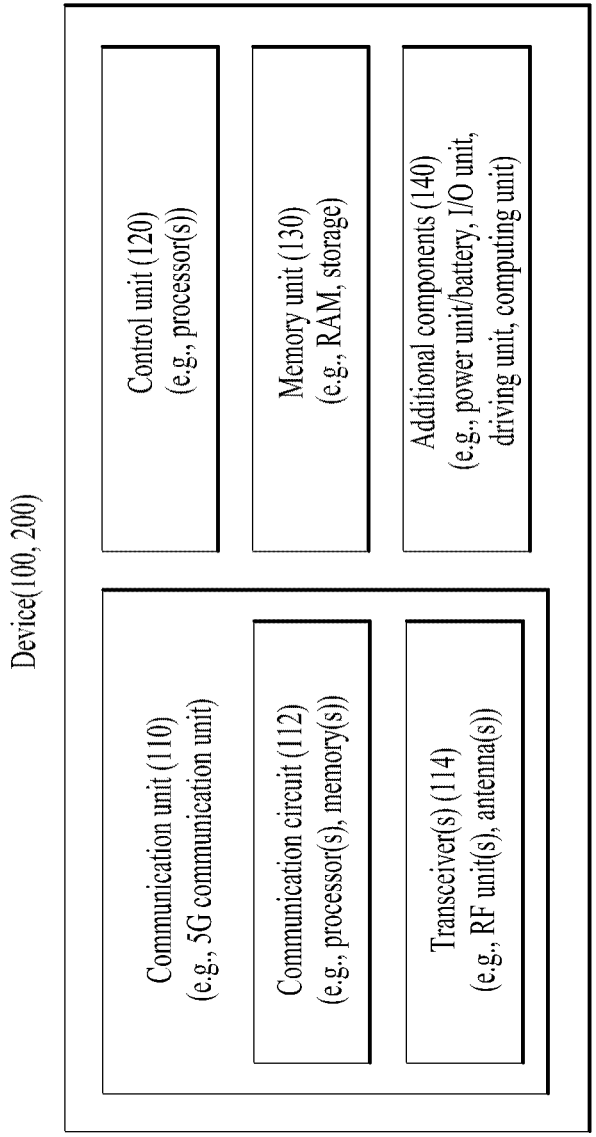
FIG. 1C illustrates other examples of wireless devices applicable to the present disclosure.

FIG. 1C illustrates another example of wireless devices applied to the present disclosure.

The wireless devices may be implemented in various forms according to use-cases/services (refer to FIG. 1A).

Referring to FIG. 1C, wireless devices 100 and 200 may correspond to the wireless devices 100 and 200 of FIG. 1B and may be configured as various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 and/or the one or more memories 104 and 204 of FIG. 2B. For example, the transceiver(s) 114 may include the one or more transceivers 106 and 206 and/or the one or more antennas 108 and 208 of FIG. 2B. The control unit 120 is electrically coupled to the communication unit 110, the memory unit 130, and the additional components 140 and provides overall control to operations of the wireless devices. For example, the control unit 120 may control an electric/mechanical operation of the wireless device based on programs/code/commands/information stored in the memory unit 130. The control unit 120 may transmit the information stored in the memory unit 130 to the outside (e.g., other communication devices) via the communication unit 110 through a wireless/wired interface or store, in the memory unit 130, information received through the wireless/wired interface from the outside (e.g., other communication devices) via the communication unit 110.

The additional components 140 may be configured in various manners according to the types of wireless devices. For example, the additional components 140 may include at least one of a power unit/battery, an input/output (I/O) unit, a driver, and a computing unit. The wireless device may be configured as, but not limited to, the robot (100a of FIG. 1A), the vehicles (100b-1 and 100b-2 of FIG. 1A), the XR device (100c of FIG. 1A), the hand-held device (100d of FIG. 1A), the home appliance (100e of FIG. 1A), the IoT device (100f of FIG. 1A), a digital broadcasting terminal, a hologram device, a public safety device, an MTC device, a medicine device, a FinTech device (or a finance device), a security device, a climate/environment device, the AI server/device (400 of FIG. 1A), the BSs (200 of FIG. 1A), a network node, etc. The wireless device may be mobile or fixed according to a use-case/service.

In FIG. 1C, all of the various elements, components, units/portions, and/or modules in the wireless devices 100 and 200 may be coupled to each other through a wired interface or at least a part thereof may be wirelessly coupled to each other through the communication unit 110. For example, in each of the wireless devices 100 and 200, the control unit 120 and the communication unit 110 may be coupled by wire, and the control unit 120 and first units (e.g., 130 and 140) may be wirelessly coupled through the communication unit 110. Each element, component, unit/portion, and/or module within the wireless devices 100 and 200 may further include one or more elements. For example, the control unit 120 may be configured as a set of one or more processors. For example, the control unit 120 may be configured as a set of a communication control processor, an application processor, an electronic control unit (ECU), a graphical processing unit, and a memory control processor. In another example, the memory unit 130 may be configured as a random access memory (RAM), a dynamic RAM (DRAM), a read only memory (ROM), a flash memory, a volatile memory, a non-volatile memory, and/or a combination thereof.

According to the present disclosure, a device for performing channel coding based on polar coding may include a transceiver, a memory, and at least one processor connected to the transceiver and memory.

The memory may be configured to store instructions that, when executed by the at least one processor, cause the at least one processor to perform operations.

Figure 2:
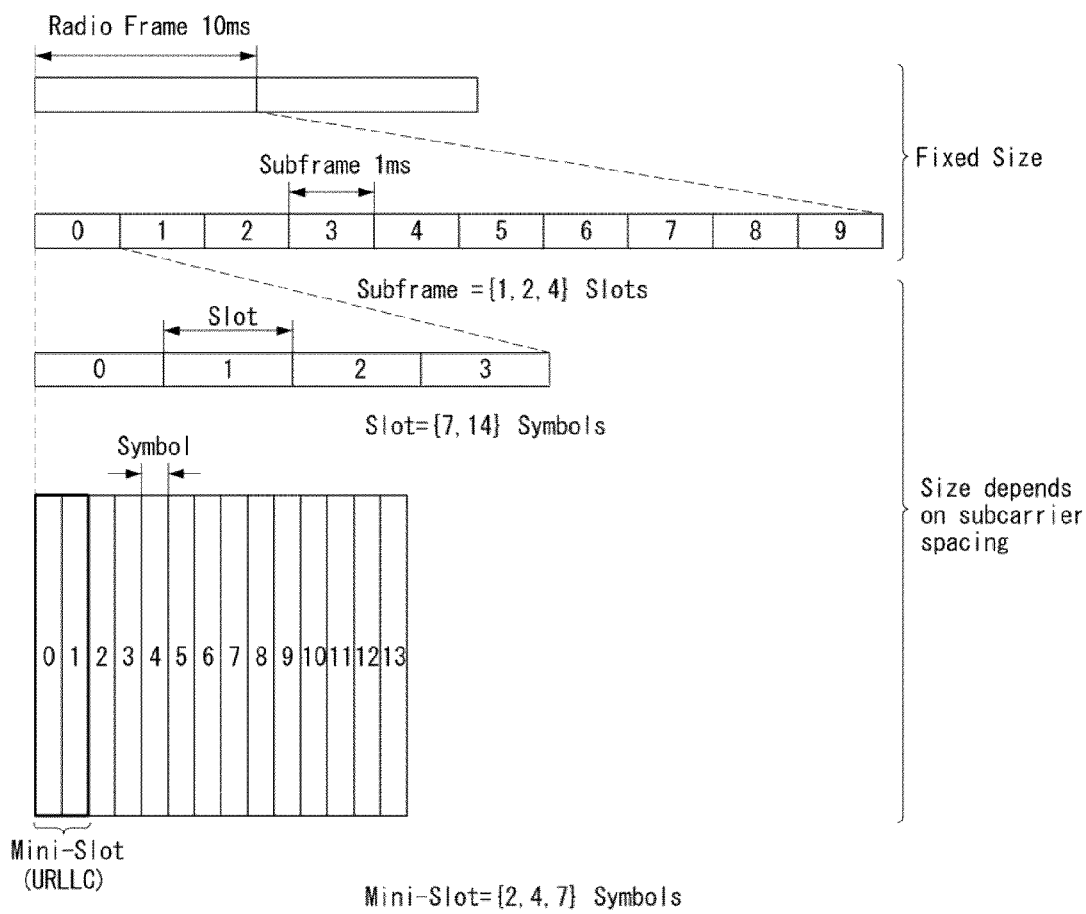
FIG. 2 is a diagram illustrating a frame structure of a new radio access technology (new RAT or NR).

FIG. 2 is a diagram illustrating a frame structure in NR.

The NR system may support multiple numerologies. A numerology may be defined by a subcarrier spacing (SCS) and a cyclic prefix (CP) overhead. Multiple SCSs may be derived by scaling a default SCS by an integer N (or μ). Further, even though it is assumed that a very small SCS is not used in a very high carrier frequency, a numerology to be used may be selected independently of a frequency band. Further, the NR system may support various frame structures according to multiple numerologies.

Now, a description will be given of OFDM numerologies and frame structures which may be considered for the NR system. Multiple OFDM numerologies supported by the NR system may be defined as listed in Table 1.

TABLE 1

| μ | $\Delta f = 2^{\mu} * 15$ [kHz] | Cyclic prefix(CP) |
|---|---|---|
| 0 | 15 | Normal |
| 1 | 30 | Normal |
| 2 | 60 | Normal, Extended |
| 3 | 120 | Normal |
| 4 | 240 | Normal |

The NR system supports multiple numerologies (e.g., SCSs) to support various 5G services. For example, in an SCS of 15 kHz, the NR system supports a wide area in conventional cellular bands. In an SCS of 30/60 kHz, the NR system supports a dense urban environment, low latency, and wide carrier bandwidth. In an SCS of 60 kHz or above, the NR system supports a bandwidth higher than 24.25 GHz to overcome phase noise.

NR frequency bands are divided into two frequency ranges: frequency range 1 (FR1) and frequency range 2 (FR2). FR1 covers sub-6 GHz frequency bands, and FR2 covers frequency bands above 6 GHz, i.e., bands in the millimeter wavelength (mmWave).

Table 2 shows the definitions of the NR frequency ranges.

TABLE 2

| Frequency Range designation | Corresponding frequency range | Subcarrier Spacing |
|---|---|---|
| FR1 | 450 MHz-6000 MHz | 15, 30, 60 kHz |
| FR2 | 24250 MHz-52600 MHz | 60, 120, 240 kHz |

Regarding a frame structure in the NR system, the time-domain sizes of various fields are represented as multiples of a basic time unit, $T_s = 1/(\Delta f_{max} \cdot N_f)$ where $\Delta f_{max} = 480 \cdot 10^3$ and $N_f = 4096$. DL and UL transmissions are organized into radio frames each having a duration of $T_f = (\Delta f_{max} N_f / 100) \cdot T_s = 10$ ms. Each radio frame includes 10 subframes each having a duration of $T_{sf} = (\Delta f_{max} N_f / 1000) \cdot T_s = 1$ ms. In this case, there may exist one set of frames for UL and one set of frames for DL. Further, transmission of UL frame #i from the UE should state a time $T_{TA} = N_{TA} T_s$ before the start of a corresponding DL frame. For a numerology μ, slots are numbered with $n_s^\mu \in \{0, \ldots, N_{subframe}^{slots,\mu} - 1\}$ in an increasing order in a subframe, and with $n_{s,f}^\mu \in \{0, \ldots, N_{subframe}^{slots,\mu} - 1\}$ in an increasing order in a radio frame. One slot includes Nμsymb consecutive OFDM symbols, and Nμsymb depends on a used numerology and slot configuration. The start of a slot $n_s^\mu$ in a subframe is aligned in time with the start of an OFDM symbol $n_s^\mu N_{symb}^\mu$ in the same subframe. All UEs are not capable of simultaneous transmission and reception, which implies that all OFDM symbols of a DL slot or a UL slot may not be used. Table 3 lists the number $N_{symb}^{slot}$ of symbols per slot, the number $N_{slot}^{frame,\mu}$ of slots per frame, and the number $N_{slot}^{subframe,\mu}$ of slots per subframe, for each SCS in a NOMAl CP case, and Table 4 lists the number of symbols per slot, the number of slots per frame, and the number of slots per subframe, for each SCS in an extended CP case.

TABLE 3

| μ | $N_{symb}^{slot}$ | $N_{slot}^{frame,\mu}$ | $N_{slot}^{subframe,\mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

TABLE 4

| μ | $N_{symb}^{slot}$ | $N_{slot}^{frame,\mu}$ | $N_{slot}^{subframe,\mu}$ |
|---|---|---|---|
| 2 | 12 | 40 | 4 |

FIG. 2 illustrates an example with μ=2, that is, an SCS of 60 kHz, in which referring to Table 2 one subframe may include four slots. One subframe={1, 2, 4} slots in FIG. 2 which is exemplary, and the number of slot(s) which may be included in one subframe is defined as listed in Table 2.

Further, a mini-slot may include 2, 4 or 7 symbols, fewer symbols than 2, or more symbols than 7.

In the NR system, an antenna port, a resource grid, a resource element, a resource block, a carrier part, etc. may be considered as physical resources. Hereinafter, the physical resources considerable in the NR system will be described in detail.

First, an antenna port may be defined such that a channel conveying symbols on the antenna port is capable of being inferred from a channel conveying other symbols on the same antenna port. When the large-scale properties of a channel carrying symbols on one antenna port are inferred from a channel carrying symbols on another antenna port, the two antenna ports may be said to be in quasi co-located or quasi co-location (QC/QCL) relationship. The large-scale properties may include at least one of the following parameters: delay spread, Doppler spread, frequency shift, average received power, received timing, average delay, and spatial reception (Rx). The spatial Rx parameter refer to a spatial (Rx) channel characteristic parameter such as angle of arrival.

Figure 3:
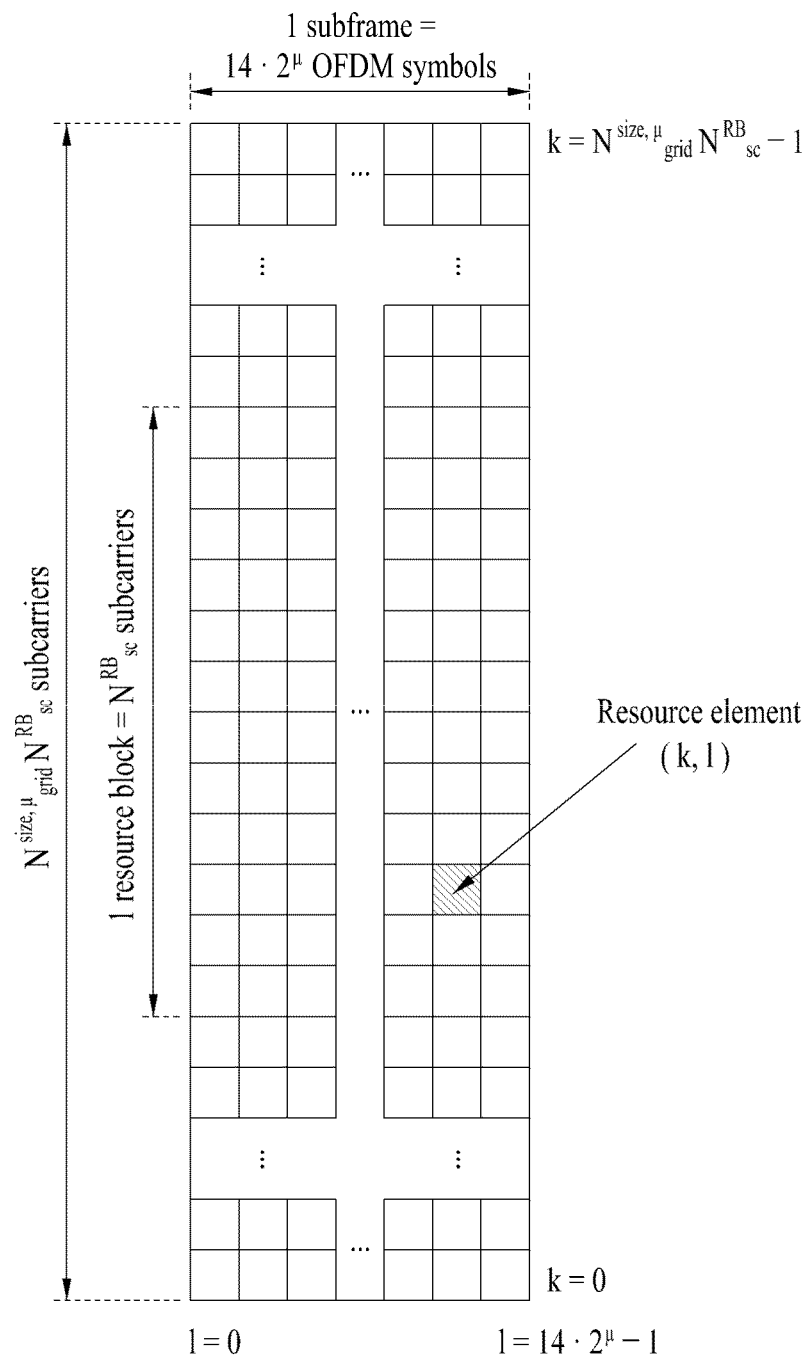
FIG. 3 illustrates a resource grid of NR.

FIG. 3 illustrates a resource grid in the NR system.

Figure 4:
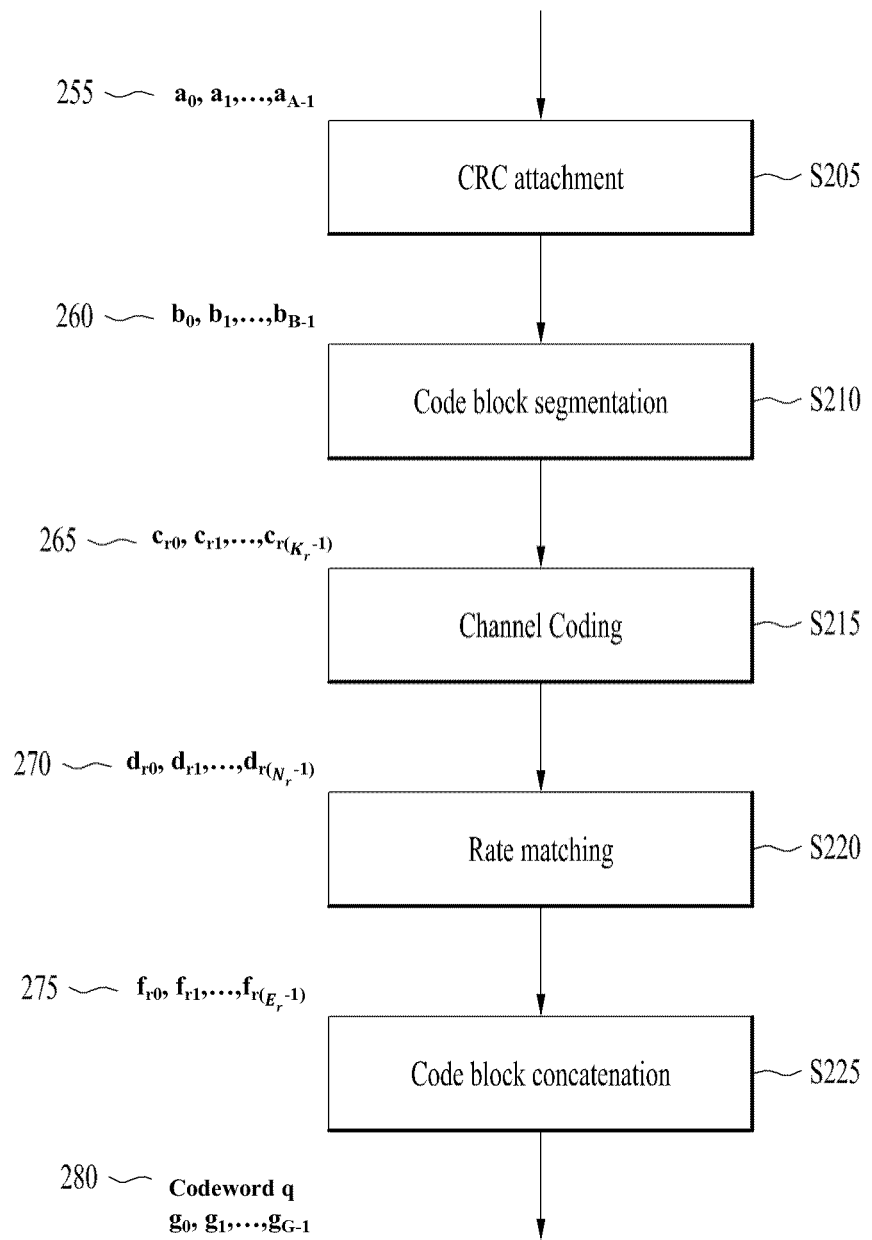
FIG. 4 is a diagram for explaining a channel coding method according to the present disclosure.

Referring to FIG. 3, a resource grid includes $N_{RB}^\mu N_{sc}^{RB}$ subcarriers in the time domain, and one subframe 14·2μ OFDM symbols, which is exemplary and thus should not be construed as limiting the disclosure. In the NR system, a transmitted signal is described by one or more resource grids including $N_{RB}^\mu N_{sc}^{RB}$ subcarriers and $2^\mu N_{symb}^{(\mu)}$ OFDM symbols, where $N_{RB}^\mu \leq N_{RB}^{max,\mu}$. $N_{RB}^{max,\mu}$ represents a maximum transmission bandwidth, which may be different for UL and DL as well as according to numerologies. In this case, one resource grid may be configured for each neurology μ and each antenna port p, as illustrated in FIG. 4. Each element of the resource grid for the numerology μ and the antenna port p is referred to as an RE, which is uniquely identified by an index pair (k,l) where k=0, . . . , $N_{RB}^\mu N_{sc}^{RB}-1$ is a frequency-domain index and l=0, . . . , $2^\mu N_{symb}^{(\mu)}-1$ indicates the position of a symbol in a subframe. An RE in a slot is indicated by an index pair (k,l) where l=0, . . . , $N_{symb}^\mu-1$. An RE (k,l) for the numerology μ and the antenna port p corresponds to a complex value $a_{k,l}^{(p,\mu)}$. When there is no risk of confusion or a specific antenna port or a numerology is not specified, the indexes p and μ may be dropped, and as a result, the complex value may be $a_{k,l}^{(p)}$ or $a_{k,l}$. In addition, an RB is defined as $N_{sc}^{RB}=12$ consecutive subcarriers in the frequency domain.

Considering that a UE may be incapable of supporting a wide bandwidth supported in the NR system, the UE may be configured to operate in a part of the frequency BW of a cell (hereinafter referred to as a bandwidth part (BWP)).

In the NR system, resource blocks may be divided into physical resource blocks defined within the BWP and common resource blocks numbered from 0 upward in the frequency domain for an SCS configuration μ.

Point A is obtained as follows.

For a PCell downlink, offsetToPointA represents the frequency offset between point A and the lowest subcarrier of the lowest resource block overlapping with an SS/PBCH block used by the UE for initial cell selection, which is expressed in units of resource blocks on the assumption of an SCS of 15 kHz for FR1 and an SCS of 60 kHz for FR2.

For other cases, absoluteFrequencyPointA represents the frequency location of point A expressed as in the absolute radio-frequency channel number (ARFCN).

The center of subcarrier 0 of common resource block 0 for the SCS configuration μ coincides with point A, which act as the reference point for resource grids. The relationship between a common resource block number nμCRB in the frequency domain and a resource elements (k,l) for the SCS configuration μ is given by Equation 1.

$$n_{CRB}^\mu = \left\lfloor \frac{k}{N_{sc}^{RB}} \right\rfloor \qquad \text{[Equation 1]}$$

In Equation 1, k is defined relative to point A such that k=0 corresponds to a subcarrier around point A. Physical resource blocks are numbered from 0 to $N_{BWP,i-1}^{size}$ within the BWP, where i is the number of the BWP. The relationship between a physical resource block $n_{PRB}$ and a common resource block $n_{CRB}$ in BWP i is given by Equation 2.

$$n_{CRB} = n_{PRB} + N_{BWP,i}^{start} \qquad \text{[Equation 2]}$$

In Equation 2, $N_{BWP,i}^{start}$ is a common resource block where the BWP starts relative to common resource block 0.

FIG. 4 is a diagram for explaining a channel coding method according to the present disclosure.

Data subject to channel coding is referred to as a transport block. Typically, depending on the performance of channel coding, the transport block is divided into code blocks, each of which has a size less than or equal to a predetermined value. For example, in turbo coding of 3GPP TS 36.212, the code block may have a maximum size of 6144 bits. In low density parity check (LDPC) coding of 3GPP TS 38.212, the code block may have a maximum size of 8448 bits (in basegraph 1) or 3840 bits (in basegraph 2). In polar coding, the code block may have a minimum size of 32 bits and a maximum size of 8192 bits.

The code block may be subdivided into sub-blocks. In polar coding methods according to the present disclosure, an input bit sequence (265) ($c_{r0}, c_{r1}, \ldots, c_{r(K_r-1)}$) is interleaved, the interleaved input bit sequence (not shown in the drawing) ($c'_{r0}, c'_{r1}, \ldots, c'_{r(K_r-1)}$) may be encoded based on polar codes. The encoded bit sequence (270) ($d_{r0}, d_{r1}, \ldots, d_{r(N_r-1)}$) may be rate matched. The rate matching of the encoded bit sequence (270) may include: subdividing the encoded bit sequence into sub-blocks; interleaving each of the sub-blocks; performing bit selection for each of the interleaved sub-blocks; and interleaving coded bits again. The bit selection for each of the interleaved sub-blocks may include repeating, puncturing, or shortening some bits.

The channel coding method according to the present disclosure may include attaching a cyclic redundancy check (CRC) code to a transport block (S205); dividing the transport block into code blocks (S210); encoding the divided code blocks (S215); perform rate matching of the encoded code blocks (S220); and concatenating the rate-matched code blocks (S225).

In step S205, party bits with a length of L are attached to the transport block (255) (a0, . . . , aA−1). The length L may be any one of 6, 11, 16, and 24. Typically, cyclic generator polynomials are used to generate party bits. In addition, scrambling operation may be applied to output bits (260) (b0, . . . , bB−1), which depend on the CRC attachment, with a radio network temporary identifier (RNTI). Exclusive OR (EOR) operation may be applied between a scrambling sequence and corresponding bits based on the scrambling operation.

The output bits (260) ($b_0, \ldots, b_{B-1}$) depending on the CRC attachment may be segmented into code blocks (265) according to code block sizes. This is called code block segmentation. The code block sizes are determined by channel coding methods. A code block size suitable for each channel coding method may be determined theoretically or experimentally. For example, the segmented code blocks ($c_{r0}, \ldots, c_{r(Kr-1)}$) may be encoded as encoded bits ($d_{r0}, \ldots, d_{r(Nr-1)}$), respectively.

The encoded bits (270) ($d_{r0}, \ldots, d_{r(Nr-1)}$) are generated by applying channel coding to the code blocks (265) ($c_{r0}, \ldots, c_{r(Kr-1)}$) (S215). The generated encoded bits (270) may be rate-matched by shortening and puncturing. Alternatively, the encoded bits (270) may be rate-matched by sub-block interleaving, bit selection, and/or interleaving. That is, the encoded bits (270) ($d_{r0}, \ldots, d_{r(Nr-1)}$) are converted into rate-matched bits (275) ($f_{r0}, \ldots f_{r(gr-1)}$) (S220). Typically, interleaving may refer to a process for changing a sequence of bits and reduce the occurrence of errors. The interleaving is designed in consideration of efficient de-interleaving.

The LDPC coding method can be performed by any one of a random-like coding method or a structured coding method. In this case, the LDPC coding method can perform encoding based on a generator matrix. Alternatively, the LDPC coding method can perform encoding based on a basegraph. In 3GPP TS 38.212, a method for performing LDPC encoding based on the basegraph has been described.

Tables 5 and 6 described below show a basegraph 1 (BG1) defined in 3GPP TS 38.212.

TABLE 5

| $H_{BG}$ | | $V_{i,j}$ | | | | | | | |
|---|---|---|---|---|---|---|---|---|---|
| Row index i | Column index j | \multicolumn{8}{c}{Set index $i_{LS}$} |
| | | 0 | 1 | 2 | 3 | 4 | 5 | 6 | 7 |
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 186 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 38 | 10 | 4 | 165 | 0 | 83 |
| | 9 | 59 | 317 | 15 | 5 | 29 | 243 | 0 | 53 |
| | 10 | 229 | 288 | 182 | 255 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 154 | 73 | 47 | 0 | 105 |
| | 21 | 31 | 346 | 32 | 81 | 261 | 188 | 0 | 137 |
| | 22 | 1 | 1 | 1 | 1 | 1 | 1 | 1 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 258 | 261 | 46 | 256 | 338 | 0 | 221 |
| | 5 | 71 | 144 | 161 | 119 | 160 | 258 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 280 | 31 | 156 | 9 | 168 | 163 |
| | 21 | 28 | 112 | 301 | 167 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 257 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |

TABLE 5-continued

| $H_{BG}$ | | $V_{i,j}$ | | | | | | | |
|---|---|---|---|---|---|---|---|---|---|
| Row index i | Column index j | \multicolumn{8}{c}{Set index $i_{LS}$} |
| | | 0 | 1 | 2 | 3 | 4 | 5 | 6 | 7 |
| | 6 | 93 | 161 | 227 | 156 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 34 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 98 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 248 | 231 | 253 | 213 | 67 | 345 | 154 | 22 |
| | 13 | 219 | 341 | 164 | 147 | 36 | 269 | 67 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 236 | 256 | 204 | 211 |
| | 26 | 0 | 0 | 0 | 0 | 0 | 0 | 0 | 0 |
| 5 | 0 | 205 | 195 | 83 | 154 | 261 | 219 | 185 | 2 |
| | 1 | 236 | 14 | 292 | 59 | 181 | 130 | 100 | 171 |
| | 3 | 134 | 115 | 50 | 86 | 72 | 251 | 24 | 47 |
| | 12 | 231 | 156 | 318 | 80 | 283 | 322 | 65 | 142 |
| 15 | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 51 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 196 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 152 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 154 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 136 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 146 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 151 | 6 | 0 | 110 | 6 | 108 |
| | 7 | 72 | 344 | 101 | 103 | 118 | 147 | 166 | 159 |
| | 5 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |

TABLE 5-continued

| $H_{BG}$ | | $V_{i,j}$ | | | | | | | |
|---|---|---|---|---|---|---|---|---|---|
| Row index i | Column index j | \multicolumn{8}{c}{Set index $i_{LS}$} |
| | | 0 | 1 | 2 | 3 | 4 | 5 | 6 | 7 |
| | 22 | 180 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 88 | 122 |
| | 16 | 109 | 328 | 132 | 220 | 266 | 346 | 96 | 215 |
| | 20 | 1331 | 213 | 283 | 50 | 9 | 143 | 42 | 65 |
| | 21 | 171 | 97 | 103 | 108 | 15 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 55 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 59 | 50 | 203 | 0 | 6 | 15 | 127 |
| | 10 | 170 | 61 | 133 | 168 | 0 | 181 | 132 | 117 |
| | 16 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 54 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 156 | 0 | 255 | 74 | 141 |
| | 7 | 116 | 383 | 96 | 65 | 0 | 111 | 16 | 11 |
| | 14 | 182 | 312 | 48 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 155 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 155 | 19 | 293 | 153 | 0 | 1 | 1 | 43 |
| | 19 | 181 | 244 | 50 | 217 | 155 | 40 | 40 | 206 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 8 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |

TABLE 6

| | 16 | 28 | 241 | 201 | 182 | 254 | 295 | 207 | 210 |
|---|---|---|---|---|---|---|---|---|---|
| | 21 | 123 | 51 | 267 | 130 | 79 | 258 | 161 | 180 |
| | 22 | 115 | 157 | 279 | 153 | 144 | 283 | 72 | 180 |
| | 27 | 0 | 0 | 0 | 0 | 0 | 0 | 0 | 0 |
| 6 | 0 | 183 | 278 | 289 | 158 | 80 | 294 | 6 | 189 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 220 | 9 | 12 | 17 | 169 | 3 | 145 | 77 |
| | 1 | 44 | 62 | 86 | 76 | 189 | 103 | 88 | 146 |
| | 4 | 158 | 316 | 207 | 104 | 154 | 224 | 112 | 209 |
| | 7 | 31 | 333 | 50 | 100 | 184 | 297 | 153 | 32 |
| | 8 | 167 | 290 | 25 | 150 | 104 | 215 | 159 | 166 |

TABLE 6-continued

| | 14 | 104 | 114 | 76 | 158 | 164 | 38 | 76 | 18 |
|---|---|---|---|---|---|---|---|---|---|
| | 29 | 0 | 0 | 0 | 0 | 0 | 0 | 0 | 0 |
| 8 | 0 | 112 | 307 | 295 | 33 | 54 | 348 | 172 | 181 |
| | 1 | 4 | 179 | 133 | 95 | 0 | 75 | 2 | 105 |
| | 3 | 7 | 165 | 130 | 4 | 252 | 22 | 131 | 141 |
| | 12 | 211 | 18 | 231 | 217 | 41 | 312 | 141 | 223 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 189 |
| | 22 | 241 | 67 | 245 | 44 | 230 | 314 | 35 | 153 |
| | 24 | 90 | 170 | 154 | 201 | 54 | 244 | 116 | 38 |
| | 30 | 0 | 0 | 0 | 0 | 0 | 0 | 0 | 0 |
| 9 | 0 | 103 | 366 | 189 | 9 | 162 | 156 | 8 | 169 |
| | 1 | 182 | 232 | 244 | 37 | 159 | 88 | 10 | 12 |
| | 10 | 109 | 321 | 36 | 213 | 93 | 293 | 145 | 206 |
| | 11 | 21 | 133 | 256 | 105 | 134 | 111 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 101 | 14 | 82 | 178 | 175 | 126 | 116 |
| | 2 | 149 | 339 | 80 | 165 | 1 | 253 | 77 | 151 |
| | 4 | 167 | 274 | 211 | 174 | 28 | 27 | 156 | 70 |
| | 7 | 160 | 111 | 75 | 19 | 267 | 231 | 16 | 230 |
| | 8 | 49 | 383 | 161 | 194 | 234 | 49 | 12 | 115 |
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 8 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 65 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 176 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| | 10 | 73 | 229 | 23 | 130 | 90 | 16 | 58 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 51 | 256 | 162 | 125 | 19 | 222 | 194 | 108 |
| | 53 | 0 | 0 | 0 | 0 | 0 | 0 | 0 | 0 |
| 32 | 0 | 221 | 102 | 210 | 192 | 0 | 351 | 6 | 103 |
| | 12 | 112 | 201 | 22 | 209 | 211 | 285 | 126 | 110 |
| | 14 | 199 | 175 | 271 | 55 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |
| | 55 | 0 | 0 | 0 | 0 | 0 | 0 | 0 | 0 |
| 34 | 0 | 127 | 230 | 187 | 82 | 197 | 60 | 4 | 161 |
| | 7 | 167 | 148 | 296 | 186 | 0 | 320 | 153 | 237 |

TABLE 6-continued

| Row index i | Column index j | 0 | 1 | 2 | 3 | 4 | 5 | 6 | 7 |
|---|---|---|---|---|---|---|---|---|---|
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 85 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 59 | 22 | 243 | 3 | 163 | 127 |
| | 18 | 173 | 114 | 176 | 134 | 0 | 53 | 98 | 49 |
| | 25 | 139 | 165 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 235 | 153 | 93 |
| | 67 | 0 | 0 | 0 | 0 | 0 | 0 | 0 | 0 |

Tables 5 and 6 are tables that are connected to each other in a vertical direction.

Tables 7 and 8 show the basegraph 2 (BG2) defined in 3GPP TS 38.212.

TABLE 7

| $H_{BG}$ | | $V_{i,j}$ | | | | | | | |
|---|---|---|---|---|---|---|---|---|---|
| Row index i | Column index j | \multicolumn{8}{c}{Set index $i_{LS}$} |
| | | 0 | 1 | 2 | 3 | 4 | 5 | 6 | 7 |
| 0 | 0 | 9 | 174 | 0 | 72 | 3 | 156 | 143 | 145 |
| | 1 | 117 | 97 | 0 | 110 | 28 | 143 | 19 | 131 |
| | 2 | 204 | 186 | 0 | 23 | 53 | 14 | 178 | 71 |
| | 3 | 28 | 86 | 0 | 181 | 35 | 3 | 185 | 21 |
| | 8 | 189 | 71 | 0 | 35 | 115 | 40 | 196 | 23 |
| | 9 | 205 | 172 | 0 | 8 | 127 | 123 | 13 | 112 |
| | 10 | 0 | 0 | 0 | 1 | 0 | 0 | 0 | 1 |
| | 11 | 0 | 0 | 0 | 0 | 0 | 0 | 0 | 0 |
| 1 | 0 | 157 | 27 | 137 | 53 | 19 | 17 | 18 | 142 |
| | 3 | 165 | 36 | 124 | 158 | 94 | 55 | 27 | 174 |
| | 4 | 253 | 48 | 0 | 115 | 104 | 63 | 3 | 183 |
| | 5 | 125 | 92 | 0 | 155 | 88 | 1 | 102 | 27 |
| | 6 | 228 | 31 | 85 | 115 | 84 | 55 | 185 | 98 |
| | 7 | 158 | 187 | 0 | 200 | 98 | 37 | 17 | 23 |
| | 8 | 224 | 185 | 0 | 29 | 89 | 171 | 14 | 0 |
| | 9 | 252 | 3 | 55 | 31 | 50 | 135 | 180 | 107 |
| | 11 | 0 | 0 | 0 | 0 | 0 | 0 | 0 | 0 |
| | 12 | 0 | 0 | 0 | 0 | 0 | 0 | 0 | 0 |
| 2 | 0 | 81 | 25 | 20 | 152 | 95 | 98 | 126 | 74 |
| | 1 | 114 | 114 | 94 | 131 | 108 | 108 | 103 | 31 |
| | 3 | 44 | 137 | 96 | 48 | 92 | 107 | 47 | 3 |
| | 4 | 52 | 130 | 9 | 191 | 110 | 83 | 163 | 53 |
| | 5 | 240 | 114 | 108 | 91 | 111 | 142 | 132 | 158 |
| | 10 | 1 | 1 | 1 | 0 | 1 | 1 | 1 | 0 |
| | 12 | 0 | 0 | 0 | 0 | 0 | 0 | 0 | 0 |
| | 13 | 0 | 0 | 0 | 0 | 0 | 0 | 0 | 0 |
| 3 | 1 | 8 | 120 | 35 | 185 | 125 | 53 | 36 | 230 |
| | 2 | 58 | 175 | 15 | 6 | 121 | 174 | 48 | 171 |
| | 4 | 156 | 113 | 102 | 36 | 22 | 174 | 18 | 95 |
| | 5 | 104 | 72 | 148 | 124 | 4 | 127 | 111 | 110 |
| | 6 | 209 | 123 | 12 | 124 | 73 | 17 | 203 | 150 |
| | 7 | 54 | 118 | 57 | 110 | 49 | 69 | 3 | 199 |
| | 8 | 18 | 28 | 53 | 158 | 128 | 17 | 191 | 43 |
| | 9 | 128 | 188 | 46 | 133 | 79 | 105 | 180 | 75 |
| | 10 | 0 | 0 | 0 | 1 | 0 | 0 | 0 | 1 |
| | 13 | 0 | 0 | 0 | 0 | 0 | 0 | 0 | 0 |
| 4 | 0 | 179 | 72 | 0 | 200 | 42 | 88 | 43 | 29 |
| | 1 | 214 | 74 | 136 | 16 | 34 | 87 | 27 | 140 |
| | 11 | 71 | 29 | 157 | 101 | 51 | 83 | 117 | 150 |
| | 14 | 0 | 0 | 0 | 0 | 0 | 0 | 0 | 0 |
| 5 | 0 | 231 | 10 | 0 | 185 | 40 | 70 | 136 | 121 |
| | 1 | 41 | 44 | 131 | 135 | 140 | 84 | 49 | 41 |
| | 5 | 194 | 131 | 142 | 170 | 84 | 35 | 36 | 169 |
| | 7 | 159 | 80 | 141 | 218 | 107 | 103 | 132 | 85 |
| | 11 | 103 | 48 | 84 | 161 | 71 | 80 | 82 | 207 |
| | 15 | 0 | 0 | 0 | 0 | 0 | 0 | 0 | 0 |
| 6 | 0 | 155 | 138 | 0 | 123 | 109 | 47 | 7 | 137 |
| | 5 | 228 | 92 | 124 | 55 | 87 | 154 | 34 | 72 |
| | 7 | 45 | 100 | 69 | 31 | 107 | 10 | 198 | 172 |
| | 9 | 28 | 49 | 45 | 222 | 133 | 155 | 108 | 124 |
| | 11 | 156 | 184 | 148 | 208 | 139 | 29 | 12 | 55 |
| | 18 | 0 | 0 | 0 | 0 | 0 | 0 | 0 | 0 |
| 7 | 1 | 129 | 80 | 0 | 102 | 37 | 48 | 183 | 88 |
| | 5 | 147 | 186 | 45 | 13 | 135 | 125 | 78 | 166 |
| | 7 | 140 | 10 | 148 | 105 | 35 | 24 | 143 | 87 |
| | 11 | 3 | 102 | 96 | 150 | 108 | 47 | 107 | 172 |
| | 13 | 116 | 143 | 78 | 181 | 55 | 55 | 58 | 154 |
| | 17 | 0 | 0 | 0 | 0 | 0 | 0 | 0 | 0 |
| 8 | 0 | 142 | 118 | 0 | 147 | 70 | 53 | 101 | 170 |
| | 1 | 94 | 70 | 85 | 43 | 88 | 31 | 177 | 188 |
| | 12 | 230 | 152 | 87 | 152 | 88 | 101 | 22 | 225 |
| | 18 | 0 | 0 | 0 | 0 | 0 | 0 | 0 | 0 |
| 9 | 1 | 203 | 28 | 0 | 2 | 37 | 104 | 186 | 107 |
| | 5 | 205 | 132 | 97 | 30 | 40 | 142 | 27 | 138 |
| | 10 | 81 | 185 | 51 | 184 | 24 | 99 | 255 | 48 |
| | 11 | 247 | 178 | 85 | 83 | 49 | 84 | 81 | 86 |
| | 19 | 0 | 0 | 0 | 0 | 0 | 0 | 0 | 0 |
| 10 | 0 | 11 | 59 | 0 | 174 | 46 | 111 | 125 | 38 |
| | 1 | 185 | 104 | 17 | 150 | 41 | 25 | 80 | 217 |
| | 5 | 0 | 22 | 158 | 6 | 101 | 174 | 177 | 208 |
| | 7 | 117 | 52 | 20 | 56 | 96 | 23 | 51 | 232 |
| | 20 | 0 | 0 | 0 | 0 | 0 | 0 | 0 | 0 |
| 11 | 0 | 11 | 32 | 0 | 99 | 29 | 81 | 39 | 175 |
| | 7 | 238 | 92 | 7 | 138 | 30 | 175 | 20 | 214 |
| | 9 | 210 | 174 | 4 | 110 | 115 | 24 | 35 | 188 |
| | 13 | 58 | 154 | 2 | 99 | 54 | 141 | 8 | 51 |
| | 21 | 0 | 0 | 0 | 0 | 0 | 0 | 0 | 0 |
| 12 | 1 | 53 | 39 | 0 | 46 | 33 | 122 | 18 | 124 |
| | 3 | 111 | 33 | 113 | 217 | 122 | 11 | 155 | 122 |
| | 11 | 14 | 11 | 48 | 108 | 131 | 4 | 49 | 72 |
| | 22 | 0 | 0 | 0 | 0 | 0 | 0 | 0 | 0 |
| 13 | 0 | 53 | 49 | 0 | 37 | 76 | 23 | 32 | 48 |
| | 1 | 2 | 125 | 112 | 113 | 37 | 91 | 53 | 57 |
| | 8 | 36 | 35 | 102 | 143 | 52 | 27 | 95 | 167 |

TABLE 7-continued

| $H_{BG}$ | | $V_{i,j}$ | | | | | | | |
|---|---|---|---|---|---|---|---|---|---|
| Row index i | Column index j | Set index $i_{LS}$ | | | | | | | |
| | | 0 | 1 | 2 | 3 | 4 | 5 | 6 | 7 |
| 16 | 28 | 0 | 0 | 0 | 0 | 0 | 0 | 0 | 0 |
| 17 | 1 | 254 | 158 | 0 | 48 | 120 | 134 | 57 | 196 |
| | 5 | 124 | 23 | 24 | 132 | 43 | 23 | 201 | 173 |
| | 11 | 114 | 8 | 109 | 206 | 55 | 52 | 142 | 195 |
| | 12 | 64 | 5 | 18 | 2 | 42 | 163 | 35 | 238 |
| | 27 | 0 | 0 | 0 | 0 | 0 | 0 | 0 | 0 |
| 18 | 0 | 220 | 185 | 0 | 88 | 17 | 173 | 128 | 128 |
| | 6 | 194 | 6 | 18 | 16 | 106 | 31 | 203 | 211 |
| | 7 | 50 | 48 | 58 | 158 | 142 | 22 | 145 | 210 |
| | 28 | 0 | 0 | 0 | 0 | 0 | 0 | 0 | 0 |
| 19 | 0 | 87 | 58 | 0 | 35 | 79 | 13 | 110 | 39 |
| | 1 | 20 | 42 | 158 | 128 | 28 | 135 | 124 | 84 |
| | 10 | 188 | 158 | 154 | 88 | 41 | 145 | 52 | 88 |
| | 28 | 0 | 0 | 0 | 0 | 0 | 0 | 0 | 0 |
| 20 | 1 | 28 | 76 | 0 | 0 | 2 | 128 | 198 | 117 |
| | 4 | 105 | 51 | 148 | 20 | 103 | 52 | 35 | 227 |
| | 11 | 29 | 153 | 194 | 141 | 75 | 173 | 114 | 8 |
| | 30 | 0 | 0 | 0 | 0 | 0 | 0 | 0 | 0 |
| 21 | 0 | 78 | 157 | 0 | 80 | 91 | 150 | 10 | 238 |
| | 8 | 42 | 175 | 17 | 43 | 75 | 188 | 122 | 13 |
| | 13 | 210 | 67 | 33 | 81 | 81 | 40 | 23 | 11 |
| | 31 | 0 | 0 | 0 | 0 | 0 | 0 | 0 | 0 |
| 22 | 1 | 222 | 20 | 2 | 49 | 54 | 16 | 202 | 195 |
| | 2 | 63 | 52 | 4 | 1 | 132 | 163 | 128 | 44 |
| | 32 | 0 | 0 | 0 | 0 | 0 | 0 | 0 | 0 |
| 23 | 0 | 23 | 105 | 0 | 156 | 58 | 110 | 52 | 5 |
| | 3 | 235 | 58 | 75 | 54 | 115 | 132 | 170 | 94 |
| | 5 | 238 | 95 | 158 | 134 | 58 | 150 | 13 | 111 |
| | 33 | 0 | 0 | 0 | 0 | 0 | 0 | 0 | 0 |
| 24 | 1 | 48 | 182 | 0 | 153 | 30 | 113 | 112 | 81 |
| | 2 | 139 | 153 | 59 | 63 | 42 | 105 | 161 | 16 |
| | 9 | 8 | 64 | 87 | 83 | 101 | 51 | 58 | 130 |
| | 34 | 0 | 0 | 0 | 0 | 0 | 0 | 0 | 0 |
| 25 | 0 | 228 | 45 | 0 | 211 | 128 | 72 | 197 | 88 |
| | 5 | 158 | 21 | 65 | 94 | 52 | 135 | 194 | 98 |
| | 35 | 0 | 0 | 0 | 0 | 0 | 0 | 0 | 0 |
| 26 | 2 | 29 | 67 | 0 | 90 | 142 | 38 | 164 | 146 |
| | 7 | 143 | 137 | 100 | 0 | 28 | 38 | 172 | 88 |
| | 12 | 100 | 55 | 13 | 221 | 100 | 53 | 49 | 190 |
| | 13 | 122 | 85 | 7 | 8 | 133 | 148 | 151 | 85 |
| | 38 | 0 | 0 | 0 | 0 | 0 | 0 | 0 | 0 |
| 27 | 0 | 8 | 103 | 0 | 27 | 13 | 42 | 108 | 64 |
| | 6 | 151 | 50 | 32 | 118 | 10 | 104 | 193 | 183 |
| | 37 | 0 | 0 | 0 | 0 | 0 | 0 | 0 | 0 |
| 28 | 1 | 98 | 70 | 0 | 218 | 106 | 84 | 14 | 7 |
| | 2 | 101 | 111 | 126 | 212 | 77 | 24 | 188 | 144 |
| | 5 | 135 | 168 | 116 | 103 | 43 | 140 | 48 | 16 |
| | 38 | 0 | 0 | 0 | 0 | 0 | 0 | 0 | 0 |
| 29 | 0 | 18 | 110 | 0 | 108 | 138 | 139 | 56 | 28 |
| | 4 | 28 | 17 | 154 | 61 | 25 | 161 | 27 | 57 |
| | 39 | 0 | 0 | 0 | 0 | 0 | 0 | 0 | 0 |
| 30 | 2 | 71 | 120 | 0 | 106 | 87 | 84 | 76 | 37 |
| | 5 | 240 | 154 | 35 | 44 | 55 | 172 | 17 | 139 |
| | 7 | 9 | 52 | 551 | 185 | 104 | 93 | 50 | 221 |
| | 9 | 84 | 56 | 134 | 176 | 70 | 29 | 6 | 17 |
| | 40 | 0 | 0 | 0 | 0 | 0 | 0 | 0 | 0 |
| 31 | 1 | 100 | 3 | 0 | 147 | 80 | 117 | 115 | 201 |
| | 13 | 1 | 176 | 20 | 182 | 136 | 148 | 186 | 45 |
| | 41 | 0 | 0 | 0 | 0 | 0 | 0 | 0 | 0 |
| 32 | 0 | 242 | 54 | 0 | 158 | 32 | 115 | 110 | 178 |
| | 5 | 44 | 6 | 20 | 21 | 89 | 73 | 0 | 14 |
| | 12 | 165 | 17 | 122 | 110 | 71 | 142 | 163 | 118 |
| | 42 | 0 | 0 | 5 | 5 | 0 | 0 | 0 | 0 |
| 33 | 2 | 132 | 168 | 0 | 71 | 135 | 105 | 163 | 48 |
| | 7 | 164 | 179 | 88 | 12 | 0 | 137 | 173 | 2 |
| | 10 | 235 | 124 | 13 | 109 | 2 | 29 | 179 | 106 |
| | 43 | 0 | 0 | 0 | 0 | 0 | 0 | 0 | 0 |
| 34 | 0 | 147 | 173 | 0 | 29 | 37 | 11 | 197 | 184 |
| | 12 | 85 | 177 | 13 | 201 | 25 | 41 | 191 | 135 |
| | 13 | 38 | 12 | 78 | 69 | 114 | 162 | 193 | 141 |
| | 44 | 0 | 0 | 0 | 0 | 0 | 0 | 0 | 0 |
| 35 | 1 | 57 | 77 | 0 | 91 | 80 | 125 | 157 | 88 |
| | 5 | 40 | 184 | 187 | 185 | 137 | 152 | 167 | 225 |
| | 11 | 63 | 18 | 0 | 55 | 93 | 172 | 161 | 175 |
| | 45 | 0 | 0 | 0 | 0 | 0 | 0 | 0 | 0 |
| 36 | 0 | 140 | 25 | 0 | 1 | 121 | 73 | 197 | 178 |
| | 2 | 35 | 151 | 83 | 175 | 120 | 154 | 157 | 112 |
| | 7 | 154 | 170 | 52 | 80 | 26 | 129 | 179 | 106 |
| | 46 | 0 | 0 | 0 | 0 | 0 | 0 | 0 | 0 |
| 37 | 10 | 219 | 37 | 0 | 40 | 97 | 167 | 181 | 154 |
| | 13 | 151 | 31 | 144 | 12 | 58 | 38 | 193 | 114 |
| | 47 | 0 | 0 | 0 | 0 | 0 | 0 | 0 | 0 |
| 38 | 1 | 31 | 84 | 0 | 37 | 1 | 112 | 157 | 42 |
| | 5 | 65 | 151 | 93 | 97 | 70 | 7 | 173 | 41 |

TABLE 8

| | 13 | 222 | 186 | 25 | 140 | 47 | 127 | 186 | 219 |
|---|---|---|---|---|---|---|---|---|---|
| | 23 | 0 | 0 | 0 | 0 | 0 | 0 | 0 | 0 |
| 14 | 1 | 115 | 19 | 0 | 25 | 143 | 11 | 91 | 82 |
| | 6 | 145 | 118 | 135 | 95 | 51 | 145 | 20 | 232 |
| | 11 | 3 | 21 | 57 | 40 | 130 | 8 | 52 | 204 |
| | 13 | 232 | 153 | 27 | 116 | 97 | 186 | 109 | 152 |
| | 24 | 0 | 0 | 0 | 0 | 0 | 0 | 0 | 0 |
| 15 | 0 | 51 | 65 | 0 | 116 | 139 | 137 | 174 | 35 |
| | 10 | 175 | 63 | 73 | 200 | 95 | 103 | 108 | 217 |
| | 11 | 213 | 81 | 99 | 110 | 128 | 40 | 102 | 157 |
| | 25 | 0 | 0 | 0 | 0 | 0 | 0 | 0 | 0 |
| 18 | 1 | 203 | 87 | 0 | 75 | 48 | 78 | 125 | 170 |
| | 9 | 142 | 177 | 79 | 158 | 9 | 158 | 31 | 23 |
| | 11 | 8 | 135 | 111 | 134 | 25 | 17 | 54 | 175 |
| | 12 | 242 | 84 | 143 | 97 | 8 | 165 | 176 | 202 |
| | 11 | 38 | 190 | 19 | 48 | 1 | 18 | 191 | 105 |
| | 48 | 0 | 0 | 0 | 0 | 0 | 0 | 0 | 0 |
| 39 | 0 | 238 | 93 | 0 | 108 | 119 | 109 | 181 | 167 |
| | 7 | 172 | 132 | 24 | 181 | 32 | 5 | 157 | 45 |
| | 12 | 34 | 57 | 138 | 154 | 142 | 155 | 173 | 189 |
| | 49 | 0 | 0 | 0 | 0 | 0 | 0 | 0 | 0 |
| 40 | 2 | 0 | 103 | 0 | 98 | 0 | 169 | 193 | 78 |
| | 10 | 75 | 107 | 36 | 35 | 73 | 158 | 163 | 57 |
| | 13 | 125 | 163 | 143 | 35 | 102 | 82 | 179 | 180 |
| | 50 | 0 | 0 | 0 | 0 | 0 | 0 | 0 | 0 |
| 41 | 1 | 129 | 147 | 0 | 120 | 48 | 132 | 191 | 53 |
| | 5 | 229 | 7 | 2 | 101 | 47 | 0 | 197 | 215 |
| | 11 | 115 | 60 | 58 | 81 | 19 | 8 | 167 | 230 |
| | 51 | 0 | 0 | 0 | 0 | 0 | 0 | 0 | 0 |

Tables 7 and 8 are tables that are coupled to each other in the vertical direction.

The generated encoded bits ($d_{r0}, \ldots, d_{r(Nr-1)}$) (270) can be rate-matched through shortening and puncturing processes. Alternatively, the encoded bits (270) may be rate-matched by performing a sub-block interleaving process, a bit selection process, and an interleaving process. That is, the encoded bits ($d_{r0}, \ldots, d_{r(Nr-1)}$) (270) may be converted into rate-matched bits ($f_{r0}, \ldots, f_{r(gr-1)}$) (275) (Step S220).

Sub-block interleaving may mean a process for dividing a code block into a plurality of sub-blocks (e.g., 32 sub-blocks) and allocating bits based on the sub-block interleaving.

The bit selection may mean a process for increasing a bit sequence by repeating bits based on the number of bits to be rate-matched or decreasing the bit sequence based on shortening, puncturing, etc. The interleaving may mean a process for interleaving encoded bits after the bit selection.

In another example of the present disclosure, the rate matching may include the bit selection and interleaving. The sub-block interleaving is not mandatory.

After interleaving the encoded bits, code block concatenation is applied to concatenate the code blocks (275) so that a codeword (285) ($g_0, \ldots, g_{G-1}$) may be generated (S225). The generated codeword 280 may be equivalent to one transport block.

Figure 5:
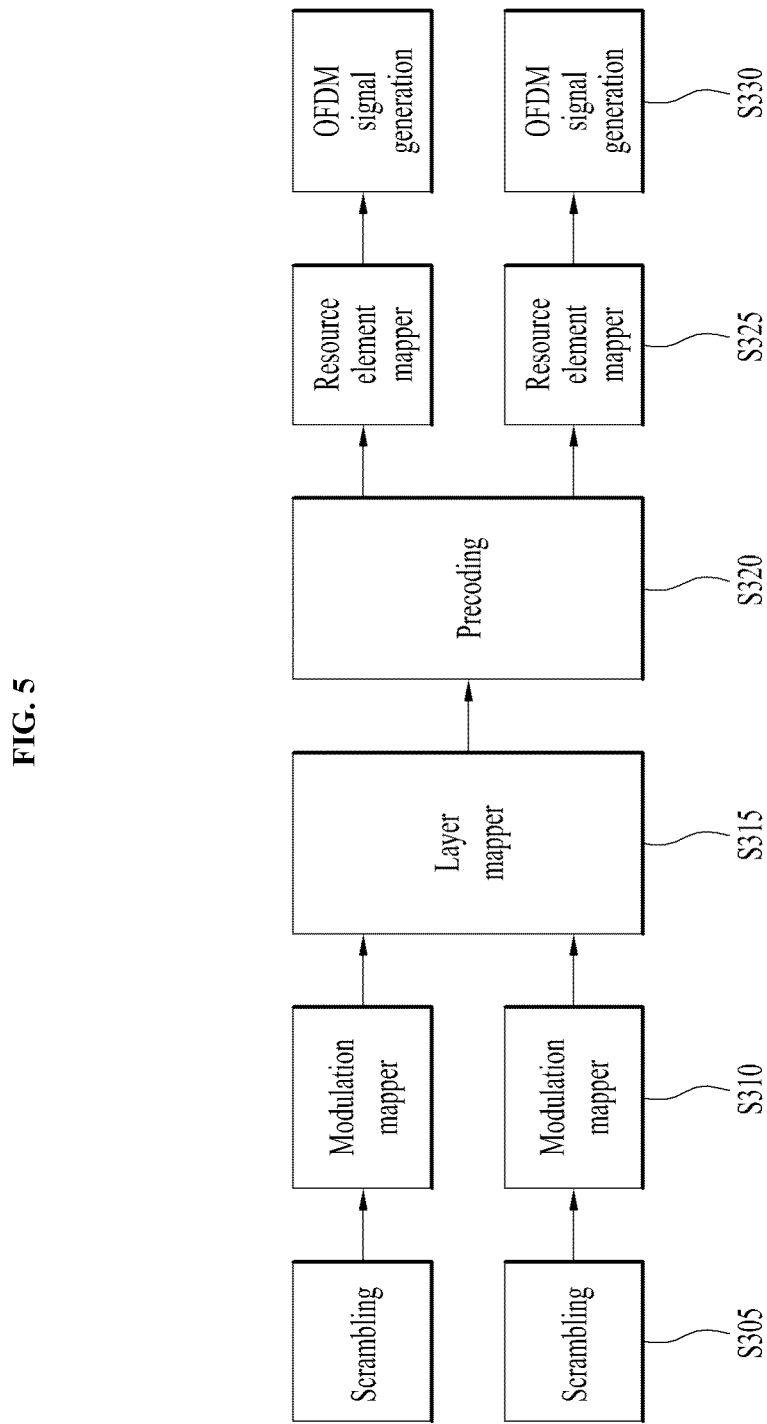
FIGS. 5 and 6 are diagrams for explaining a modulation method according to the present disclosure.
Figure 6:
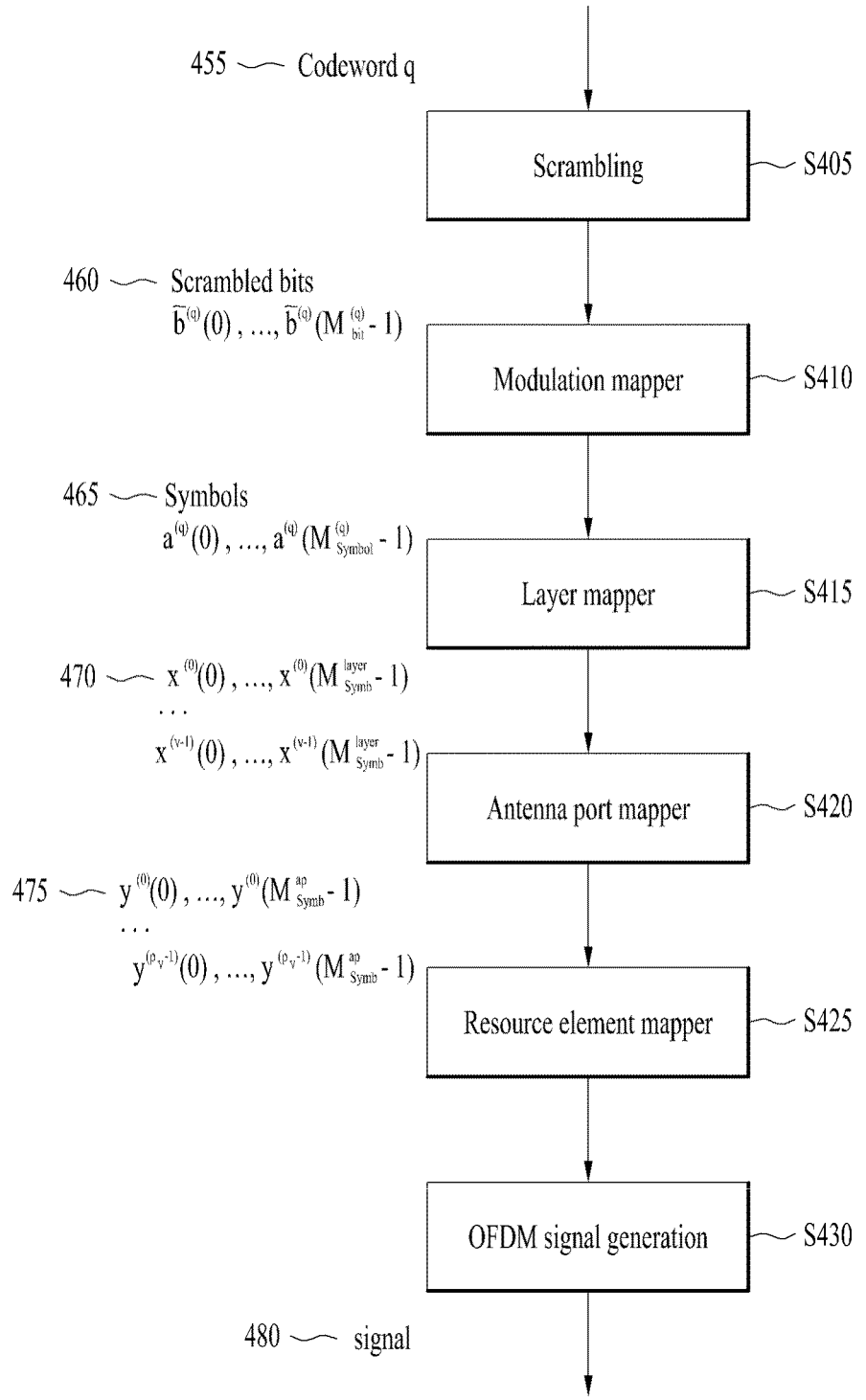

FIGS. 5 and 6 are diagrams for explaining a modulation method according to the present disclosure.

Referring to FIGS. 5 and 6, one or more codewords are input and scrambled (S305 and S405). For example, scrambling may be performed based on EOR operation between an input bit sequence and a predetermined bit sequence. The scrambled bits are modulated (S310 and S410), and the modulated symbols are mapped to layers (S315 and S415). The symbols mapped to the layers are precoded for antenna port mapping. The precoded symbols are mapped to resource elements (S325 and S425). The mapped symbols are generated as OFDM signals (S330 and S430) and transmitted through antennas.

Figure 7:
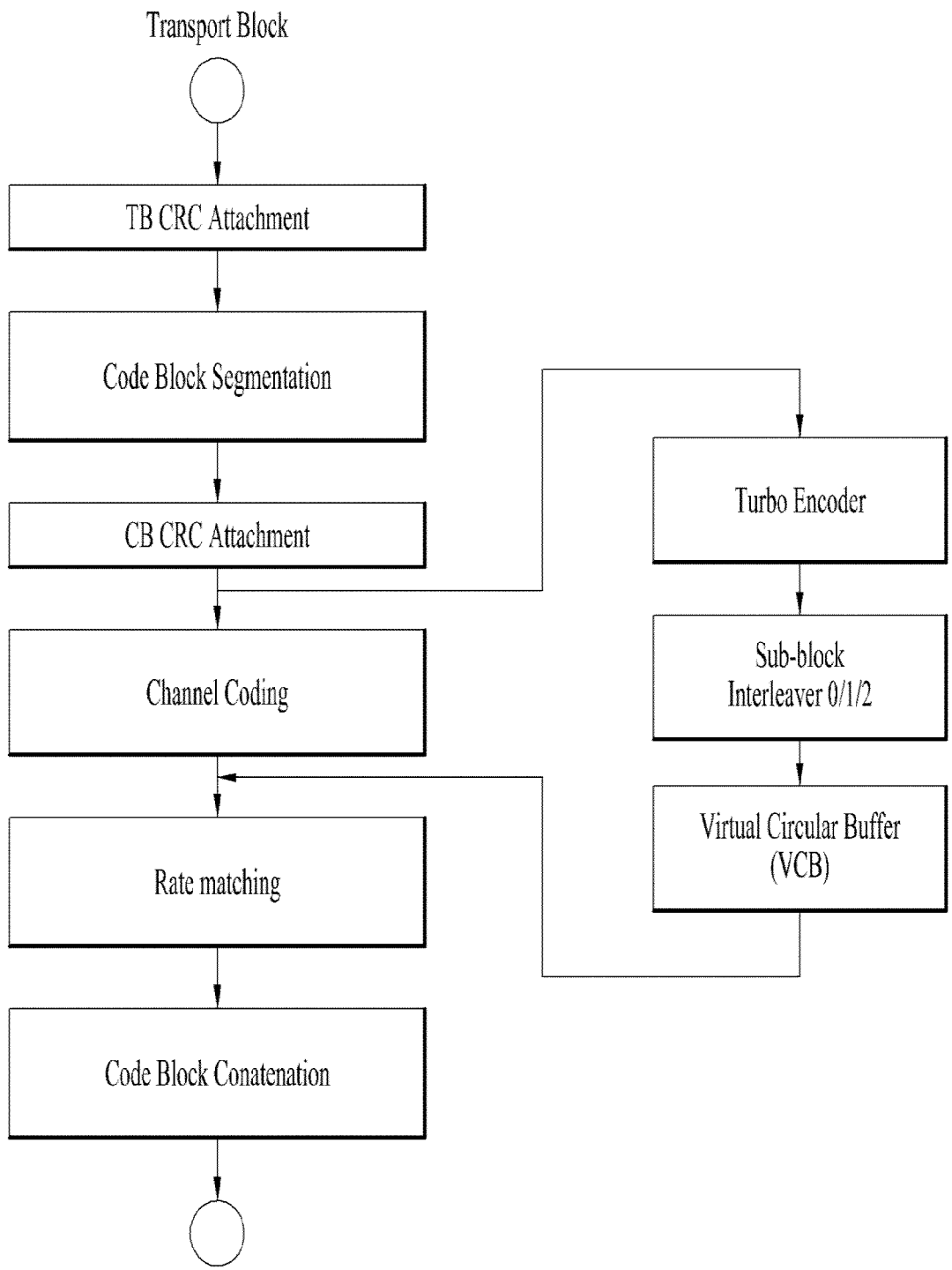
FIG. 7 is a flowchart illustrating a method for processing a transport block (TB) in a wireless communication system.

FIG. 7 is a flowchart illustrating a method for processing a transport block (TB) in a wireless communication system.

Referring to FIG. 7, when a transport block (TB) is input, a first CRC for the transport block (TB) may be generated, and the first CRC may be attached to the TB. The TB to which the first CRC is attached (i.e., CRC-attached TB) may be segmented. That is, the CRC-attached TB is segmented into a plurality of code blocks. Segmentation of the CRC-attached TB is referred to as code block segmentation.

A second CRC may be attached to each of the code blocks. One code block to which the second CRC is attached may be used as a unit of channel coding. For example, in the case of turbo coding, a first parity code and a second parity code can be formed by interleaving one code block to which the second CRC is attached. In the case of turbo coding, a systematic bit sequence is convolution-encoded in the order of input bit sequences (i.e., code blocks to which the second CRC is attached) and is then generated, but the first parity code and the second parity code can be generated by interleaving the order of input bit sequences. According to the turbo coding method, a systematic bit sequence, a first parity bit sequence, and a second parity bit sequence may be sequentially input to a circular buffer or may be interleaved and input to the circular buffer. The first parity bit sequence and/or the second parity bit sequence may be rate-matched by puncturing or shortening. Also, the rate matching may include repeatedly processing the systematic bit sequence. The rate-matched bit sequence may be concatenated to generate a codeword corresponding to the transport block (TB). The coded bit sequences may correspond to the plurality of code blocks, respectively. The codeword formed by concatenation of the coded bit sequences may correspond to the transport block (TB). The error of the systematic bit sequence can be corrected based on the first parity bit sequence and the second parity bit sequence, so that the turbo code is a kind of error correction code.

In order for a receiving side to correct errors that a channel experiences, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of transport blocks. The following coding steps may be applied to each transport block:

cyclic redundancy check (CRC) attachment to a transport block;
code block segmentation and CRC attachment to a code block;
channel coding;
rate matching; and
code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, assuming that the amount of radio resources (i.e., the number of transport bits capable of being transmitted by the corresponding radio resources) is set to M, and the number of coded bit sequences (i.e., the number of output bits of the encoder) is set to N, when M is different from N (i.e., M≠N), the length of the coded bit sequence is adjusted so that rate matching for M adjustment is performed. If M>N, all or some of bits of the coded bit sequence may be repeated in a manner that the length of a rate-matched sequence is identical to 'M'. If M<N, some of bits of the coded bit sequence may be punctured such that the length of the rate-matched sequence is equal to 'M', and the punctured bits are excluded from transmission.

That is, in the 3G LTE/LTE-A system, data to be transmitted is encoded using channel coding with a specific code rate (e.g., 1/3). If the number of bits capable of being transmitted is different from the number of coded bits, the code rate of the data to be transmitted is adjusted through a rate matching procedure including puncturing and repetition. When the turbo code is used as a channel code in the LTE/LTE-A system, a procedure of performing channel coding and rate-matching on each code block in the transport block processing procedure as illustrated in FIG. 7 is illustrated in FIG. 8.

Figure 8:
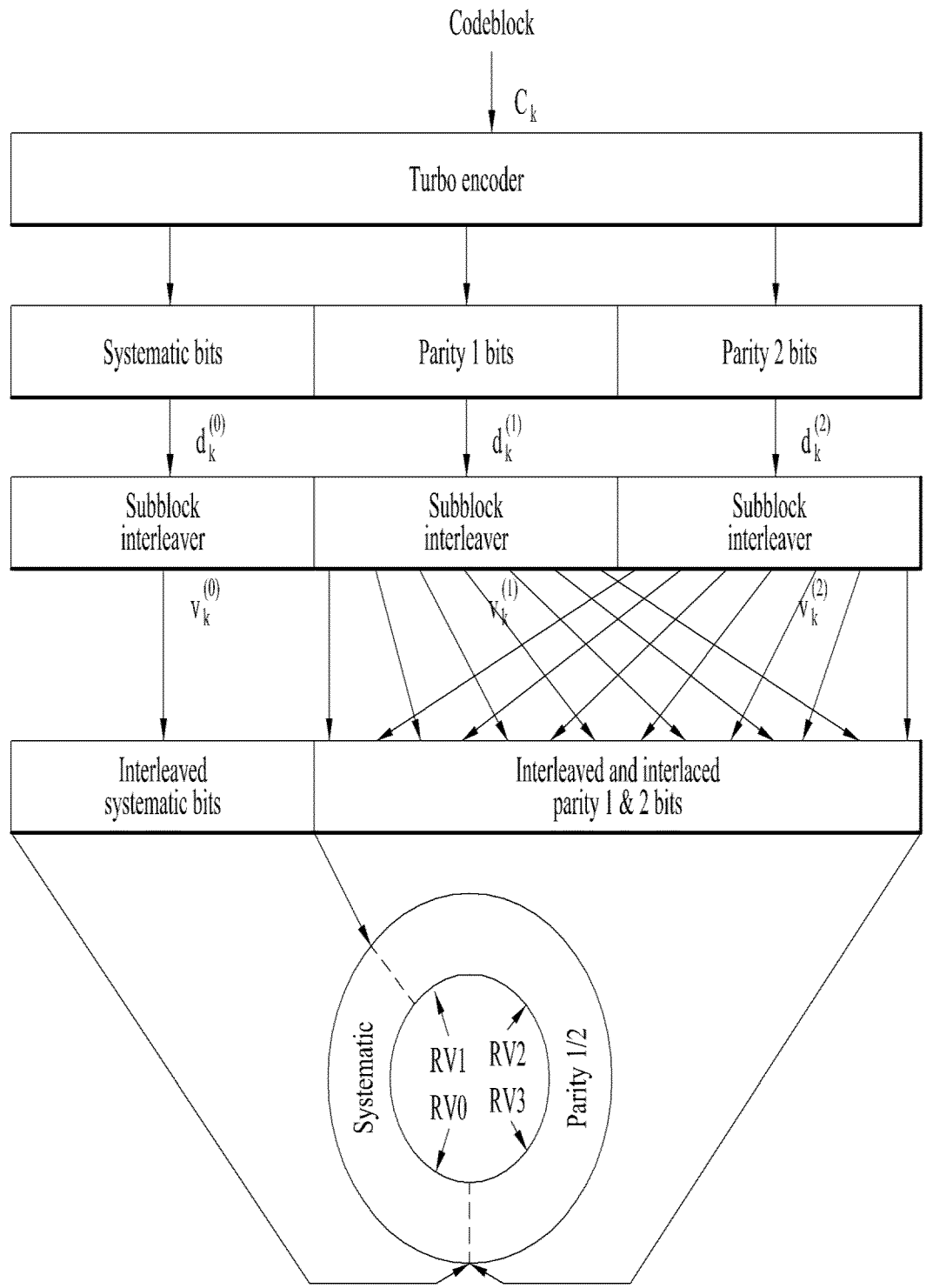
FIG. 8 is a block diagram illustrating a method for performing rate matching by dividing an encoded code block into a systematic part and a parity part.

FIG. 8 is a block diagram illustrating rate matching performed by separating an encoded code block into a systematic part and a parity part.

As illustrated in FIG. 8, the mother code rate of an LTE/LTE-A turbo encoder is 1/3. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 9:
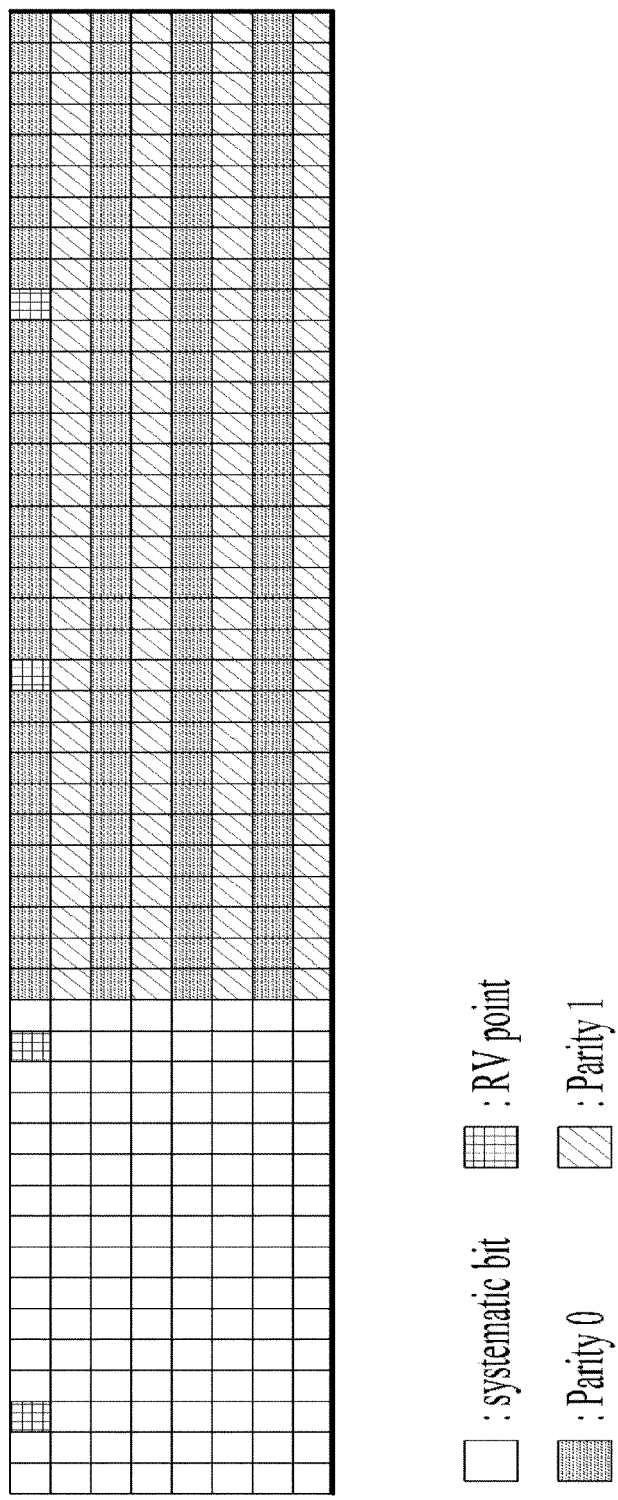
FIG. 9 is a diagram illustrating an internal structure of a circular buffer.

FIG. 9 illustrates an internal structure of a circular buffer.

The circular buffer is the most important part of the rate matching module, making it possible to perform puncturing and repetition of a mother code. Referring to FIG. 8, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than 1/3), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 9, with the progressing number of retransmissions, the RV becomes higher and therefore fewer systematic bits and more parity bits are read out from the circular buffer for retransmission.

Using a channel code is essential in a broadcasting system as well as a communication system such as an LTE system (that is, 4G). If the channel code is used, a transmitting side performs encoding upon an input symbol through an encoder and transmits the encoded symbol, and a receiving side performs decoding upon the encoded symbol to restore the input symbol. In this case, the size of the input symbol and the size of the encoded symbol are differently applied according to an applied system. For example, in a turbo code for data information used in 3GPP LTE, the size of the input symbol is a maximum of 6144 bits and the size of the encoded symbol is a maximum of 18432 (=6144*3).

Figure 10:
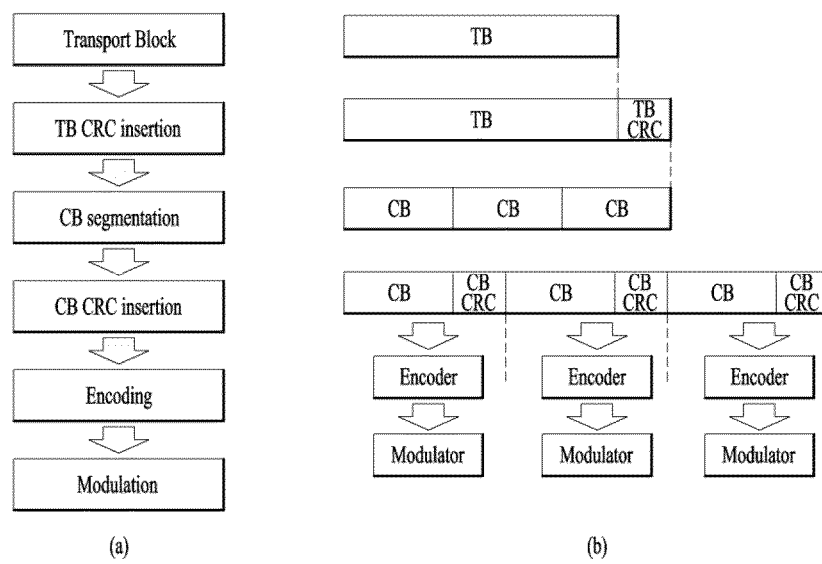
FIG. 10 is a diagram illustrating a detailed example of a method for processing a transport block.

FIG. 10 is illustrated to explain in more detail a processing procedure of the transport block.

The size of a symbol input to an encoder (e.g., a turbo encoder) may differ from the size of a transport block (TB) from a medium access control (MAC) layer. If the TB is larger than a maximum size of the input symbol of the turbo code, the TB is segmented into several code blocks (CBs). In this case, the size of a CB becomes a maximum of '6144−CRC size'. The input symbol of the turbo code corresponds to data including a CB and a CRC or including a TB (<6144 bits) and a CRC (a maximum of 24 bits). Output symbol(s) of the encoder are modulated into a modulation symbol by a modulator after being subjected to rate matching and CB concatenation.

A decoding procedure of the channel code is a reverse process of FIG. 4 and a decoder corresponding to each encoder of a transmitting device is used in the decoding procedure performed in a receiving device. The receiving device performs decoding upon each CB, configures a TB, and finally confirms whether the TB has passed a TB CRC. In a current LTE/LTE-A system, a CB CRC is used for fast decoding termination. For example, if the CB CRC has failed, the receiving device may generate NACK without decoding other CBs.

Three main requirement categories for 5G include (1) a category of enhanced mobile broadband (eMBB), (2) a category of massive machine type communication (mMTC), and (3) a category of ultra-reliable and low-latency communication (URLLC).

Partial use cases may require a plurality of categories for optimization and other use cases may focus upon only one key performance indicator (KPI). 5G supports such various use cases using a flexible and reliable method.

eMBB far surpasses basic mobile Internet access and covers abundant bidirectional work and media and entertainment applications in cloud and augmented reality. Data is a core driving force of 5G and, in the 5G era, a dedicated voice service may not be provided for the first time. In 5G, it is expected that voice will simply be processed as an application program using data connection provided by a communication system. Main causes for increased traffic volume are increase in the size of content and an increase in the number of applications requiring high data transmission rate. A streaming service (of audio and video), conversational video, and mobile Internet access will be more widely used as more devices are connected to the Internet. These application programs require always-on connectivity in order to push real-time information and alerts to users. Cloud storage and applications are rapidly increasing in a mobile communication platform and may be applied to both work and entertainment. Cloud storage is a special use case which accelerates growth of uplink data transmission rate. 5G is also used for cloud-based remote work. When a tactile interface is used, 5G demands much lower end-to-end latency to maintain good user experience. Entertainment, for example, cloud gaming and video streaming, is another core element which increases demand for mobile broadband capability. Entertainment is essential for a smartphone and a tablet in any place including high mobility environments such as a train, a vehicle, and an airplane. Other use cases are augmented reality for entertainment and information search. In this case, augmented reality requires very low latency and instantaneous large data volume.

In addition, one of the most expected 5G use cases relates to a function capable of smoothly connecting embedded sensors in all fields, i.e., mMTC. It is expected that the number of potential IoT devices will reach 20.4 billion up to the year of 2020. Industrial IoT is one of categories of performing a main role enabling a smart city, asset tracking, smart utilities, agriculture, and security infrastructure through 5G.

URLLC includes new services that will transform industries with ultra-reliable/available, low-latency links such as remote control of critical infrastructure and a self-driving vehicle. A level of reliability and latency is essential to control and adjust a smart grid, industrial automation, robotics, and a drone.

5G is a means of providing streaming at a few hundred megabits per second to gigabits per second and may complement fiber-to-the-home (FTTH) and cable-based broadband (e.g., DOCSIS). Such high speed is needed to deliver TV at a resolution of 4K or more (6K, 8K, and more), as well as virtual reality and augmented reality. Virtual reality (VR) and augmented reality (AR) applications include immersive sports games. A specific application program may require a special network configuration. For example, for VR games, gaming companies need to incorporate a core server into an edge network server of a network operator in order to minimize latency.

The automotive industry is expected to be a new important driving force in 5G together with many use cases for mobile communication for vehicles. For example, entertainment for passengers requires high simultaneous capacity and mobile broadband with high mobility. This is because future users continue to expect high connection quality regardless of location and speed. Another automotive use case is an AR dashboard. The AR dashboard displays information for informing a driver of a distance to an object and movement of the object by being superimposed on an object seen from a front windshield to identify an object in the dark. In the future, a wireless module will enable communication between vehicles, information exchange between a vehicle and supporting infrastructure, and information exchange between a vehicle and other connected devices (e.g., devices transported by a pedestrian). A safety system guides alternative courses of a behavior so that a driver may drive more safely, thereby lowering the danger of an accident. The next stage will be a remotely controlled or self-driven vehicle. This requires very high reliability and very fast communication between different self-driven vehicles and between a vehicle and infrastructure. In the future, a self-driven vehicle will perform all driving activities and a driver will focus only upon abnormal traffic that the vehicle cannot identify. Technical requirements of a self-driven vehicle demand ultra-low latency and ultra-high reliability so that traffic safety is increased to a level that cannot be achieved by a human being.

A smart city and a smart home (also called a smart society) will be embedded in a high-density wireless sensor network. A distributed network of an intelligent sensor will identify conditions for costs and energy-efficient maintenance of a city or a home. Similar configurations may be performed for respective households. All temperature sensors, window and heating controllers, burglar alarms, and home appliances are wirelessly connected. Many of these sensors are typically low in data transmission rate, power, and cost. However, real-time HD video may be demanded by a specific type of device to perform monitoring.

Consumption and distribution of energy including heat or gas is highly decentralized so that automated control of the distribution sensor network is demanded. The smart grid collects information and connects the sensors to each other using digital information and communication technology so as to act according to the collected information. Since this information may include behaviors of a supply company and a consumer, the smart grid may improve distribution of energy such as electricity by a method having efficiency, reliability, economic feasibility, sustainability of production, and automatability. The smart grid may also be regarded as another sensor network having low latency.

A health care part contains many application programs capable of enjoying the benefits of mobile communication. A communication system may support remote treatment that provides clinical treatment in a faraway place. Remote treatment may aid in reducing disadvantages of restricted distance and improve access to medical services that cannot be continuously available in a faraway rural area. Remote treatment is also used to perform important treatment and save lives in an emergency situation. The wireless sensor network based on mobile communication may provide remote monitoring and sensors for parameters such as heart rate and blood pressure.

Wireless and mobile communication gradually becomes important in an industrial application field. Wiring is high in installation and maintenance cost. Therefore, a possibility of replacing a cable with reconstructable wireless links is an attractive opportunity in many industrial fields. However, in order to achieve this replacement, it is necessary for wireless connection to be established with latency, reliability, and capacity similar to those of cables and management of wireless connection needs to be simplified. Low latency and a very low error probability are new requirements when connection to 5G is needed.

Logistics and freight tracking are important use cases for mobile communication that enable inventory and package tracking anywhere using a location-based information system. The use cases of logistics and freight tracking typically demand low data rate but require location information with a wide range and reliability.

5G provides higher speeds and better coverage than current 4G. NR operates in a high frequency band and is required to offer speeds of up to 1 Gb/s for tens of connections or tens of Mb/s for tens of thousands of connections. To meet requirements of such an 5G system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In 5G, low calculation complexity, low latency, low cost, and higher flexibility are demanded for a coding scheme. Furthermore, reduced energy per bit and improved region efficiency are needed to support a higher data rate.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

LDPC codes were proposed by Gallager in 1962 as linear block codes, which are low density because most elements of a parity check matrix H are 0. Since the LDPC codes are very complicated such that it was impossible to implement the LDPC codes using technology of the time when the proposal was made, the LDPC codes were forgotten. In 1995, LDPC codes were rediscovered and extensive research thereinto has been carried out since performance thereof was proven (references: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999)). Current LDPC codes have mainly been used in 802.11n (refer to 'IEEE P802.11n=D10: 'Draft IEEE Standard for Local Metropolitan networks—Specific requirements. Part 11: Wireless LAN Medium Access Control (MAC), and Physical Layer (PHY) specifications: Enhancements for Higher Throughput', March 2006.'), 802.11ac, or digital video broadcasting (DBV). Generally, in standards to which LDPC is applied (e.g., DVB standard), encoding is performed using a parity check matrix instead of a generator matrix.

The parity check matrix of the LDPC code has a very small number of is so that the LDPC code may be decoded through iterative decoding even in a very large block size. If a block size significantly increases, the LDPC exhibits performance approximating to Shannon's channel capacity limit like a turbo code. The number of is included in a row or a column of the parity check matrix is referred to as a weight.

The LDPC code may be explained by an (n−k)*n parity check matrix H. A generator matrix G corresponding to the parity check matrix H may be obtained by the following equation.

$$H \cdot G = 0 \quad \text{[Equation 3]}$$

In the encoding process based on LDPC codes, the encoder of a transmitter (Tx device) may encode input data using the following equation, based on the generator matrix (G) that has the relationship of Equation 1 with the parity check matrix (H).

$$c = G \cdot x \quad \text{[Equation 4]}$$

Herein, c is a codeword and x is an information bit. Each codeword having the length of 'n' may include K information bits and R parity bits.

The decoder of the receiving device should acquire the information bit x from the codeword c, which is a result of encoding performed by the transmitting device, and the property of Hc=0 is used to obtain the information bit x. That is, if a received codeword is c' and a result of calculating the value of Hc' is 0, front k bits of c' are determined to be decoded information bits. If the value of Hc' is not 0, the information bit x is restored by searching for c' satisfying the value of Hc' being 0, using a sum-product algorithm through a graph, a belief propagation algorithm, etc. The inspection equation of Hc'=0 may be changed to c'HT'=0 according to the relationship between the information bit and the generator matrix G. Therefore, the inspection equation may vary with the relationship between the information bit and the generator matrix G.

Figure 11:
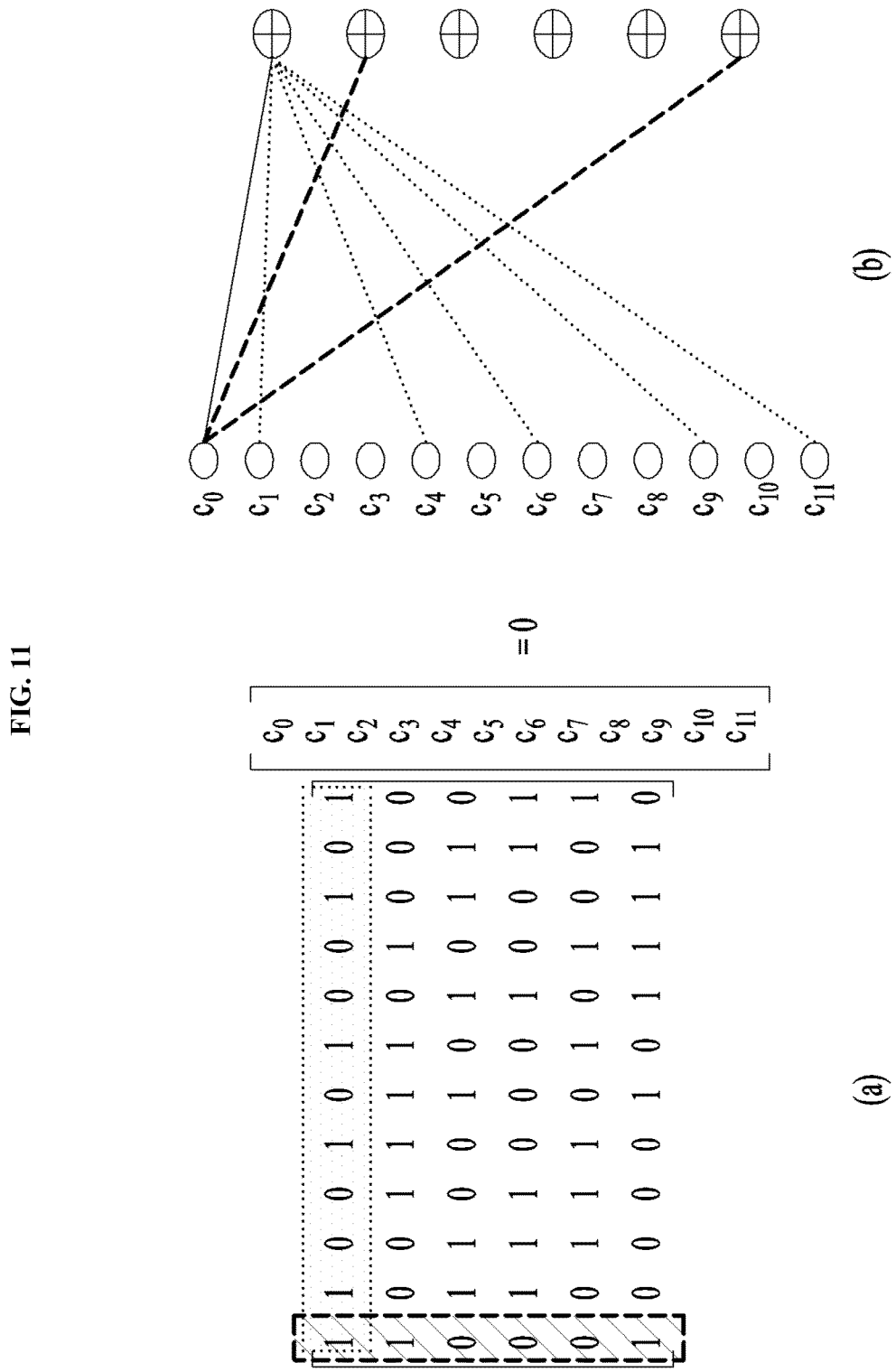
FIG. 11 is a diagram illustrating examples of explaining a parity check matrix (H) of LDPC codes using a bipartite graph.
Figure 12:
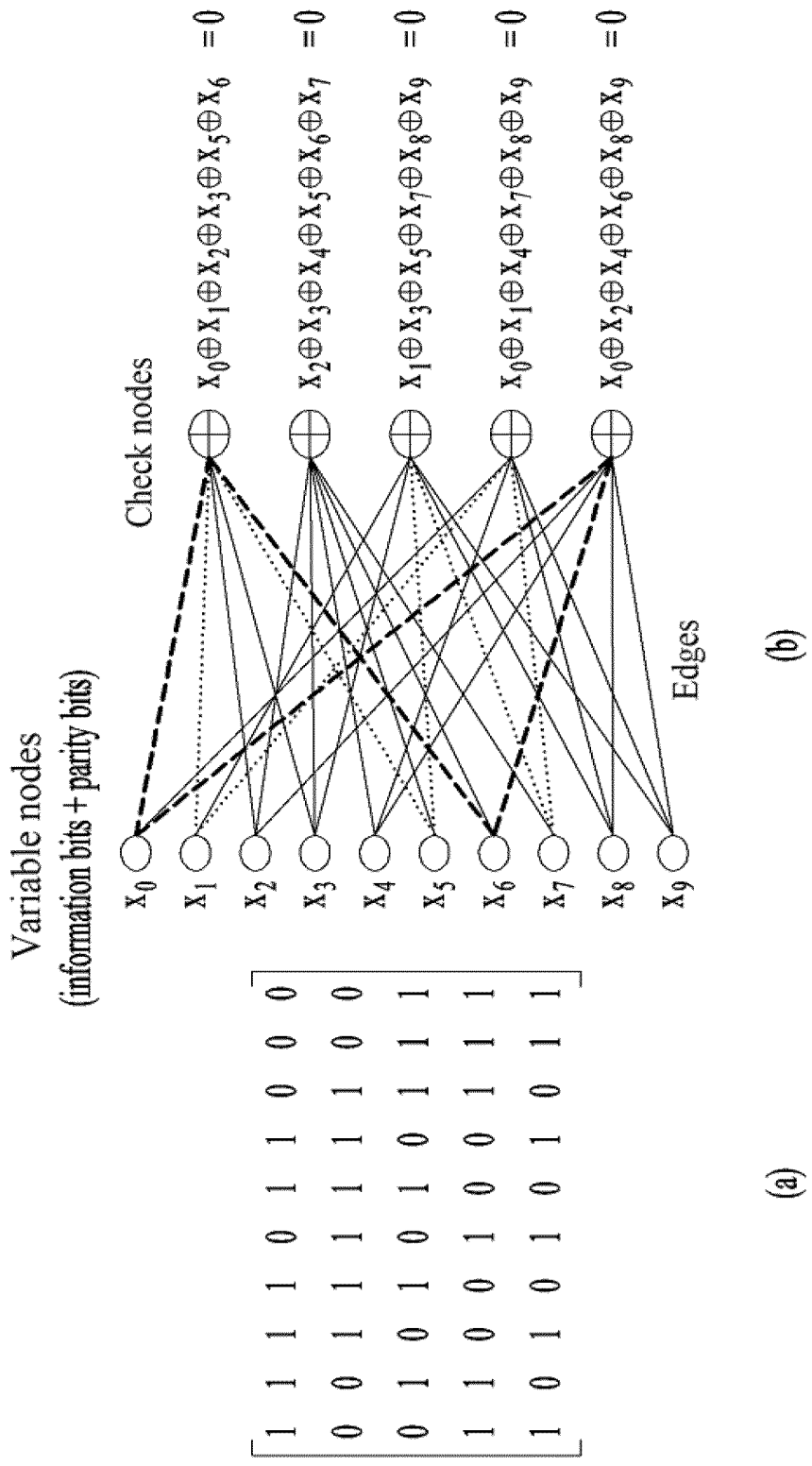
FIG. 12 is a diagram illustrating another parity check matrix and total bipartite lines.

FIGS. 11 and 12 are illustrated to explain a parity check matrix H of an LDPC code through a bipartite graph.

'1' in a row of the parity check matrix illustrated in FIG. 11(a) represents an edge connected to a check node in the bipartite graph and '1' in a column of the parity check matrix represents an edge connected to a variable node. FIG. 11(b) illustrates a part of the bipartite graph corresponding to the parity check matrix illustrated in FIG. 11(a). Referring to FIG. 5(b), in the bipartite graph, the left nodes represent variable nodes and the right nodes represent check nodes. The bipartite graph shown in FIG. 11(b) may include 12 VNs and 6 CNs. Each VN may represent coded bits to be transmitted, or may represent coded bits to be punctured (i.e., coded bits not to be transmitted). 12 coded bits for 12 VNs may construct the codeword. VNs may be connected to CNs through edges. The degree of a node may be identical to the number of edges connected to this node. For example, in FIG. 11(b), VN corresponding to 'c0' has three edges, and may be denoted by 'degree-3 node'. At the position of an element having the value of '1' from among elements of the parity check matrix, VN may be connected to CN through edges, so that the VN degree may also refer to the number of '1's included in a column of the parity check matrix (PCM). For example, in the example of FIG. 11, each column of the parity check matrix includes three '1's, so that all of VNs of FIG. 11 may be 'degree-3 VN'.

FIG. 12 illustrates another parity check matrix and all bipartite lines.

Referring to FIG. 12, since the product of a parity check matrix H and a codeword c' should be '0', in any one check node, the sum of values of a hard decision result of variable nodes connected to the check node should be '0'. In FIG. 12(a), equations for hard decision for respective check nodes are given. In this way, in a check node, checking whether the sum of the variable node(s) connected to the check node is '0' is referred to as a syndrome check.

The parity check matrix (PCM) may include a plurality of $Z_c*Z_c$ submatrices. Each $Z_c*Z_c$ submatrix may be a $Z_c*Z_c$ zero matrix, or may be a $Z_c*Z_c$ circular permutation matrix (CPM) that is obtained by circularly shifting a $Z_c*Z_c$ identity matrix in a specific direction (e.g., right side) a non-negative integer number of times.

Figure 13:
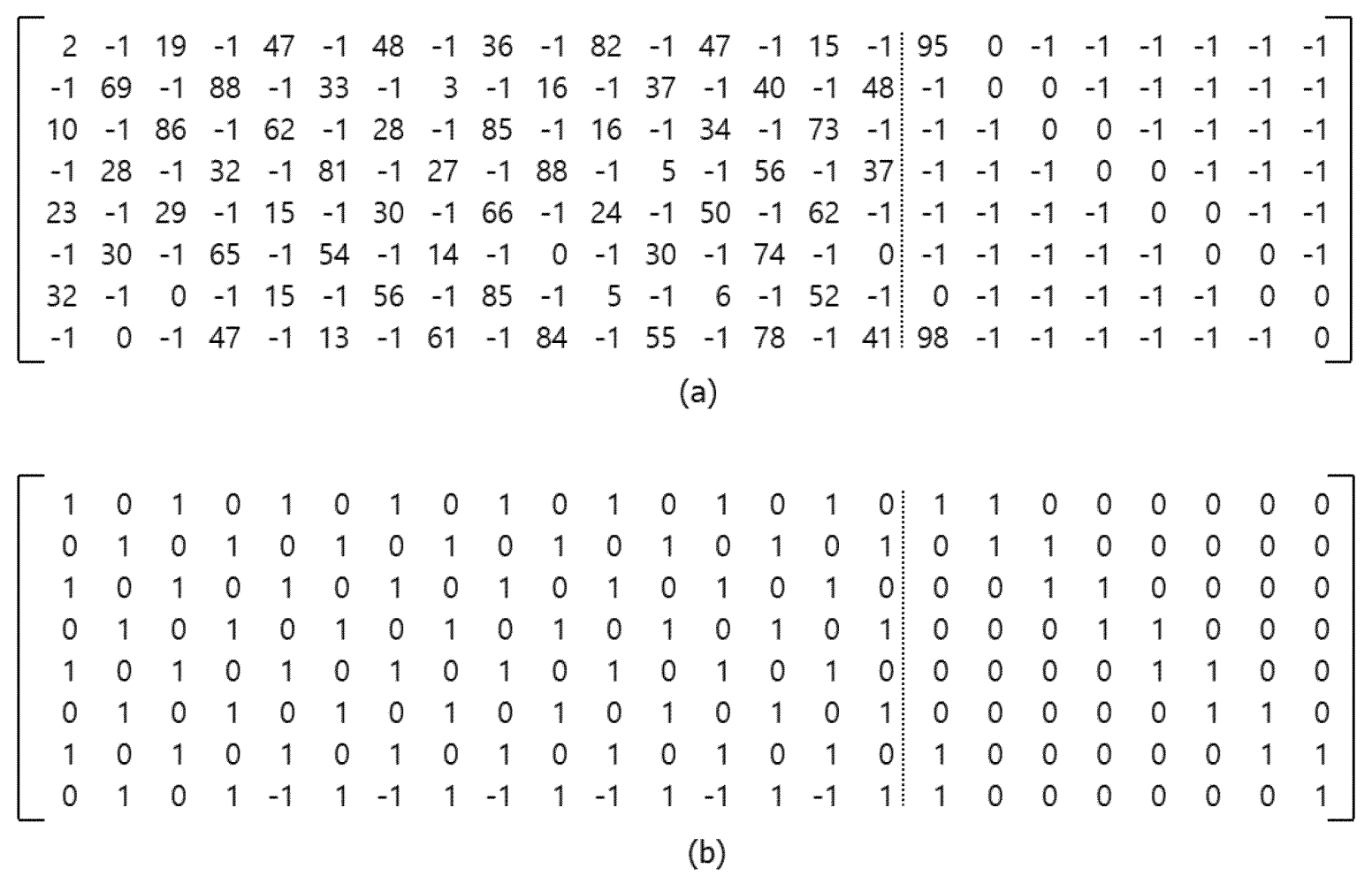

FIG. 13 is a diagram illustrating an example of a parity check matrix (PCM) that is represented as a model matrix and a basegraph. Specifically, FIG. 13(a) and FIG. 13(b) illustrate a model matrix and a basegraph for parity check matrices (PCMs) having a mother code rate of 2/3, respectively.

In FIG. 13(a), '−1' may denote a $Z_c*Z_c$ zero matrix, and each of non-negative integers may denote the number ($V_{i,j}$) of shifting. FIG. 13(b) shows a BG corresponding to a model matrix of FIG. 13(a). In the model matrix, whereas a $Z_c*Z_c$ zero matrix is denoted by '−1', the $Z_c*Z_c$ zero matrix in the BG is denoted by '0', and CPMs denoted by non-negative integers in the model matrix are represented by '1' in the basegraph. The mother code rate of the basegraph having the size of $(K_b+M_b)*M_b$ is $K_b/(K_b+M_b)$, where '$K_b$' is the number of columns of information parts of the basegraph and '$M_b$' is the number of columns of the parity part of the basegraph.

Various sizes of PCMs, each of which has a specific mother code rate, can be represented by the basegraph ($H_{BG}$) having the specific mother code rate. Each element of an HBG is 0 or 1, and PCM can be obtained by replacing each element of the HBG with a $Z_c*Z_c$ matrix. In this case, each element '0' from among elements of the $H_{BG}$ may be replaced with a $Z_c*Z_c$ zero matrix, each element of 1 can be replaced with '$Z_c*Z_c$ CPM I($P_{i,j}$)' (where T is a row index of the element, T is a column index of the element, and I($P_{i,j}$) is obtained by circularly shifting the $Z_c*Z_c$ identity matrix $P_{i,j}$ times in a specific direction (e.g., right side)). The value of $P_{i,j}$ is given by $P_{i,j}=\text{mod}(V_{i,j}, Z_c)$. That is, the basegraph having the size of $(K_b+M_b)*M_b$ can be lifted to a parity check matrix (PCM) having the size of $(K_b*Z_c+M_b*Z_c)*(M_b*Z_c)$. If the input information sequence is encoded based on the PCM having the size of $(K_b*Z_c+M_b*Z_c)*(M_b*Z_c)$, the output sequence having the size of $N<=(K_b+M_b)*Z_c$ can be obtained.

In order to effectively encode various communication environments and usage scenarios, etc., a plurality of basegraphs can be defined. For example, a basegraph suitable for encoding a large transport block (TB) or a large code block, and the other basegraph beneficial to a small transport block (TB) or a short latency can be defined separately from each other. For example, a first LDPC basegraph (LDPC basegraph 1) including 46 rows and 68 columns and a second LDPC basegraph (LDPC basegraph 2) including 42 rows and 52 columns are used in 5G systems. LDPG basegraph 1 and parity check matrices (PCMs) corresponding thereto for use in 5G systems may refer to Tables 5 and 6 (Table 5.3.2-2 in 3GPP TS 38.212), and LDPC basegraph 2 and PCMs corresponding thereto may refer to Tables 7 and 8 (Table 5.3.2-3). From among the LDPC basegraph 1 and the LDPC basegraph 2, the basegraph used for encoding/decoding can be selected based on the TB size and the code rate.

In order to facilitate understanding of encoding/decoding of LDPC codes, the LDPC coding method will hereinafter be described using the LDPC code for use in 5G systems as an example. Bit sequence inputs ($c_0, c_1, c_2, c_3, \ldots, c_{K-1}$) for given code blocks may be encoded to output bit sequences ($d_0, d_1, d_2, d_3, \ldots, d_{N-1}$) by the LDPC codes, where K is the number of bits to be encoded, and N is the number of output bits). '$Z_c$' is a positive integer that represents the degree of extension of each element of the model matrix or the basegraph, and is referred to as an expansion factor a lifting size. A plurality of lifting sizes may share ($V_{i,j}$) values, there may be a plurality of lifting size sets configured to share different ($V_{i,j}$) values. The following table illustrates the sets of LDPC lifting sizes (Z).

TABLE 9

| Set index ($i_{LS}$) | Set of lifting sizes (Z) |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

$V_{i,j}$ values for each set index $i_{LS}$ can be defined, and the lifting values having the same set index may share the $V_{i,j}$ values.

The value of $Z_c$ may be a minimum value of Z satisfying $K_b * Z_c \geq K'$, (where $K_b$ is the number of column of information parts of the basegraph, and K' is the sum of the number (K) of bits of the code block and the number (L) of bits of the CRC sequence. For the code block encoded by LDPC, the encoder may search for a lifting set including the value of $Z_c$, and can obtain the parity check matrix (PCM) (H) based on the $V_{i,j}$ values for both of the LDPC basegraph and the lifting set. The encoder can obtain the output bit sequence $d_0, d_1, d_2, d_3, \ldots, d_{N-1} = c_0, c_1, c_2, \ldots, c_{K-1}, w_0, w_1, w_2, \ldots, w_{N+2Z_c-K-1}$ by encoding the bit sequence input ($c_0, c_1, c_2, c_3, \ldots, c_{K-1}$) for the given code block using the PCM (H). The encoder may generate (N+2$Z_c$−K) parity bits $w = [w_0, w_1, w_2, \ldots, w_{N+2Z_c-K-1}]^T$ such that $$H \times \begin{bmatrix} c \\ w \end{bmatrix} = 0$$

can be achieved based on the parity check matrix (H), where $c = [c_0, c_1, c_2, \ldots, c_{K-1}]^T$ is a systematic bit sequence, 0 is a zero vector in which all elements are zero. Such encoding can be performed by GF(2), FIG. 14 is a flowchart illustrating an encoding process and a decoding process for use in a wireless communication system.

Figure 14:
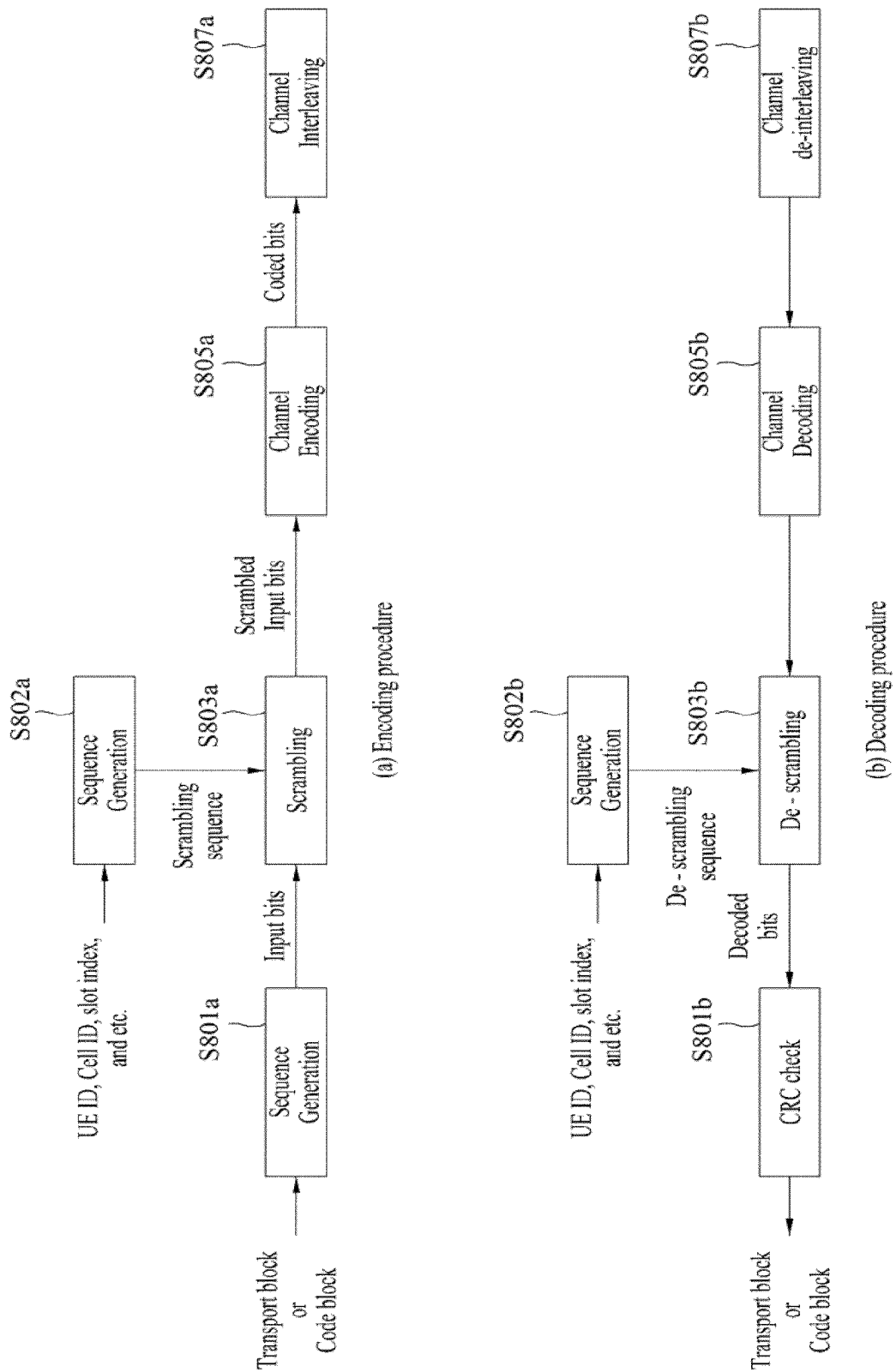
FIG. 14 is a flowchart illustrating a method for applying basegraph(s) or parity check matrice(s) of LDPC code(s) to channel encoding and channel decoding.

Basegraph(s) and PCM(s) of LDPC code(s) can be used in the channel encoding and channel decoding of FIG. 14.

Referring to FIG. 14(a), a transmission (Tx) device (i.e., a transmitter) may scramble the input bits, which are obtained by adding a CRC code to a transport block (TB) or a code block (S801a), using a scrambling sequence (S803a), may generate coded bits by performing channel encoding on the scrambled input bits (S805a), and may perform channel interleaving on the coded bits (S807a). Referring to FIG. 14(b), a reception (Rx) device (i.e., a receiver) may perform channel de-interleaving of the received bits either based on a channel interleaving pattern applied to the encoding process or based on the other channel interleaving pattern corresponding to the channel interleaving pattern (S807b), may obtain the coded bits, and may obtain scrambled bits by performing channel decoding of the coded bits (S805b). The receiver may perform de-scrambling of the scrambled bits using the scrambling sequence (S803b), and may obtain a sequence of the decoded bits (hereinafter referred to as a decoded bit sequence). The Rx device may check the presence or absence of an error in the decoded bit sequence using CRC bits included in the decoded bit sequence (S801b). If CRC of the decoded bit sequence fails, the Rx device may determine that decoding of the received (Rx) signal has failed. If CRC of the decoded bit sequence is successful, the Rx device may determine that the decoding process was successful. Thereafter, the CRC code is removed from the decoding bit sequence, so that a transport block (TB) or a code block can be obtained.

In FIG. 14(a), CRC generation (S801a), sequence generation (S802a), scrambling (S803a), channel encoding (S805a), and channel interleaving (S807a) can be performed by a CRC code generator, a sequence generator, a scrambler, a channel encoder, and a channel interleaver, respectively. The CRC code generator, the sequence generator, the scrambler, the channel encoder, and the channel interleaver may be configured as a part of the processor of the Tx device, and may be configured to operate under control of the processor of the Tx device. In FIG. 14(b), CRC checking (S801b), sequence generation (S802b), de-scrambling (S803b), channel decoding (S805b), and channel interleaving (S807b) may be performed by a CRC checker, a sequence generator, a descrambler, a channel decoder, and a channel interleaver, respectively. The CRC checker, the sequence generator, the descrambler, the channel decoder, and the channel interleaver may be configured as a part of the processor of the Rx device, and may be configured to operate under control of the processor of the Rx device. The scrambler may generate m-sequence using a UE ID, a cell ID, and/or a slot index, may scramble input bits, which are to be input to the scrambler and are composed of the information bits and the CRC bits, using the m-sequence. The descrambler may generate the m-sequence using the UE ID, the cell ID, and/or the slot index, and may descramble the input bits, which are to be input to the descrambler and are composed of the information bits and the CRC bits, using the m-sequence.

Some steps of the encoding process or some steps of the decoding process can be omitted according to the categories of data or control information. For example, although the example of FIG. 14 illustrates the encoding/decoding process including scrambling/descrambling for convenience of description, the scrambling/descrambling can also be omitted as necessary.

Figure 15:
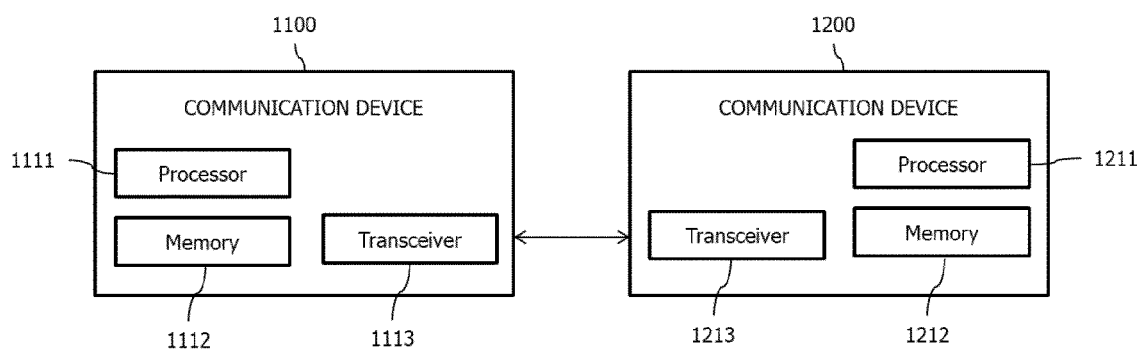
FIG. 15 is a block diagram illustrating communication devices capable of performing implementations of the present disclosure.

FIG. 15 illustrates wireless communication devices capable of performing implementations of the present disclosure.

In FIG. 15, each communication device may be a base station (BS), a network node, a Tx UE, an Rx UE, a wireless device, a wireless communication device, a vehicle, a vehicle having an autonomous traveling function, a connected car, a UAV, an AI module, a robot, an AR device, a VR device, an MR device, a hologram device, a public safety device, an MTC device, an IoT device, a medical device, a FinTech device (or a financial device), a security device, a weather/environment device, a device related to a 5G service, or a device related to the fourth industrial revolution.

The UE may include, for example, a cellular phone, a smartphone, a laptop computer, a digital broadcast terminal, a personal digital assistant (PDA), a portable multimedia player (PMP), a navigation system, a slate PC, a tablet PC, an ultrabook, a wearable device (e.g., a smartwatch, smartglasses, or a head mounted display (HMD)), and the like. The HMD may be, for example, a type of display device that is worn on the head. For example, the HMD may be used to implement VR, AR, or MR.

The UAV may be, for example, an aircraft without a human being onboard, which aviates by a wireless control signal. The VR device may include, for example, a device for implementing an object or a background of the virtual world. The AR device may include, for example, a device implemented by connecting an object or a background of the virtual world to an object or a background of the real world. The MR device may include, for example, a device implemented by merging an object or a background of the virtual world into an object or a background of the real world. The hologram device may include, for example, a device that implements a stereoscopic image of 360 degrees by recording and reproducing stereoscopic information, using an interference phenomenon of light that is generated by two laser beams meeting each other which is called holography. The public safety device may include, for example, an image relay device or an image device that is wearable on the body of a user. The MTC device and the IoT device may be, for example, devices that do not require direct human intervention or manipulation. For example, the MTC device and the IoT device may include smartmeters, vending machines, thermometers, smartbulbs, door locks, or various sensors. The medical device may be, for example, a device used for the purpose of diagnosing, treating, relieving, curing, or preventing disease. For example, the medical device may be a device used for the purpose of diagnosing, treating, relieving, or correcting injury or impairment. For example, the medical device may be a device used for the purpose of inspecting, replacing, or modifying a structure or a function. For example, the medical device may be a device used to control pregnancy. For example, the medical device may include a device for treatment, a device for operation, a device for (in vitro) diagnosis, a hearing aid, or an operation device. The security device may be, for example, a device installed to prevent a danger that may arise and to maintain safety. For example, the security device may be a camera, a CCTV, a recorder, or a black box. The FinTech device may be, for example, a device capable of providing a financial service such as mobile payment. For example, the FinTech device may include a payment device or a point of sale (POS) system. The weather/environment device may include, for example, a device for monitoring or predicting a weather/environment.

In FIG. 15, one of the communication devices or each communication device may be a wireless communication device configured to transmit/receive radio frequency (RF) signals to/from the external device. Alternatively, one of the communication devices or each communication device in FIG. 15 may include a wireless communication module configured to transmit/receive RF signals to/from the external device. The wireless communication module may be a transceiver. The wireless communication device is not limited to a UE or a B S, and may include any mobile computing device (e.g., a vehicle communication system or device, a wearable device, a laptop, a smartphone, etc.) configured to implement at least one of the implementations of the present disclosure.

In the present disclosure, the communication device may include at least one processor and at least one memory. The processing device including the at least one processor and the at least one memory can be operably connected to the transceiver. The processor can implement functions, procedures, and/or methods described in the present disclosure. When the memory is executed, the memory may store instructions or commands that control the processor to perform operations required to implement the embodiments of the present disclosure. For example, the processor can perform encoding operations and/or decoding operations based on the implementations of the present disclosure.

For convenience of description, it is assumed that the communication device 1100 is the transmitter (Tx device) and the other communication device 1200 is the receiver (Rx device). The memories 1112 and 1212 may store programs for processing and controlling the processors 1111 and 1211, and may temporarily store input/output information. The memories 1112 and 1212 may be used as buffers.

The processors 1111 and 1211 generally control the overall operation of various modules in the Tx device and the Rx device. Especially, the processors 1111 and 1211 may perform various control functions to implement the present disclosure. The processor 1111/1211 may be called one of a controller, a microcontroller, a microprocessor, a microcomputer and the like. The processor 155/180 may be implemented using hardware, firmware, software and/or any combinations thereof. In the implementation by hardware, the processor 1111/1211 may be provided with such a device configured to implement the present disclosure as ASICs (application specific integrated circuits), DSPs (digital signal processors), DSPDs (digital signal processing devices), PLDs (programmable logic devices), FPGAs (field programmable gate arrays), and the like. Meanwhile, in case of implementing the embodiments of the present disclosure using firmware or software, the firmware or software may be configured to include modules, procedures, and/or functions for performing the above-explained functions or operations of the present disclosure. The firmware or software configured to implement the present disclosure is loaded in the processor 1111/12110 or stored in the memory 1112/1212 to be driven by the processor 1111/1211.

The processor 1111 of the Tx device 1110 may perform predetermined coding and modulation for a signal and/or data scheduled to be transmitted to the outside by the processor 1111 or a scheduler connected with the processor 1111, and may then transfer the coded and modulated data to the transceiver 1113. For example, the processor 1111 may convert a data stream to be transmitted into L layers through demultiplexing, channel coding, scrambling, and modulation. The coded data stream is also referred to as a codeword and is equivalent to a transport block (B) which is a data block provided by a media access control (MAC) layer. One transport block (TB) is coded into one codeword and each codeword is transmitted to the Rx device in the form of one or more layers. For frequency up-conversion, the transceiver unit 1113 may include an oscillator. The transceiver 1113 may include $N_t$ (where $N_t$ is a positive integer) transmit antennas.

A signal processing process of the Rx device 1200 is the reverse of the signal processing process of the Tx device 1110. Under control of the processor 21, the transceiver 1213 of the Rx device 1200 receives radio signals transmitted by the Tx device 1100. The transceiver 1213 may include $N_r$ (where $N_r$ is a positive integer) receive (Rx) antennas, and may frequency down-convert each signal received through Rx antennas into a baseband signal. The processor 1211 may decode and demodulate the RF signals received through the receive (Rx) antennas, and may restore data that the Tx device 1110 intended to transmit.

Each of the transceivers 1113 and 1213 may include one or more antennas. Under control of the processors 1111 and 1211, the antenna may perform a function for transmitting signals processed by the transceivers 1113 and 1213 to the outside or a function for receiving RF signals from the outside to transfer the RF signals to the transceivers 1113 and 1213. The antenna may also be called an antenna port. Each antenna may correspond to one physical antenna or may be configured by a combination of more than one physical antenna element. The signal transmitted from each antenna cannot be further deconstructed by the Rx device 1200. A reference signal (RS) transmitted through a corresponding antenna may define an antenna from the view point of the Rx device 1200 and may enable the Rx device 1200 to derive channel estimation for the antenna, irrespective of whether the channel represents a single RF channel from one physical antenna or a composite channel from a plurality of physical antenna elements including the antenna. That is, an antenna is defined such that a channel carrying a symbol of the antenna can be obtained from a channel carrying another symbol of the same antenna. A transceiver supporting a Multiple Input Multiple Output (MIMO) function of transmitting and receiving data using a plurality of antennas may be connected to two or more antennas.

The Tx device 1100 or the processor 1111 thereof may be configured to include the encoder based on the LDPC basegraph depicted in the present disclosure, and the Rx device 1200 or the processor 1211 thereof may be configured to include the decoder based on the LDPC basegraph depicted in the present disclosure.

The functions, steps, and/or methods described in the present disclosure in some scenarios may be implemented by a processing chip. The processing chip may be referred to as a system on chip (SoC), a chipset, or the like. The processing chip may include a processor and a memory, and may be mounted on or connected to the communication device 1100 or 1200. The processing chip may be configured to perform or control any one of the methods, examples described in the present disclosure, or such a method or example may be performed by a communication device in which the processing chip is mounted, installed, or connected. The memory embedded in the processing chip may be configured to store software code or program including instructions that, when executed by the processor or the communication device, enable the processor or communication device to perform some or all of the functions, methods, or examples described in the present disclosure.

The memory in the processing chip may be configured to store or buffer information or data generated by the processor of the processing chip, or may be configured to store or buffer information or data recovered by the processor of the processing chip. One or more processes configured to include transmission or reception of the above information or data can be performed by the processor or can be performed under control of the processor. For example, the processor may transmit a signal including either information or data to the transceiver operably connected to the processing chip. The processor may control the transceiver to transmit RF signals including the information or data. The processor may receive a signal including either information or data from the transceiver operably connected to the processing chip, and may obtain the information or data from the received signal.

Super URLLC (Super Ultra-Reliable and Low-Latency Communication)

Hereinafter, a target use case related to implementations of the present disclosure will be described. Among the use cases of 5G systems, one use case in which reliability and latency are used as a main key performance indicator (KPI) may be associated with URLLC.

Table 10 shows the reliability and latency required for each use case.

TABLE 10

| Use case family | Use case | Payload size | Reliability | Latency |
|---|---|---|---|---|
| Higher reliability and lower latency | Industrial Factory Automation | Typically < 50 bytes | BLER < $10^{-9}$ | From <1 ms to 10 ms |
| | Industrial Process Automation | Typically < 100 bytes | BLER < $10^{-5}$ | 100 ms~ 1 s |
| | Ultra-reliable communications | 200-1521 bytes | BLER < $10^{-5}$ | 1 ms |
| | Remote surgery | | BLER < $10^{-9}$ | 1 ms |
| | V2X | Typically 300 bytes | BLER < $10^{-5}$ | |
| Higher reliability, higher availability and lower latency | Extreme industrial control | 50-100 bytes | BLER < $10^{-9}$ | 1 ms when data rate is relatively low 75 ms for data rate above 20 Mbps |
| | High reliability, high availability, high mobility | | BLER<$10^{-5}$ or higher reliability | |
| Very low latency | Tactile internet | | very high | 1 ms |

In Table 10, it can be seen that a block error rate (BLER) of a reliability level required for industrial factory automation, remote surgery, and extreme industrial control is set to 10-9 or less. The industrial factory automation, the remote surgery, and the extreme industrial control can be directly associated with preservation of human life, so that they can require high reliability and low latency.

Table 11 shows various use cases for URLLC based on the number of UEs to be serviced.

TABLE 11

| Case | # UE | Communications service availability | Transmit period | Packet size | Use case |
|---|---|---|---|---|---|
| I | 20 | 99.9999% to 99.999999% | 0.5 ms | 50 bytes | Motion control and control-to-control use cases |
| II | 50 | 99.9999% to 99.999999% | 1 ms | 40 bytes | Motion control and control-to-control use cases |
| III | 100 | 99.9999% to 99.999999% | 2 ms | 20 bytes | Motion control and control-to-control use cases |
| IV | N/A | 99.9999% | N/A | N/A, but service bit rate from 150 kbit/s to 4.61 Mbits/s | Audio streaming for live performance |

There may be a variety of reliability and latency requirements of the use cases belonging to URLLC. According to Reference [1], Reference [2], and Reference [3], there may be very critical communication applications requiring the target reliability of $10^{-7} \sim 10^{-9}$. Table 10 shows the above-mentioned critical communication applications. Further, in the recent 3GPP meeting, a discussion about whether the use case of the reliability of $10^{-6} \sim 10^{-8}$ can be provided as an NR LDPC code has been started (See Reference [4]), and Table 11 has been used in related discussion.

URLLC use cases requiring such harsh target reliability of $10^{-7} \sim 10^{-9}$ will hereinafter be defined as super URLLC.

LDPC code (NR LDPC code, Reference [5]), that is reflected in the current NR standard, is not sufficient to provide the above-mentioned super URLLC use case, so that channel coding chain enhancement is required. Performance evaluation of the NR LDPC code will hereinafter be described in detail.

NR-LDPC Code Performance Evaluation

Figure 16:
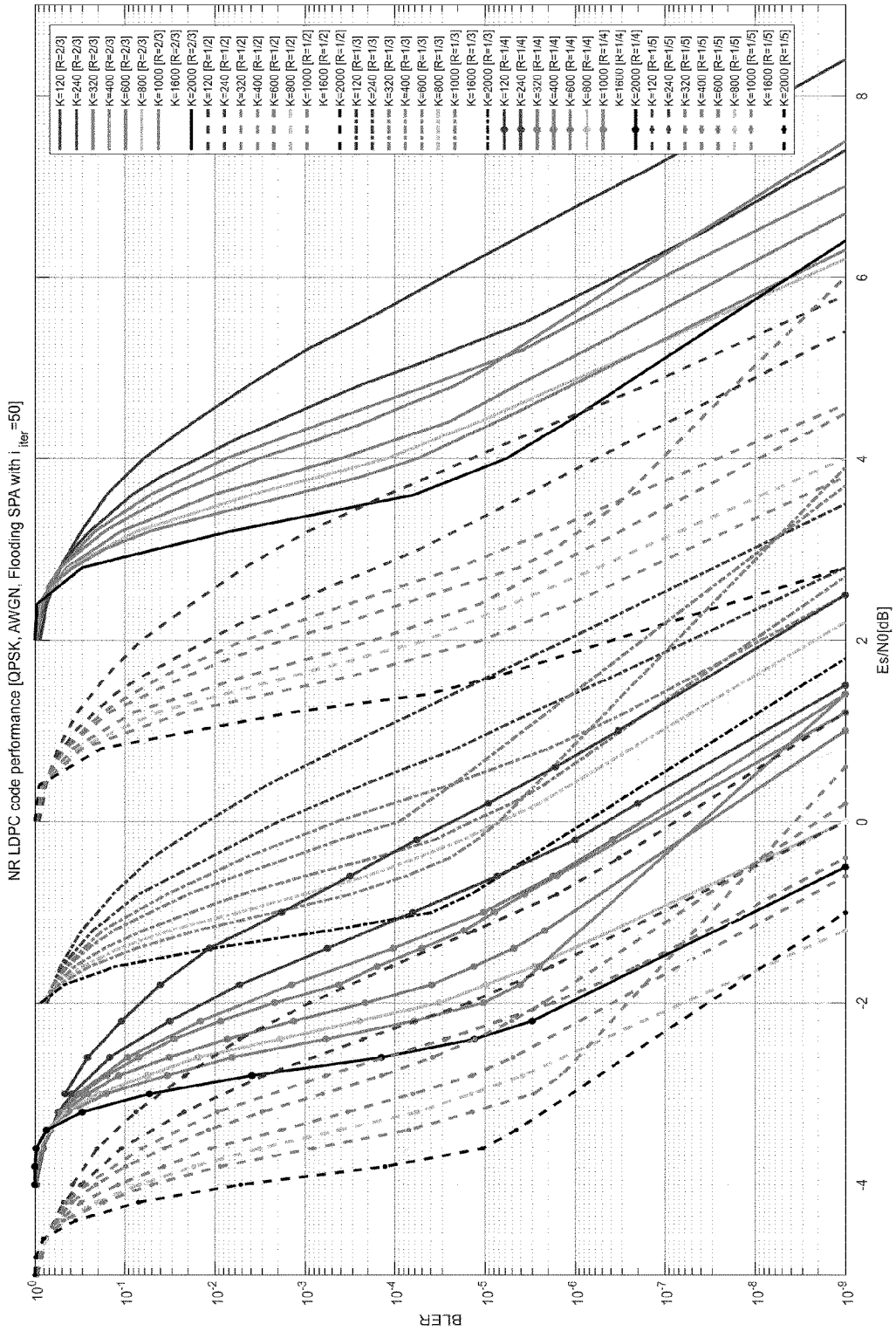
FIG. 16 illustrates the result of performance of additive white Gaussian noise (AWGN) channels of NR LDPC codes.

FIG. 16 illustrates the result of performance of additive white Gaussian noise (AWGN) channels of NR LDPC codes.

In FIG. 16, a vertical axis may represent a block error rate (BLER), a horizontal axis may represent any one of energy, SNR, or SINR for each unit information. In FIG. 16, the horizontal axis may be a parameter related to energy for unit information to be transmitted, so that the horizontal axis can be properly selected as necessary. BLER can be used as a reliability barometer.

FIG. 16 shows the result of performance in an additive white Gaussian noise (AWGN) channel of NR-LDPC code when using the sum-production algorithm decoder configured to assume that a maximum iteration for the information size of 15 bytes~250 bytes (120 bits~2000 bits) and for the code rates 2/3~1/5 is set to 50. In FIG. 16, it is assumed that modulation is set to QPSK.

As the code rate decreases, a better BLER can be achieved with less energy. As the amount of information increases, much more energy may be required to reach the desired BLER. For example, when the code rate (r) is 1/5, the graph is located at the leftmost side. For (r=1/5), as the size of information bits decreases (e.g., K=120 bits), a lower BLER can be achieved with less energy (see the left side on the horizontal axis). In contrast, as the size of information bits increases (e.g., K=2000), much more energy is required to implement the same BLER. The rightmost portion denoted by solid lines shows graphs indicating the relationship between the BLER (when the code rate (r) is 2/3) and the energy per bit (Es/N0).

It can be seen that an error floor has occurred in reliability (e.g., BLER) of $10^{-5}$ or less within almost all of the information sizes and the code rates. In particular, as the information size increases and the code rate decreases (i.e., as the slope of BLER becomes steeper), the error floor phenomenon can be more clearly observed. This is because the NR-LDPC code does not have the linear minimum distance growth (LMDG) property (References [6] to [9]). In this case, the LMDG property may indicate that, as the codeword length increases, the minimum distance linearly increases, and a detailed description of the LMDG property will be given. According to the present NR-LDPC code performance verification, it can be seen that there is a limitation in providing target reliability of $10^{-7} \sim 10^{-9}$. Accordingly, the above-mentioned limitation should be solved. Error floor characteristics indicate original limitations caused by code structures, so that the code design for super URLLC is required to effectively solve the error floor characteristics.

Preliminaries of LDPC Code Design

Figure 17:
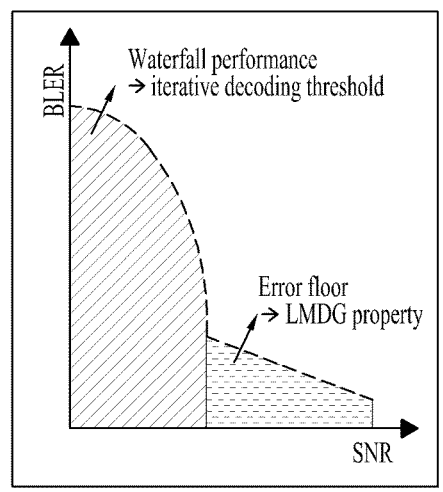
FIG. 17 is a diagram illustrating the performance of LDPC codes according to the present disclosure.

FIG. 17 is a diagram illustrating the performance of LDPC codes according to the present disclosure.

Generally, the performance barometer of the block error rate (BLER) of the LDPC code can be described using a waterfall regime and an error floor regime as shown in FIG. 17. The waterfall regime and the error floor regime may have oppugnant requirements on the degree distribution of parity check matrix (PCM) (References [6], [7], [9], and [10]).

Referring to FIG. 17, the waterfall regime may indicate that the BLER rapidly decreases in response to the increasing SNR. Due to waterfall characteristics, iterative decoding and a threshold may be determined. On the other hand, the error flow characteristics may indicate that, as the SNR increases beyond a threshold, a reduction rate of the BLER decreases. The error flow characteristics can be determined by LMDG characteristics. LDPC code has the waterfall regime and the error flow characteristics. When transmission (Tx) power increases at a low power level, the BLER decreases due to waterfall characteristics. In contrast, in a situation in which Tx power increases beyond a threshold or greater, although Tx power increases, it can be seen that the error flow characteristics indicate that BLER is not improved.

(1) The protograph is obtained, (2) the basegraph is obtained based on the protograph, and (3) the PCM can be obtained in the order of PCM acquisition based on the basegraph. At this time, there may be a variety of methods for acquiring the basegraph based on the protograph (or bipartite graph). In addition, there may be a variety of methods for acquiring the PCM based on the basegraph.

As shown in FIG. 11(b), the protograph can be represented by the edge between check nodes (CNs) and variable nodes (VNs). When the edge is located between the CN and the VN as shown in a (6×12) matrix of FIG. 11(a), the basegraph may indicate a matrix having the value of 1. When the edge is not located between the CN and the VN, the basegraph may indicate a matrix having the value of 0. Specifically, VNs may correspond to columns, respectively, and CNs may correspond to rows, respectively.

Each element (or entry) of the basegraph may have the value of 1 or 0. It is also possible to use the basegraph as the PCM without change. However, in order to use the basegraph as the PCM without change, a considerably large matrix should be designed. Accordingly, after generation of a small basegraph, a method for generating a PCM by lifting the generated basegraph can be used. In this case, according to the result of lifting the basegraph, each element having the value of 0 from among the elements of the basegraph may be changed to a Z×Z zero matrix, and each element having the value of 1 from among the elements of the basegraph is changed to a Z×Z identity matrix, resulting in PCM acquisition. For example, assuming that the basegraph is denoted by an M×N matrix and is then lifted by the lifting factor (Z), the acquired PCM may be denoted by a (Z*M)×(Z*N) matrix.

On the other hand, each element of the basegraph is configured to have the value of 2 or greater. At this time, the value assigned to each element of the basegraph may be set to the degree value of the VN of the lifted M×M matrix. In this case, the degree value of the VN may indicate that, when a certain element of the basegraph has the value of 2 or more, the Z×Z matrix corresponding to the element is not equal to the identity matrix, and a specific value (i.e., 1) not equal to zero (0) in each row has the degree value. In this case, the first lifting (e.g., lifting to the M×M matrix) based on the VN degree value and the second lifting based on the lifting factor (Z) can be performed. For example, when the VN degree value is set to 2, only two of elements included in each column of the generated M×M matrix have the value of 1, and the remaining elements may have the value of 0.

Meanwhile, the respective elements of the basegraph may correspond to integer values from '−1' to 'Z−1'. Based on the corresponding integer value (z), the Z×Z identity matrix that is cyclic-shifted by the value of z may be located at a specific position corresponding to the PCM. If each element of the basegraph has the value of 0, this element may correspond to the integer value of −1, and a Z×Z zero matrix may be located at the position corresponding to the PCM.

In order to satisfy good waterfall characteristics, the following three degree distributions are required.

1) A small number of high-degree variable nodes (VNs) should be present (i.e., columns in PCM).

2) A large number of degree-1 VNs should be present.

3) A predetermined number of degree-2 VNs should be present (see Reference [1])

However, linear block code having the above-mentioned degree distribution characteristics does not satisfy LMDG characteristics, so that the linear block code is vulnerable to the error floor (see Reference [9], and Reference [10]).

In contrast, in order to implement the error floor characteristics (i.e., in order to satisfy MDG characteristics), the following degree distribution characteristics 1), 2), and 3) should be required.

1) The degree of all VNs may be set to 3 or more (see Reference [6]).

2) Each information VN may be repeated at least three times (i.e., the degree of information VN is set to at least 3), two or more accumulators are coupled in series to each other to generate a parity (this means that VNs each having the degree of 3 or more and other VNs each having the degree of 2 are mixed in terms of PCM) (see Reference [8]).

3) If the plurality of accumulators is recursively constructed in a manner that partial parities serially pass through the accumulators (see Reference [9]), it is impossible to satisfy LMDG characteristics.

However, the above-mentioned structures 1) to 3) may have the following disadvantages.

The Method 1) has disadvantages in that, since all VNs have the degree of 3 or more, the PCM can be encoded using the dense generator matrix only, resulting in a very high encoding complexity (see Reference [11]).

The Method 2) has disadvantages in that the waterfall performance is greatly reduced.

The Method 3) has disadvantages in that, whereas LMDG characteristics are satisfied, typical minimum distance characteristics are relatively reduced, so that it is difficult to guarantee the error floor free at a target reliability of $10^{-7} \sim 10^{-9}$ of the super URLLC use case (see Reference [9]).

In order to support the super URLLC use case, a new PCM design can be required with the following requirements, i.e., (1) guarantee of comparable waterfall performance, (2) error-flow-free characteristics, and (3) efficient encoding. A method for designing the PCM satisfying the above three characteristics, and the efficient encoding method will hereinafter be described.

The following description will describe (1) a high-level structure of the parity check matrix (PCM), (2) details of the structure of the kernel part in the PCM, (3) a method for encoding the PCM, and (4) examples and performance verification. Accordingly, the following notations can be defined.

A regular character may represent a scalar, a bold lower-case character may represent a vector, a bold uppercase character may represent a matrix, and a Calligraphic character may represent a set. For example, x, x, X, and $\mathcal{X}$ may denote a scalar, a vector, a matrix, and aggregation set, respectively. 'w(U)' may represent a column weight vector of a binary matrix U, and 'min(x)' may represent a minimum value of a vector x. $[A]_{i,j}$ may represent an element that is located at the i-th row and the j-th column of the matrix A. In addition, $I_Z^i$ for $i \in \{0, \ldots, Z-1\}$ may indicate that the Z×Z identity matrix is left-circularly shifted by the value of i, $I_Z^{-1}$ may represent the Z×Z all-zero matrix, and $\bar{I}_Z^i$ may represent a matrix obtained when one bit of the first row of the $I_Z^i$ is masked. Finally, $A_Z$ may represent a Z×Z all-one lower triangular matrix.

High-Level Basegraph Structure

The present disclosure provides a high-level basegraph structure. Generally, a kernel (i.e., highest code rate part) part design of the basegraph is important to the rate-compatible structure. This is because the kernel part design is the most important core capable of deciding the waterfall performance and error floor characteristics. In addition, the degree-1 structure (i.e., raptor-like code) can be used as a general extension method, and the degree-1 structure is greatly helpful to improve the waterfall performance. However, the degree-1 structure has difficulty in improving the minimum distance, so that the present disclosure proposes the following two access methods.

Figure 18:
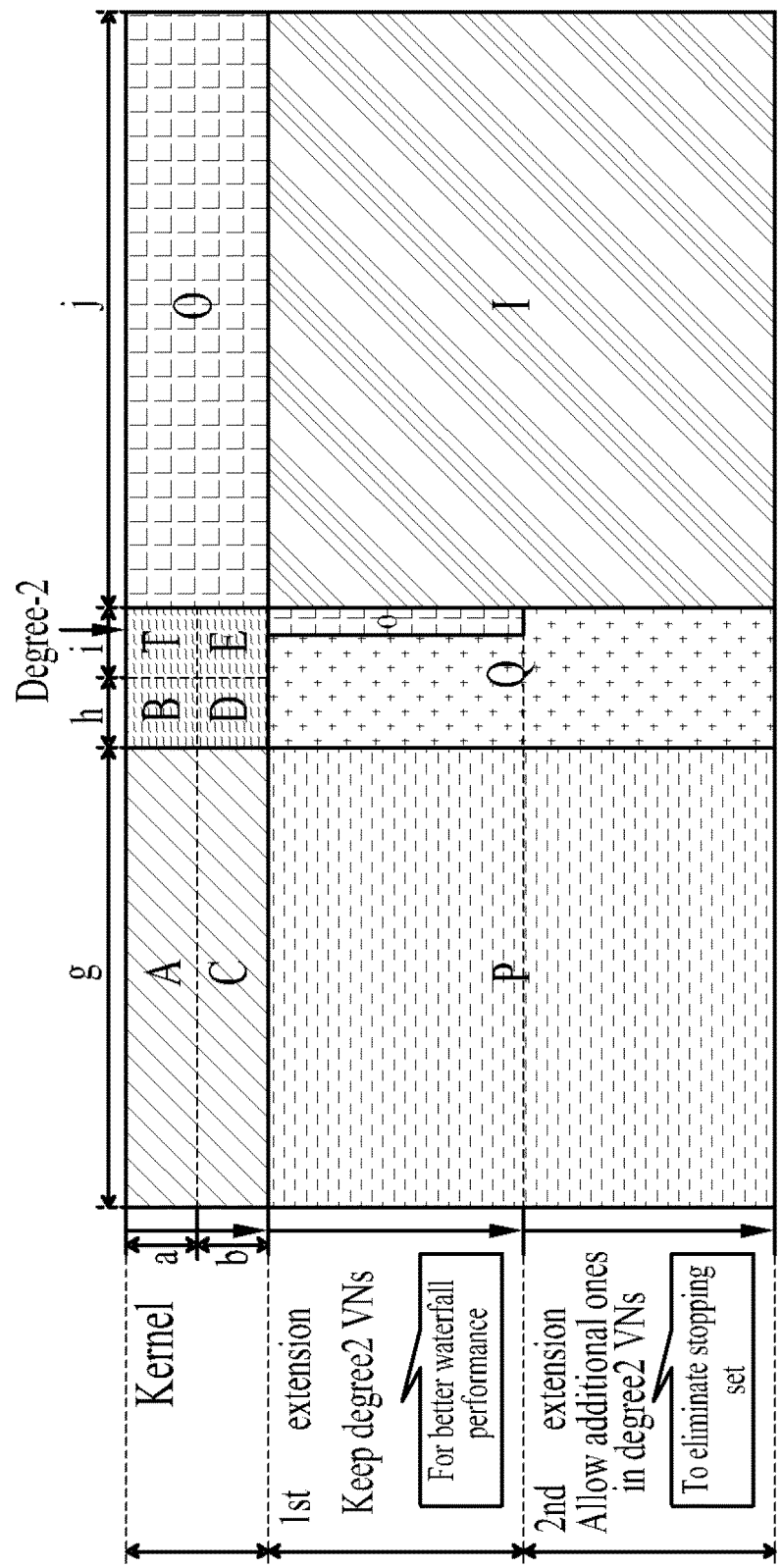
FIG. 18 is a conceptual diagram illustrating an access method based on a high-level basegraph structure according to one aspect of the present disclosure.

FIG. 18 is a conceptual diagram illustrating an access method based on the high-level basegraph structure according to one aspect of the present disclosure.

Generally, the Richardson-Urbanke (RU) encoding method (see Reference [12]) can be used as the efficient encoding method of LDPC codes. A detailed description thereof will be given. The method of FIG. 18 may be referred to as 'Alt. 1' method. When the kernel is designed, the parity part columns (i.e., VNs) may be comprised of degree-2 and degree-3. In the case of $1^{st}$ extension, the degree-1 extension may be carried out in a specific condition where '1' is not located at some parts of the degree-2 columns. This is because the degree-2 VNs included in the degree distribution are beneficial to waterfall performance. It is possible for the value of 1 to be located at the degree-2 columns that are restricted in $2^{nd}$ extension. This is because the degree-2 VN portion on the degree distribution becomes significantly reduced in size, so that the waterfall performance can be less affected. Therefore, since '1' is located at the corresponding columns, the influence of the stopping set is reduced, resulting in improvement in BLER performance.

Figure 19:
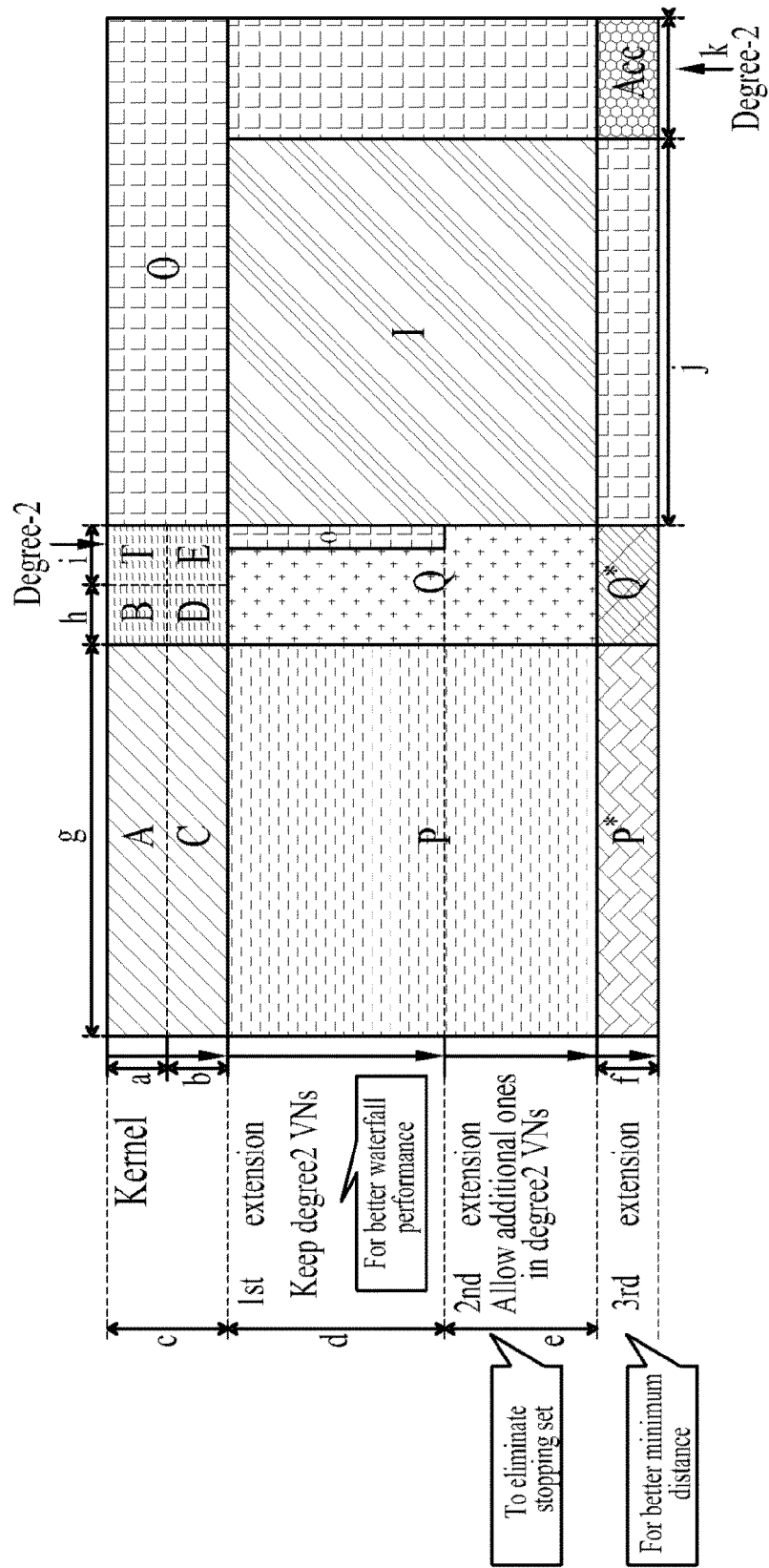
FIG. 19 is a conceptual diagram illustrating an access method based on a high-level basegraph structure according to another aspect of the present disclosure.

FIG. 19 is a conceptual diagram illustrating an access method based on a high-level basegraph structure according to another aspect of the present disclosure.

The method of FIG. 19 may be referred to as 'Alt. 2' method. The Alt. 2 method can be achieved by additionally applying $3^{rd}$ extension to the Alt. 1 method. As described above, since the degree-1 structure does not have a great help in improving the minimum distance, extension based on the degree-2 accumulator is performed to address this issue, and the value of 1 is located at some parts of the information part column and at some parts of the parity part column of the kernel part. From the standpoint of the encoder, since repetition of information increases and the parity of the kernel part is recursively used, the processed result can be helpful to improve the distance in a similar way to an accumulate repeat accumulate check accumulate (ARACA) code (see Reference [9]).

Kernel Structure of PCM

Figure 20:
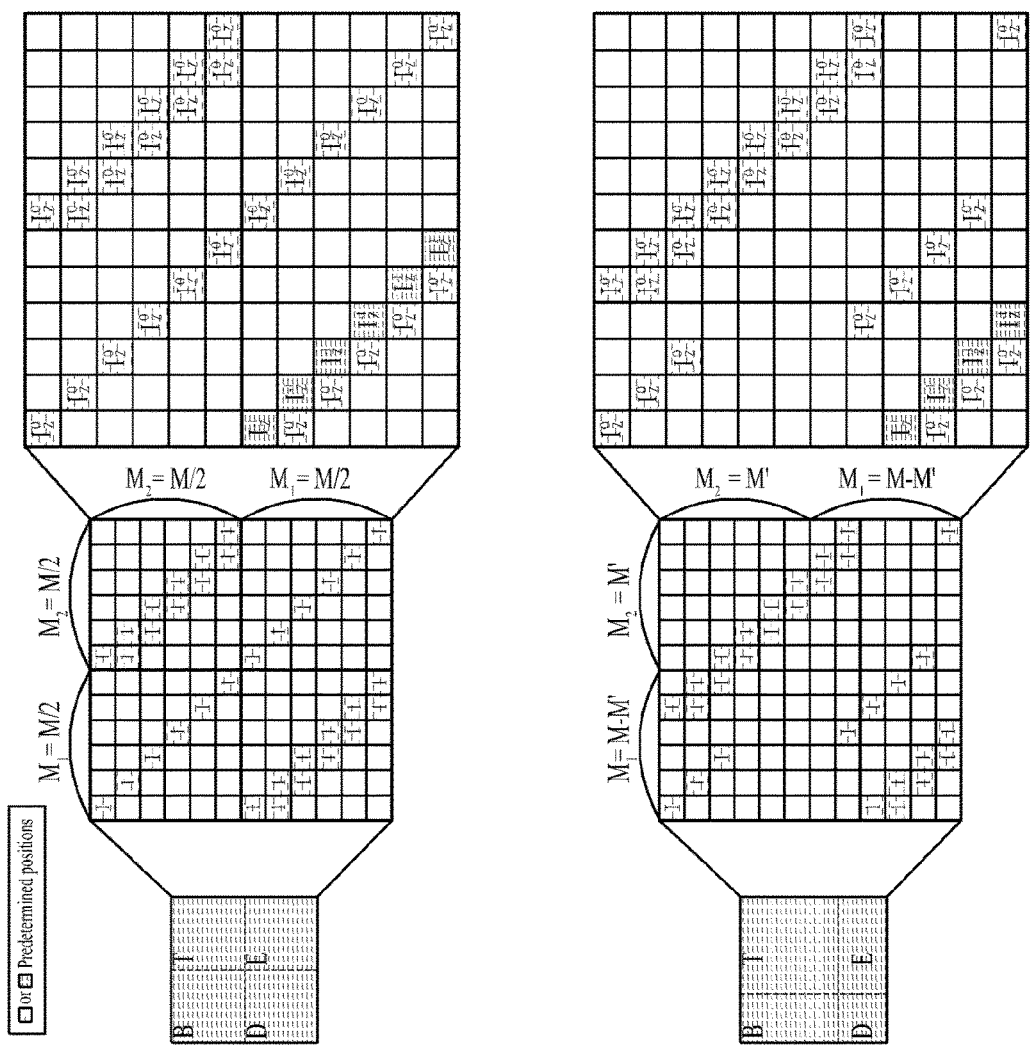
FIG. 20 is a conceptual diagram illustrating a QC-LDPC basegraph and a method for acquiring a parity check matrix (PCM) by lifting the basegraph according to the present disclosure.

FIG. 20 is a conceptual diagram illustrating a QC-LDPC basegraph and a method for acquiring a parity check matrix (PCM) by lifting the basegraph according to the present disclosure.

According to the present disclosure, in order to efficiently process RU encoding, the basegraph of QC-LDPC is designed. A quasi-cyclic (QC) LDPC code will hereinafter be described. PCM H of the QC-LDPC code may be formed by lifting the basegraph $\overline{H}$ (i.e., binary adjacent matrix) to a Z×Z all zero matrix or a (Z×Z) left-cyclic shifted identity matrix. That is, '1' or '0' from among elements of ($M_b \times (M_b+K_b)$ basegraph $\overline{H}$) may be converted into a Z×Z all zero matrix or a Z×Z left-cyclic shifted identity matrix of the ($Z^*M_b)\times(Z^*(M_b+K_b)$) PCM H.

In general, RU encoding method can be used for encoding the LDPC code efficiently. In order to apply the RU encoding method, the base graph $\overline{H}$ of the corresponding kernel structure can be segmented into 6 parts ($\overline{A}, \overline{B}, \overline{C}, \overline{D}, \overline{E}, \overline{T}$) as shown in the following equation. That is, $\overline{H}$ may include submatrices ($\overline{A}, \overline{B}, \overline{C}, \overline{D}, \overline{E}, \overline{T}$).

$$\overline{H} = [\overline{H}_1 \ \overline{H}_2] = \begin{bmatrix} \overline{A} & \overline{B} & \overline{T} \\ \overline{C} & \overline{D} & \overline{E} \end{bmatrix}, \quad \text{[Equation 5]}$$

In Equation 5, $\overline{A}$ is an ($M'_b \times K_b$) matrix, $\overline{C}$ is an ($M_b-M'_b)\times K_b$ matrix, $\overline{B}$ is an $M'_b \times (M_b-M'_b)$ matrix, $\overline{D}$ is an ($M_b-M'_b)\times(M_b-M'_b)$ matrix, $\overline{T}$ is an $M'_b \times M'_b$ matrix, $\overline{E}$ is an ($M_b-M'_b)\times M'_b$ matrix, and $K_b$ is an information size in the basegraph. $\overline{A}, \overline{C}$ may represent submatrices, each of which includes columns corresponding to information. The remaining four parts ($\overline{B}, \overline{D}, \overline{T}, \overline{E}$) may represent submatrices, each of which includes columns corresponding to the parity. The kernel structure proposed by the present disclosure has a special structure, so that the kernel structure can satisfy LMDG characteristics and can perform efficient encoding. In order to satisfy LMDG characteristics, the submatrix $\overline{H}_1$ corresponding to the information part has the following conditions.

$$\min(w(\overline{H}_1)) \geq 3, \quad \text{[Equation 6]}$$

From among $\overline{B}, \overline{D}, \overline{T}, \overline{E}$, each of $\overline{D}$ and $\overline{T}$ is always a square matrix, $M'_b$ may be equal to or higher than $M_b-M'_b$. In this case, the structure of $\overline{B}, \overline{D}, \overline{T}, \overline{E}$ can be represented by the following equation 7.

$$[\overline{B}]_{i,j} = \begin{cases} 1, \text{ if } j = i \text{ for } i = 1, \ldots, M_b - M'_b - 1, \\ 1, \text{ elseif } j = M'_b, i = M_b - M'_b, \\ 0, \text{ else,} \end{cases} \quad \text{[Equation 7]}$$

That is, the last column of $\overline{B}$ is '1', when the row and the column have the same index, the remaining columns other than the last column of $\overline{B}$ are configured in a manner that the element of B is set to 1 and the remaining elements other than the element (B) are set to zero '0'. In the case of $[\overline{B}]_{1,1}$, $[\overline{B}]_{2,2}, [\overline{B}]_{3,3}, \ldots$, the element is 1, and most of the elements are '0'.

$$[\overline{D}]_{i,j} = \begin{cases} 1, \text{ if } j = i \text{ for } i = 1, \ldots, M_b - M'_b, \\ 1, \text{ elseif } j = i - 1 \text{ for } i = 2, \ldots, M_b - M'_b, \\ 0, \text{ else,} \end{cases} \quad \text{[Equation 8]}$$

In Equation 8, $\overline{D}$ is a square dual diagonal matrix.

That is, all diagonal elements included in the matrix ($\overline{D}$) are 1, and other elements located below one row of the diagonal elements having the value of 1 are also '1'.

$$[\overline{T}]_{i,j} = \begin{cases} 1, \text{ if } j = i \text{ or } i - 1 \text{ for } i = 1, \ldots, M'_b, \\ 0, \text{ else,} \end{cases} \quad \text{[Equation 9]}$$

$\overline{T}$ is a square dual diagonal matrix.

That is, all diagonal elements included in the matrix ($\overline{T}$) are 1, and other elements located below one row of the diagonal elements having the value of 1 are also '1'.

As described above, $\overline{T}$ is a dual diagonal matrix, a dual diagonal matrix is a lower triangular matrix, and an inverse matrix of the lower triangle matrix is a lower triangular matrix. In more detail, the inverse matrix of the dual diagonal matrix is a matrix in which all of elements (or entries) corresponding to a lower triangle part of the lower triangle matrix are set to '1'. For example, if $$T = \begin{bmatrix} 1 & 0 & 0 & 0 \\ 1 & 1 & 0 & 0 \\ 0 & 1 & 1 & 0 \\ 0 & 0 & 1 & 1 \end{bmatrix}, T^{-1} = \begin{bmatrix} 1 & 0 & 0 & 0 \\ 1 & 1 & 0 & 0 \\ 1 & 1 & 1 & 0 \\ 1 & 1 & 1 & 1 \end{bmatrix}$$

can be achieved. During LDPC coding, ($T^{-1}$) may be used for encoding, and T may be used for decoding. In a general matrix equation, an inverse matrix of a sparse matrix may be dense, and an inverse matrix of the dense inverse matrix may be sparse. Generally, it is obvious to those skilled in the art that the dense matrix has high computational complexity. In this example, the dual diagonal matrix has sparse characteristics, and the inverse matrix (i.e., a lower triangular matrix in which all of lower triangular parts are '1') of the dual diagonal matrix has dense characteristics. However, although ($T^{-1}$) is a dense matrix, the vector elements are accumulated, so that the matrix ($T^{-1}$) can be easily calculated. As a result, the matrix ($T^{-1}$) can be calculated with low computational complexity without using matrix calculation. For example, if the vector multiplied by the matrix is (a1, a2, a3, a4), $$\begin{bmatrix} b1 \\ b2 \\ b3 \\ b4 \end{bmatrix} = \begin{bmatrix} 1 & 0 & 0 & 0 \\ 1 & 1 & 0 & 0 \\ 1 & 1 & 1 & 0 \\ 1 & 1 & 1 & 1 \end{bmatrix} \begin{bmatrix} a1 \\ a2 \\ a3 \\ a4 \end{bmatrix}$$

is achieved, and "b1=a1, b2=a1 ◆ a2, b3=a1 ◆ a2 ◆ a3, b4=a1 ◆ a2 ◆ a3 ◆ a4" can also be achieved (or accumulated), where ◆ may represent the exclusive-OR operation. According to the present disclosure, although the operation result is represented by a matrix calculation, the matrix calculation can be replaced with the accumulation calculation. That is, since the inverse matrix of the dual diagonal matrix is a lower triangular matrix, calculation complexity can be greatly reduced using the accumulation calculation instead of the matrix calculation.

However, when the part (T) of the basegraph is a dual diagonal matrix, the PCM part (i.e., T) corresponding to the dual diagonal matrix is not identical to the dual diagonal matrix, so that the inverse matrix ($T^{-1}$) of the corresponding PCM part (T) is not identical to a lower triangular matrix in which all of the elements of the lower triangular part are '1'. However, by means of the characteristics of the matrix calculation, it is possible to perform calculation including the inverse matrix ($T^{-1}$) according to a relatively lower computational complexity. Specifically, the element '1' of the M2×M2 matrix $\overline{T}$ may be converted into a (Z×Z) identity submatrix (I) at the position corresponding to the (Z*M2)×(Z*M2) matrix (T), and the part '1' in $\overline{T}^{-1}$ (i.e., the matrix in which all of elements belonging to the lower triangular part are '1') may be converted into a Z×Z identity submatrix (I) at the position corresponding to the matrix ($T^{-1}$).

On the other hand, due to high dense characteristics of the matrix ($T^{-1}$), the VN degree may increase, so that the error floor characteristics are improved. As described above, by the matrix ($T^{-1}$), the error floor characteristics are improved, and at the same time calculation complexity can be reduced due to the special structure of the matrix ($T^{-1}$), resulting in improvement in coding efficiency.

$$[\overline{E}]_{i,j} = \begin{cases} 1, & \text{if } j = i \text{ for } i = 1, \ldots, M_b' - 1, \\ 1, & \text{elseif } j = M_b', i = M_b - M_b', \\ 0, & \text{else,} \end{cases} \quad [\text{Equation 10}]$$

The submatrices $\overline{B}, \overline{D}, \overline{T}, \overline{E}$ of the above-mentioned basegraph may perform PCM construction as shown in the following equations. Generally, the submatrices $\overline{B}, \overline{D}, \overline{T}, \overline{E}$ are lifted using the lifting factor Z, so that B, D, T, and E can be obtained.

$$[B]_{i,j} = \begin{cases} I_z^0, & \text{if } j = i \text{ for } i = 1, \ldots, M_b - M_b' - 1, \\ I_z^0, & \text{elseif } j = M_b', i = M_b - M_b', \\ I_z^{-1}, & \text{else,} \end{cases} \quad [\text{Equation 11}]$$

$$[D]_{i,j} = \begin{cases} I_z^1, & \text{if } j = i \text{ for } i = 1, \ldots, M_b - M_b', \\ I_z^0, & \text{elseif } j = i - 1 \text{ for } i = 2, \ldots, M_b - M_b', \\ I_z^{-1}, & \text{else,} \end{cases} \quad [\text{Equation 12}]$$

Unlike the following part (T), in the case of 'D', the element having the value of '1' in a first row of the lifted Z×Z left-cyclic shifted identity matrix may be masked so that the calculation result is changed to zero '0'.

$$[T]_{i,j} = \begin{cases} I_z^0, & \text{if } j = i \text{ or } i - 1 \text{ for } i = 1, \ldots, M_b', \\ I_z^{-1}, & \text{else,} \end{cases} \quad [\text{Equation 13}]$$

$$[E]_{i,j} = \begin{cases} I_z^0, & \text{if } j = i \text{ for } i = 1, \ldots, M_b' - 1, \\ I_z^0, & \text{elseif } j = M_b', i = M_b - M_b', \\ I_z^{-1}, & \text{else,} \end{cases} \quad [\text{Equation 14}]$$

Proposed Encoding Method

Based on the RU encoding scheme of the present disclosure, the kernel part can be encoded. In a general RU encoding method, PCM H can be largely segmented into $$\begin{bmatrix} A & B & T \\ C & D & E \end{bmatrix}.$$

The RU encoding scheme can be implemented using the following equations.

$$HX = 0, \quad [\text{Equation 15}]$$

$$\rightarrow \begin{bmatrix} A & B & T \\ C & D & E \end{bmatrix} \begin{bmatrix} s \\ p_1 \\ p_2 \end{bmatrix} = 0,$$

$$\rightarrow \begin{bmatrix} As + Bp_1 + Tp_2 \\ Cs + Dp_1 + Ep_2 \end{bmatrix} = 0,$$

$$\rightarrow \begin{bmatrix} ET^{-1}As + ET^{-1}Bp_1 + Ep_2 \\ Cs + Dp_1 + Ep_2 \end{bmatrix} = 0,$$

As can be seen from Equation 15, the parity sequence vector $p_i (i \in \{1,2\})$ can be represented by the following equations.

$$p_1 = \phi^{-1}(ET^{-1}A + C)s \text{ where } \phi = ET^{-1}B + D \quad [\text{Equation 16}]$$

$$p_2 = T^{-1}As + T^{-1}Bp_1 \quad [\text{Equation 17}]$$

PCM H may be a low density matrix, so that six submatrices (A, C, B, D, T, E) may also have a low density. In general, the inverse matrix form of the low density matrix other than the degree-1 matrix may be a high density matrix. Although $\varphi^{-1}$ and $T^{-1}$ in Equations 16 and 17 are also dense matrices, it is necessary to search for a special-structured PCM to efficiently implement LDCP encoding. As described above, when B, D, T, and E are constructed using the RU encoding method, $T^{-1}$ and $\varphi^{-1}$ may always be represented by the following equations.

$$T^{-1} = \begin{bmatrix} I_z^0 & I_z^{-1} & I_z^{-1} & I_z^{-1} \\ & & \cdots & \\ I_z^0 & I_z^0 & I_z^{-1} & I_z^{-1} \\ \vdots & & \ddots & \vdots \\ I_z^0 & I_z^0 & I_z^0 & I_z^{-1} \\ & & \cdots & \\ I_z^0 & I_z^0 & I_z^0 & I_z^0 \end{bmatrix} \quad \text{[Equation 18]}$$

$$\phi^{-1} = \begin{bmatrix} A_z & & I_z^{-1} & I_z^{-1} & I_z^{-1} \\ & & \cdots & & \\ (A_z)^2 & & A_z & I_z^{-1} & I_z^{-1} \\ \vdots & & & \ddots & \vdots \\ (A_z)^{M_b - M_b' - 1} & (A_z)^{M_b - M_b' - 2} & & A_z & I_z^{-1} \\ & & \cdots & & \\ (A_z)^{M_b - M_b'} & (A_z)^{M_b - M_b' - 1} & & (A_z)^2 & A_z \end{bmatrix} \quad \text{[Equation 19]}$$

FIG. 21 is a conceptual diagram illustrating a method for efficiently implementing the inverse matrix ($T^{-1}$) of the matrix (T) and the inverse matrix ($\varphi^{-1}$) of the matrix ($\varphi$).

Referring to FIG. 21, matrix multiplication (i.e., a matrix product) of the inverse matrix ($T^{-1}$) can be processed by simple vector element-wise accumulation, and matrix multiplication (i.e., a matrix product) of the inverse matrix ($\varphi^{-1}$) can be easily processed based on bit-accumulation and vector element-wise accumulation.

The encoding of the parity part (i.e., submatrix O and submatrix I in FIG. 18) corresponding to the degree-1 VNs after lapse of the kernel part can be performed using simple exclusive-OR operation by the parity encoding method, as represented by the following equation 20.

$$HX = 0, \rightarrow [H_1 \; I]\begin{bmatrix} s \\ p \end{bmatrix} = 0, \quad \text{[Equation 20]}$$

In Equation 20, $H_1$ and I may represent a predetermined codeword and a submatrix corresponding to the degree-1 VN, respectively. Generally, the submatrix corresponding to the degree-1 VN may be an identity matrix. Therefore, the parity sequence vector (p) can be represented by $p=H_1 s$ based on Equation 20.

3-D. Description of Exemplary PCM and Performance Evaluation

FIGS. 22A, 22B, 23A, and 23B are diagrams illustrating examples of a parity check matrix (PCM) for use in a QC LDPC coding method according to the present disclosure.

Figures 22A, 22B:
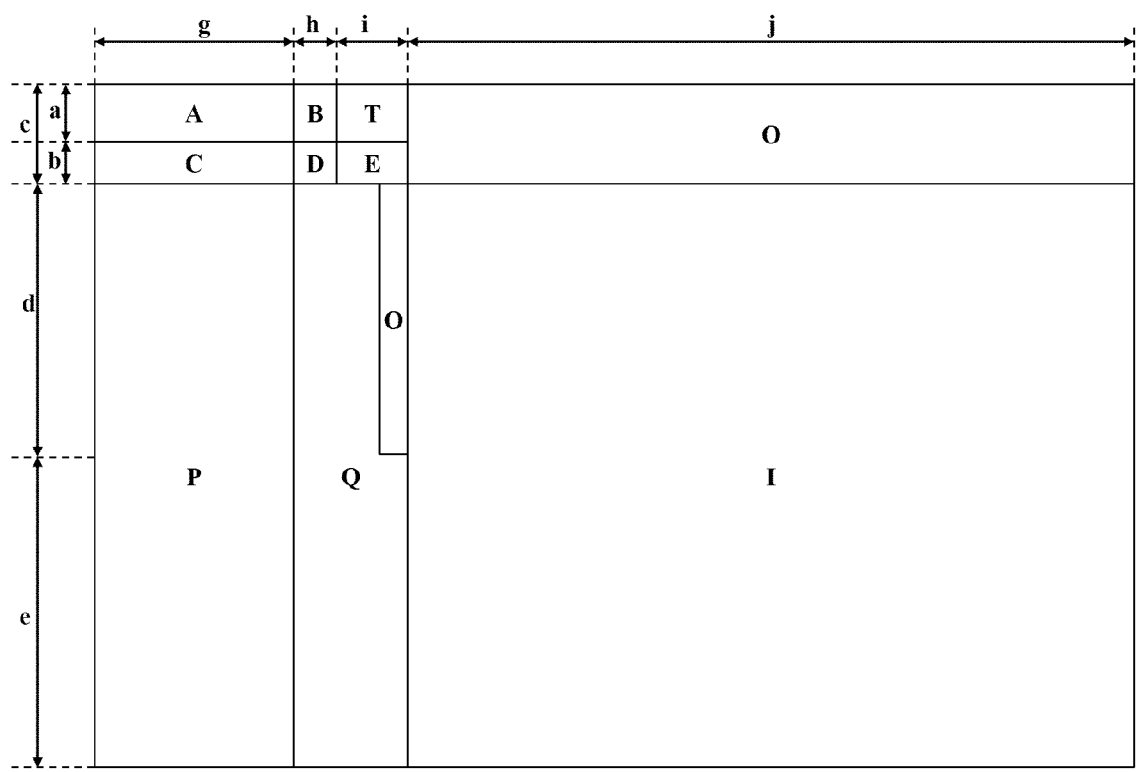
FIGS. 22A, 22B, 23A, and 23B are diagrams illustrating examples of a parity check matrix (PCM) for use in a QC LDPC coding method according to the present disclosure.
Figures 23A, 23B:
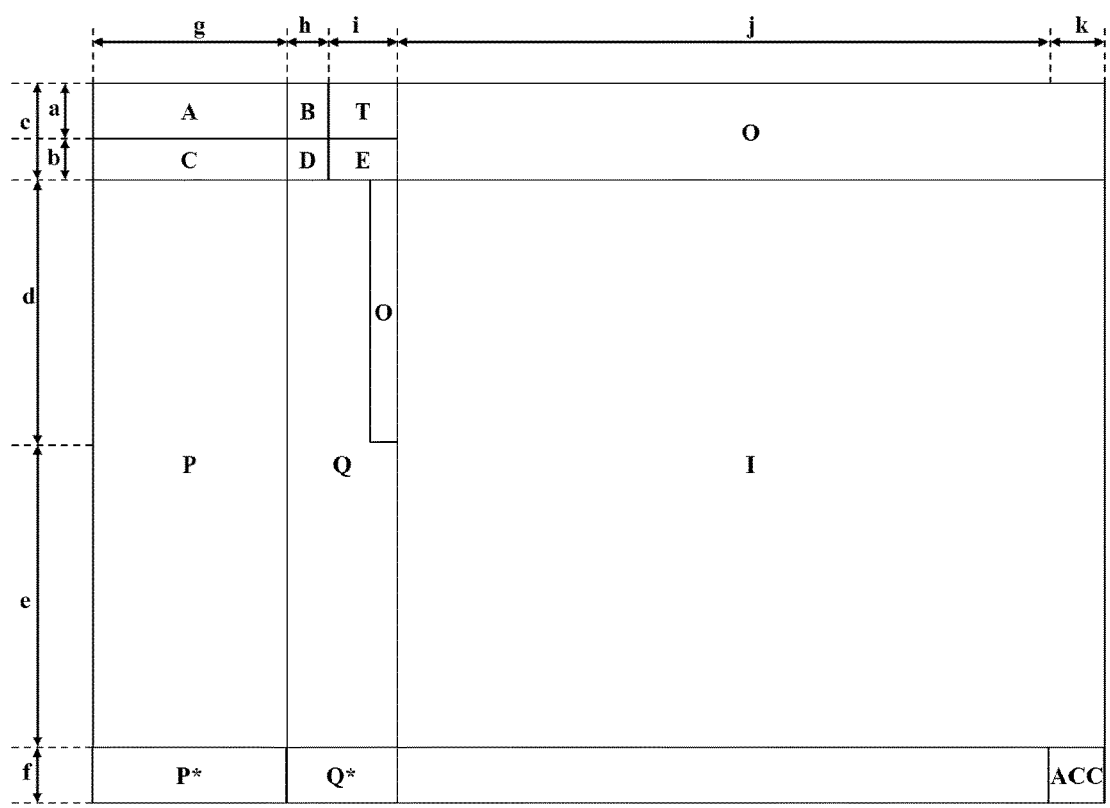

Specifically, FIGS. 22A and 22B illustrate PCM to which first extension of FIG. 18 is applied and PCM to which second extension of FIG. 18 is applied, respectively. FIGS. 23A and 23B illustrate PCMs to which first extension, second extension, and third extension of FIG. 19 are applied.

FIGS. 22 and 23 illustrate examples of PCMs that are found through PEXIT chart analysis (see Reference [13]). PCM of FIG. 22 and PCM of FIG. 23 are distinguished from each other according to whether third extension is applied to the last four rows. The structure of FIG. 22 may be obtained through application of the basegraph structure of FIG. 18, and the structure of FIG. 23 may be obtained through application of the basegraph structure of FIG. 19.

Figure 24:
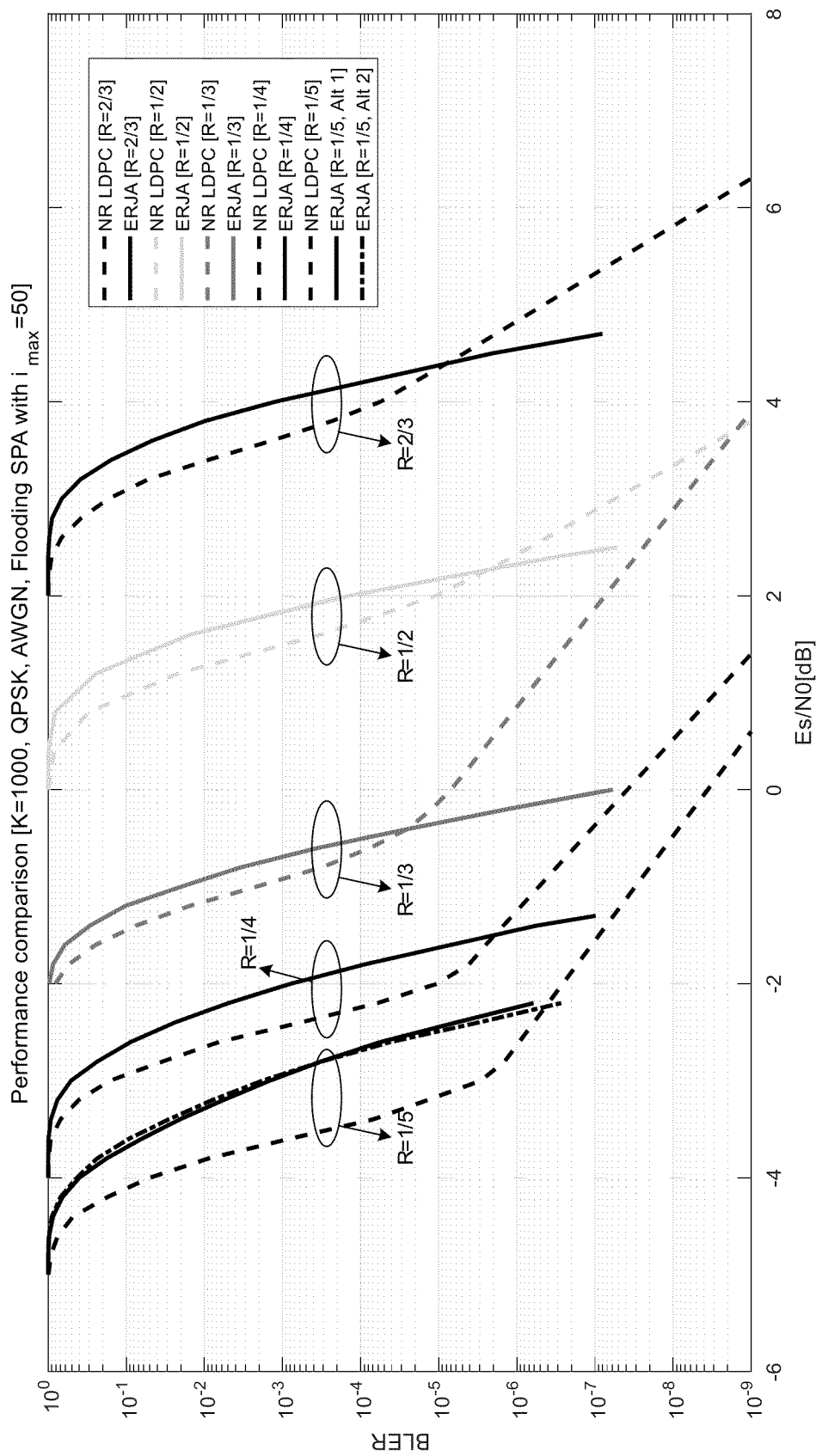
FIG. 24 is a graph illustrating the result of comparison between an LDPC coding method and an NR LDPC coding method according to the present disclosure.

FIG. 24 is a graph illustrating the result of comparison between the LDPC coding method and the NR LDPC coding method according to the present disclosure.

FIG. 24 shows the result of comparison in performance between the NR-LDPC coding method and the LDPC coding method for use in the additive white Gaussian noise (AWGN) channel of the NR-LDPC code, when the sum-production algorithm decoder configured to assume that a maximum number of iterations is set to 50 in association with the code rates 2/3~1/5 for K=1000 bits is used. For all code rates, under the limitation condition of the reliability of $10^{-7}$, it can be seen that the LDPC coding method has better performance than the NR LDPC coding method. It can be confirmed that the LDPC coding method has no error floors.

UE/BS Operations

When the PCM basegraph of the present disclosure is denoted by Tables 5 and 6 (Basegraph 1 of 3GPP 38.212) or Tables 7 and 8 (Basegraph 2 of 3GPP 38.212), the UE and BS operations can be described as follows.

For a given code block, a bit stream to be input to the channel coding is represented by $c_0, c_1, c_2, \ldots, c_{K-1}$. Here, K is the number of input bits to be encoded. After execution of such encoding, the bits are denoted by $d_0, d_1, d_2, \ldots, d_{N-1}$. For the LDPC basegraph, $N=N_{BG}^{max} Z_c$ is satisfied. In this case, $N_{BG}^{max}$ may represent a maximum number of columns of the given basegraph, and $Z_c$ may represent the size of a circular matrix.

For the code block encoded by LDPC in a mobile device (or base station BS), the following encoding procedure can be used. The following table shows an example for describing the encoding procedure to be performed by the LDPC coding method.

K: The number of input bits, N: The number of encoded output bits

Zc: Lifting vector (the size of circular matrix)

$N_{BG}^P$: The number of punctured columns from among columns of the given basegraph $N_{BG}^P * Z_c$: The number of punctured bits from among systematic bits $$N = N_{BG}^{max} * Z_C$$

TABLE 12

1) Find the set index $i_{Ls}$ in a first table which contains $Z_c$.
2) for k = $N_{BG}^P Z_c$ to K − 1
  if $c_k \neq < \text{NULL} >$ $d_{k-N_{BG}^P Z_c} = c_k;$ Else $c_k = 0; d_{k-N_{BG}^P Z_c} = < NULL >;$ end if
end for
3) Generate
    N + $N_{BG}^P Z_c$ − K parity bits $$w = \begin{bmatrix} w_0, w_1, w_2, \ldots w_{N+N_{BG}^P Z_c - K - 1} \end{bmatrix}^T$$

such that $H \times \begin{bmatrix} c \\ w \end{bmatrix} = 0,$ where $c = [c_0, c_1, c_2, \ldots, c_{K-1}]^T;$
  0 (zero matrix) is a column vector of all elements equal to 0.
The encoding is performed in GF(2).
The matrix H is obtained by replacing each element of $H_{BG}$
  with a $Z_c \times Z_c$ matrix, according to the following:
  - Each element of value 0 in $H_{BG}$ is replaced
    by a $Z_c \times Z_c$ all zero;

TABLE 12-continued

- Each element of value 1 in $H_{BG}$ is replaced
   by a circular permutation matrix $I(P_{i,j})$ of size $Z_c \times Z_c$,
   where i and j are the row and column indices
   of the element, and
   $I(P_{i,j})$ is obtained by circularly shifting the identity matrix I
   of size $Z_c \times Z_c$ to the right $P_{i,j}$ times.
   The value of $P_{i,j}$ is given by $P_{i,j} = \mod(V_{i,j}, Z_c)$.
   The value of $V_{i,j}$ is similarly given by a second table
   according to the set index $i_{LS}$ and base graph.
4) for $k = K$ to $N + N_{BG}^p Z_c - 1$ $$d_{k-N_{BG}^p Z_c} = w_{k-K};$$

end for

Table 12 shows that the number of bits to be punctured can be changed to another number as compared to the detailed description of FIG. 13. Referring to the detailed description of FIG. 13, although the number of bits to be punctured from among the information parts is denoted by $2Z_c$, the number of bits to be punctured is denoted by $N_{BG}^p * Z_c$ as shown in Table 12. The kernel structure of the 5G-NR LDPC code is different from the kernel structure of the LDPC code of the present disclosure, so that the number of punctured bits in the 5G-NR LDPC code may also be different from the number of punctured bits in the LDPC code of the present disclosure.

Referring to Table 12, $i_{LS}$ may be obtained based on a first table. The first table may be similar in shape to Table 9.

$V_{i,j}$ can be obtained based on a second table. The second table may be identical in shape to Tables 5 and 6 related to BG1 of the 3GPP TS 38.212 LDPC code. The second table may be identical in shape to Tables 7 and 8 related to BG2 of the 3GPP TS 38.212 LDPC code.

Although Table 1 and Table 2 may use Tables related to LDPC code of 3GPP TS 38.212, the scope of Tables 1 and 2 is not limited to the tables related to LDPC code of 3GPP TS 38.212. The table suitable for the LDPC code can be defined and used as necessary.

As a subclass of the protograph-based low-density parity check codes, a new Structured Repeat Jagged Accumulate (SRJA) code is proposed.

By a special structure of the basegraph and the parity part of the parity check matrix (PCM), the main characteristics of the SRJA code are shown.

The above characteristics can capture the efficient encoding structure, and at the same time can provide the linear minimum distance growth characteristics at a superior iterative decoding threshold.

The parity check matrix (PCM) of the SRJA code can be formed in a hierarchical structure for RU (Richardson-Urbanke) encoding, and the LMDG characteristics for the SRKA code can be demonstrated.

In addition, the superior rate-compatible SRJA code family can be proposed, and the efficient and universal encoding method for the SRJA code can also be proposed.

The performance of the proposed SRJA code may be evaluated, and can be compared with that of 5G NR (New Radio) LDPC code in terms of BLER ((block error rate) performance and encoding complexity. According to the result of simulation, superior BLER performance of the SRJA code proposed in the super ultra-reliable situation can be confirmed. In addition, it is verified that, according to the encoder complexity analysis, the SRJA code has a more efficient encoder structure than the 5G-NR LDPC code. As a result, the proposed SRJA code may be suitable for a new 'beyond-5G (or 6G)' application such as super URLCC (SURLLC).

LDPC (low-density parity-check) code has advantages in that the LDPC code has an almost optimum decoding threshold, a high-speed encoder/decoder structure, a low hardware complexity, and a high throughput potential, so that many developers are paying attention to LDPC codes. Specifically, QC (quasi-cyclic) LDPC code may be suitable for utilizing parallel processing due to regularity of parity check matrix (PCM). Due to the above-mentioned advantages, QC-LDPC codes have been widely adopted in various communication standards such as IEEE 802.11ac (WLAN) and DVB-S2.

Recently, in order to support new 5G services, for example, enhanced mobile broadband (eMBB) (e.g., virtual reality and UHD telepresence) and ultra-reliable and low latency communication (URLLC) (e.g., tactile Internet and autonomous vehicle), a raptor-like QC-LDPC code (Basegraph 1 (BG1) and Basegraph 2 (BG2)) has been selected as channel coding of 5G data channel by various industries. The basegraphs (i.e., adjacent matrices) may represent a concatenated code that includes Richardson-Urbanke (RU) encodable LDPC code and the single parity check (SPC) code. The raptor-like QC-LDPC code can provide not only the efficient encoding/decoding implementation method, but also the almost optimum decoding threshold, such that the raptor-like QC-LDPC code is well suited to eMBB application. However, the raptor-like QC-LDPC code has an insufficient amount of linear minimum distance growth (LMDG) attributes, so that the raptor-like QC-LDPC code may suffer from the error floor issue. For the reasons described above, since the super URLLC application program having a significantly high reliability (i.e., BLER of $10^{-6} \sim 10^{-9}$) is not allowed for retransmission due to significantly strict latency requirements, so that the use of the raptor-like QC-LDPC code applied to the super URLLC application program can be restricted.

Recently, some prototype-based raptor-like codes have been developed as rate-compatible (RC) LDPC codes because the prototype-based raptor-like codes have superior performance and efficient hardware implementation in terms of the encoder/decoder aspects. By searching for an appropriate combination of the high-rate code and an incremental redundancy code (IRC) component corresponding thereto based on single-degree parity extension (i.e., single parity check (SPC) code), the above-mentioned codes can be obtained. Considering BLER and encoder complexity, the kernel structure (i.e., a high-rate code) is the most important factor in code performance for the overall code rate. From among LDPC codes widely used as the kernel structure, some codes, for example, 1) Richardson-Urbanke (RU) irregular binary LDPC code (e.g., 5G New Radio (NR)), 2) accumulate repeat accumulate (ARA) code), 3) accumulate repeat accumulate accumulate (ARAA) code, 4) accumulate repeat jagged accumulate (ARJA) code, and 5) accumulate repeat accumulate check accumulate (ARACA) code, etc. can be used.

However, the requirements for very high reliability and lower encoding complexity become more severe, such that such LDPC code may be far from efficient due to the following reasons 1), 2), 3), 4) and 5).

1) Whereas RU irregular LDPC code can provide the efficient encoding structure and the almost optimum iterative threshold, the RU irregular LDPC code has an insufficient amount of LMDG attributes, so that the RU irregular LDPC code may suffer from the error floor.

2) Whereas ARA code can provide the efficient encoding structure and the almost optimum iterative decoding threshold, the ARA code has an insufficient amount of LMDG attributes, so that the ARA code may suffer from the error floor.

3) ARAA code can provide the efficient encoder structure having any one of better iterative threshold or LDMD attributes according to the degree of iteration in the internal accumulator. However, as shown in FIG. 24, it is impossible to simultaneously provide both of the better iterative threshold and the LDMD attributes.

4) Whereas ARJA code can provide high reliability along with a comparable iterative decoding threshold, the ARJA code may suffer from high encoding complexity.

5) Whereas ARACA code can provide high reliability, superior iterative decoding threshold, and efficient encoding structure, it is difficult for the ARACA code to be implemented in hardware. For example, according to each parity check matrix (PCM), a large amount of hardware bit-interleavers and a large amount of serial bit accumulation may be used.

The present disclosure provides the structured-repeat-jagged-accumulate (SRJA) code family to satisfy requirements of the future wireless communication system. Similar to the RJA code, the proposed SRJA code may be obtained by selectively erasing some edges (i.e., '1's: ones) from the parity portion of the base graph. The connection state of the parity part of the basegraph may be composed of columns each having the weight of 3. The main characteristics of the proposed SRJA code may be a parity part structure of the parity check matrix (PCM). Based on the parity part structure, although the submatrix used in the RU encoding process has a high density, this basegraph may be referred to as the SRJA code. This is because the basegraph has structural characteristics as well as a connection state (shown as a jagged shape) similar to that of the RJA code. This structure enables efficient encoding with low complexity using some of the accumulated bits without using both of a block processing based single parity check (BSPC) operation and the bit-interleaver. In addition, the PCM of the SRJA code may be considered to be the repeat multiple accumulate check accumulate (RMACA) code. The PCM of the SRJA code can maintain superior LMDG attributes, and may be robust to the error floor.

Hereinafter, the proposed SRJA code will be introduced, a method for designing the RC-SRJA (rate-compatible structured repeat jagged accumulate) codes and the exemplary results will be proposed, the efficient encoding procedure for the proposed RC-SRJA codes and the complexity thereof will be described, and performance of the proposed SRJA code will be evaluated as compared to the 5G-NR LDPC codes in terms of the iterative decoding threshold, BLER, and encoding complexity.

Notations

Bold characters may represent matrices or vectors.

$a_l$ is the i-th element of the vector $a=[a_l]_{l=1}^Z$.

Calligraphic characters may represent the sets.

$\mathcal{Z}^+$ is the set of natural numbers, and $\mathcal{Z}=\mathcal{Z}^+\cup\{0\}$ is the set of integers that are equal to or higher than zero '0'.

$|\mathcal{A}|$ is the number (cardinality) of elements of the set ($\mathcal{A}$).

$\min(\mathcal{A})$ ($\max(\mathcal{A})$) may represent elements having a minimum value (or maximum value) included in the set ($\mathcal{A}$).

$\mathcal{A}(i)$ may represent the i-th element of the set ($\mathcal{A}$).

For some i<j, $\mathcal{A}(i:j)=\{\mathcal{A}(l)\}_{l=i}^j$ is established.

Here, $\mathcal{A}=\mathcal{A}^{pre}\cup\mathcal{A}^{tail}$ is given, $\mathcal{A}^{pre}\cap\mathcal{A}^{tail}=\emptyset$ is given, and $\min(\mathcal{A}^{tail})>\max(\mathcal{A}^{pre})$ is also given.

In addition, $A=[a_{i,j}]_{\{i\in\mathcal{A}_{row}\},\{j\in\mathcal{A}_{col}\}}$ is $|\mathcal{A}_{row}|\times|\mathcal{A}_{col}|$ matrix, and $a_{i,j}$ is the element (or entry) of the i-th row and the j-th column of the matrix (A).

$$A_{\mathcal{A}'_{row},\mathcal{A}'_{col}} = [a_{i,j}]_{\{i\in\mathcal{A}'_{row}\},\{j\in\mathcal{A}'_{col}\}}$$

is a submatrix of the matrix A, where $\mathcal{A}_{row}'\subset\mathcal{A}_{row}$ and $\mathcal{A}_{col}'\subset\mathcal{A}_{col}$ are given.

In addition, $(\bullet)^{-1}$, $(\bullet)^T$, $(\bullet)z$, and $\oplus$ may represent an inverse matrix, a transpose matrix, a modulo-Z operation, and the sum of binary vectors (i.e., exclusive-OR) of the matrix, respectively.

In addition, operations of the vectors and matrices can be defined.

For the vector $a=([a_l]_{l=1}^Z)^T$, the operation $\sigma(a,i)=([a_{i+1},\ldots a_Z, a_1, \ldots, a_i])^T$ (where, $0\leq i\leq Z-1$) may represent a left-cyclic shift operation.

[a; b; c] may represent vertical concatenation of the column vectors a, b, and c.

For the length-LZ vector $a=[a_l]_{l=1}^L$ (where $a_l$ is the l-th length-Z subvector), $[a]_i$ may represent the i-th length-Z subvector of the length-LZ vector $a=[a_l]_{l=1}^L$.

For the length-LZ vector $a=[a_l]_{l=1}^L$ (where $a_l$ is the l-th length-Z subvector), $[a]_{[i:j]}=[a_l]_{l=i}^j$ may represent the length-Z subvector concatenation.

For the length-LZ vector $a=[a_l]_{l=1}^L$ (where $a_l$ is the l-th length-Z subvector), $\mu(a)=[\Sigma_{l=1}^i a_l]_{i=1}^L$ may represent accumulation of the length-Z subvectors.

For $a=[a_l]_{l=1}^Z$, $\mu_b(a)=[\Sigma_{l=1}^i a_l]_{i=1}^Z$ may represent bit accumulation operation.

$A_{i,j}$ may represent the (Z×Z) submatrix of the i-th row and the j-th column belonging, to the matrix (A), and $L_1Z\times L_2Z$ can be denoted by $A=[A_{i,j}]_{i=1,j=1}^{L_1,L_2}$.

$\pi_r(A,q)=([A_{r,q_i}^T]_{i=1}^{L_1})^T$ may represent a row permutation of the matrix (A) based on the value of q.

$A_{r,i}$ is the i-th (Z×$L_2$Z) submatrix of the matrix (A), and $q=[q_i]_{i=1}^{L_1}$ is a permuted version of the value of $[i]_{i=1}^{L_1}$. That is, $A_{r,i}$ is the permutation order vector.

Similarly, $\pi_c(A,p)=[A_{c,p_i}]_{i=1}^{L_2}$ may represent a column permutation of the matrix (A) based on the value of p.

$A_{c,i}$ is the i-th ($L_1$Z×Z) submatrix of the matrix (A), and $p=[p_i]_{i=1}^{L_2}$ is a permuted version of the value of $[i]_{i=1}^{L_2}$.

In addition, $\|a\|_1$ is L-norm of the vector (a). W(A) may represent the weight of the matrix A, and $W_{min}^{col}(A)$ may represent a minimum column weight of the matrix (A).

For the given vector $a=[a_l]_{l=1}^L$, $1(a, b)=|\{l|a_l\geq b, l=1, \ldots, L\}|$ is decided.

$0_n$ is a zero column vector having the length-n.

$0_{m\times n}$ is a m×n zero matrix. $1_n$ is an n×n identity matrix. Hereinafter, the SRJA code will be described.

$\overline{H}=[\overline{h}_{i,j}]_{\{(i,j)\in\overline{C}\times\overline{V}\}}$ may represent a $|\overline{C}|\times|\overline{V}|$ binary basegraph (i.e., adjacent matrix).

$\overline{V}$ may represent the set of total variable nodes (VNs) (i.e., columns).

$\overline{C}$ may represent the set of total check nodes (CNs) (i.e., rows).

$\overline{h}_{i,j}$ may represent the element corresponding to the i-th row and the j-th column of the basegraph H.

In addition, $\overline{V}$ may be segmented into $\overline{V}_{inf}$ and $\overline{V}_{par}$, $\overline{V}_{inf}$ may represent the set of information VNs, and $\overline{V}_{par}$ may represent the set of parity VNs.

Figure 25A:
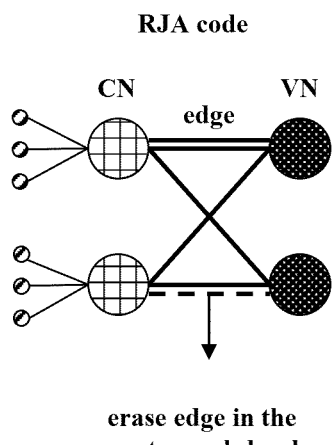
FIGS. 25A, 25B, and 25C are diagrams illustrating a protograph of RJA code, a protograph with degree-3 VNs, a protograph of SRJA code, and the result of comparison between the protograph of RJA code, the protograph with degree-3 VNs, the protograph of SRJA code.
Figure 25B:
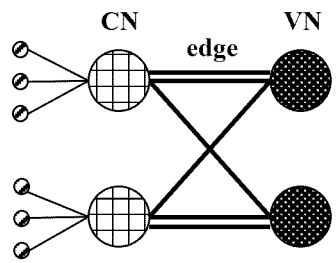
Figure 25C:
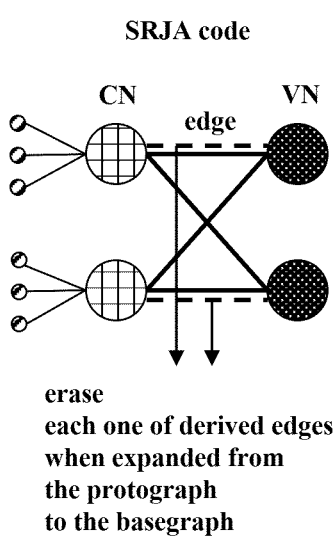

From the standpoint of a protograph, FIGS. 25A, 25B, and 25C are exemplary figures for illustrating protographs of RJA code and SRJA code as compared to the protograph having the degree-3 VNs.

SRJA code and RJA code may start from the protograph having the degree-3 VNs of all parity parts.

In the case of RJA code, the protograph may be adjusted by a method for removing some edges from among the degree-2 parallel edge sets from the upper part of the protograph having the degree-3 VNs.

B. Basegraph of SRJA Code

The structural condition of the basegraph for SRJA code is as follows.

Definition 1

The basegraph $\overline{H}=[\overline{H}_{\overline{C},\overline{v}_{inf}}, \overline{H}_{\overline{C},\overline{v}_{par}}]$ of the SRJA code should satisfy the following structural condition.

1) The information part $\overline{H}_{\overline{C},\overline{v}_{inf}}$ should satisfy the following equation 21.

$$W_{min}^{col}(\overline{H}_{\overline{C},v_{inf}}) \geq 3 \qquad \text{[Equation 21]}$$

That is, a minimum column weight of the submatrix ($\overline{H}_{\overline{C},\overline{v}_{inf}}$) should be equal to or greater than 3.

2) The parity part $\overline{H}_{\overline{C},\overline{v}_{par}}$ should satisfy the following equation 22.

$$\overline{h}_{i,j} = \qquad \text{[Equation 22]}$$

$$\begin{cases} 1, \text{if } i = \overline{C}^{pre}(l), j = \overline{V}_{par}^{pre}(l) \text{ for } l \in \{l'\}_{l'=1}^{|\overline{V}_{par}^{pre}|-1}, \\ 1, elseif\ i = \max(\overline{C}^{pre}), j = \max(\overline{v}_{par}^{pre}), \\ 1, elseif\ i = \overline{C}_{tail}(l), j = \overline{V}_{par}^{pre}(l) \text{ for } l \in \{l'\}_{l'=1}^{|\overline{V}_{par}^{pre}|}, \\ 1, elseif\ i = \overline{C}^{tail}(l+1), j = \overline{V}_{par}^{pre}(l) \text{ for } l \in \{l'\}_{l'=1}^{|\overline{V}_{par}^{pre}|-1}, \\ 1, elseif\ i = \overline{C}^{pre}(l), j = \overline{V}_{par}^{tail}(l) \text{ for } l \in \{l'\}_{l'=1}^{|\overline{V}_{par}^{tail}|}, \\ 1, elseif\ i = \overline{C}^{pre}(l+1), j = \overline{V}_{par}^{tail}(l) \text{ for } l \in \{l'\}_{l'=1}^{|\overline{V}_{par}^{tail}|-1}, \\ 1, elseif\ i = \overline{C}^{tail}(l), j = \overline{V}_{par}^{tail}(l) \text{ for } l \in \{l'\}_{l'=1}^{|\overline{C}^{tail}|-1}, \\ 1, elseif\ i = \max(\overline{C}^{tail}), j = \max(\overline{V}_{par}^{tail}), \\ 0, else. \end{cases}$$

In Equation 22, $|\overline{V}_{par}^{pre}|=|\overline{C}^{tail}|$, $|\overline{V}_{par}^{tail}|=|\overline{C}^{pre}|$, $|\overline{V}_{par}^{pre}| \leq |\overline{V}_{par}^{tail}|$ are determined.

If the structural condition of the above-mentioned basegraph is satisfied, the PCM structural condition of the SRJA code is as follows.

Definition 2

It is assumed that $\mathcal{I}_Z = \{I_i\}_{i=0}^{Z-1} \cup I_{-1}$ is decided.

$I_i$ for $0 \leq i \leq Z-1$ is a left cyclic-shift $Z \times Z$ identity matrix that is cyclically shifted to the left by a predetermined length corresponding to the position (i), $I_{-1}$ is a $Z \times Z$ zero matrix, and $I_1^m$ is a 1-bit zero masked version of $I_i$. The element of the first row and the $(1+(Z-i)_Z)$-th column may be masked with zero '0'.

Definition 3

The matrix H should satisfy the following condition.

A $|\overline{C}|Z \times |\overline{V}|Z$ binary matrix $H=[H_{i,j}]_{\{i \in \overline{C}\},\{j \in \overline{V}\}}$ may represent a parity check matrix (PCM) that is constructed by lifting the basegraph $\overline{H}$ by the lifting factor (Z).

1) if $$(i, j) \in \bigcup_{l=1}^{|\overline{v}_{par}^{pre}|} \{\overline{c}^{tail}(l), \overline{v}_{par}^{pre}(l)\}$$

is given, $H_{i,j}$ may represent a $Z \times Z$ matrix that is lifted from $\overline{h}_{i,j}$ using the value of $I_1^m$.

2) if $$(i, j) \in \bigcup_{l=1}^{|\overline{v}_{par}^{pre}|-1} \{\overline{c}^{tail}(l)+1, \overline{v}_{par}^{pre}(l)\}$$

is given, $H_{i,j}$ may represent a $Z \times Z$ matrix that is lifted from $\overline{h}_{i,j}$ using the value of $I_0$ only.

3) if $(i,j) \in \{\overline{C}^{pre} \times \overline{V}_{par}^{pre}\} \cup \{\overline{C} \times \overline{V}_{par}^{tail}\}$ is given, $H_{i,j}$ may represent a $Z \times Z$ matrix that is lifted from $\overline{h}_{i,j}$ using $I_0$ or $I_{-1}$ at $\mathcal{I}_Z$.

4) Otherwise, $H_{i,j}$ may represent a $Z \times Z$ matrix that is lifted from $\overline{h}_{i,j}$ using $I_l$ ($0 \leq l \leq Z-1$) or $I_{-1}$ at the value of $\mathcal{I}_Z$.

The condition of Definition 3 can allow the SRJA code to be efficiently decoded.

Considering the encoder, the hierarchical technology of the PCM of the SRJA code will hereinafter be described.

Lemma 1

If the matrix Z is a $Z \times Z$ binary triangular matrix with all ones in the diagonal direction, the inverse matrix of the matrix Z is always the same kind of triangular matrix.

Assuming that the matrix Z is an invertible matrix (always having the inverse matrix), the matrix Z is a lower triangular matrix, and the matrix $\overline{Z}$ is referred to as an inverse matrix of the matrix Z, the i-th column vector $\overline{z}_{c,i}$ of the inverse matrix $\overline{Z}$ can satisfy the condition $Z\overline{z}_{c,i}=e_Z^i$. $e_Z^i$ is a length-Z binary column vector. In elements of the vector $e_Z^i$ only the i-th row of the vector $e_Z^i$ is set to 1, and the remaining elements other than the i-th row are set to zero (0). The matrix Z is a lower triangular matrix, and the elements of the column vector $\overline{z}_{c,i}$ may range from 0 from upper of the i-th row (that is, from the 1-th row to the (i−1)-th row). Therefore, the matrix $\overline{Z}$ is a lower triangular matrix.

Proposition 1

$H=[H_{i,j}]_{\{i \in \overline{C}\},\{j \in \overline{V}\}}$ is a PCM that is constructed by lifting according to Definition 3 from the SRJA code basegraph $\overline{H}$. Thus, PCM (H) can be formed in a hierarchical shape according to the following equation 23.

$$H = \begin{bmatrix} H_{\overline{c}^{pre}, \overline{v}_{inf}} & H_{\overline{c}^{pre}, \overline{v}_{par}^{pre}} & H_{\overline{c}^{pre}, \overline{v}_{par}^{tail}} \\ H_{\overline{c}^{tail}, \overline{v}_{inf}} & H_{\overline{c}^{tail}, \overline{v}_{par}^{pre}} & H_{\overline{c}^{tail}, \overline{v}_{par}^{tail}} \end{bmatrix} \qquad \text{[Equation 23]}$$

$$\triangleq \begin{bmatrix} A & B & T \\ C & D & E \end{bmatrix},$$

The PCM (H) shown in Equation 23 can be RU-encoded.

According to Condition 3 of Definition 3, T is a dual diagonal QC matrix, and T is an invertible matrix from Lemma 1.

The inverse matrix ($T^{-1}$) of the dual diagonal QC matrix (T) is a lower triangular QC matrix including identity submatrices, so that $T^{-1}$ can be represented by the following equation.

$$T^{-1} = \begin{bmatrix} I_0 & L_{-1} & L_{-1} & \cdots & L_{-1} \\ I_0 & I_0 & \ddots & \ddots & \vdots \\ I_0 & \ddots & \ddots & \ddots & \vdots \\ \vdots & \ddots & \ddots & I_0 & L_{-1} \\ I_0 & \cdots & I_0 & I_0 & I_0 \end{bmatrix}$$

[Equation 24]

The $|\nabla_{par}^{tail}|Z \times |\nabla_{par}^{pre}|Z$ matrix B can be represented by the following equation 25.

$$B = \begin{bmatrix} 1_{(|\bar{v}_{par}^{pre}|-1)z} & 0_{(|\bar{v}_{par}^{pre}|-1)z \times z} \\ 0_{(|\bar{v}_{par}^{tail}|-|\bar{v}_{par}^{pre}|)z \times (|\bar{v}_{par}^{pre}|-1)z} & 0_{(|\bar{v}_{par}^{tail}|-|\bar{v}_{par}^{pre}|)z \times z} \\ 0_{z \times (|\bar{v}_{par}^{pre}|-1)z} & I_0 \end{bmatrix}$$

[Equation 25]

And, E is denoted by $E = B^T$.

In $B_{i,c}$, columns of $T_{i,r}^{-1}$ corresponding to the row positions of the Z×Z identity matrix may be the Z×Z identity matrix.

$T_{i,r}^{-1}$ may represent the i-th $Z \times |\nabla_{par}^{tail}|Z$ of the inverse matrix $T^{-1}$, and $B_{i,c}$ may represent the i-th $|\nabla_{par}^{tail}|Z \times Z$ of the matrix B.

The condition $T^{-1}B = B$ is established. In addition, E is a transpose matrix of the matrix B, and the matrices thereof are composed of the Z×Z identify submatrices, resulting in $EB = 1_{\bar{v}_{par}^{pre}|Z}$.

In conclusion, $\Phi$ is a $|\nabla_{par}^{pre}|Z \times |\nabla_{par}^{pre}|Z$ matrix based on the following equation 26.

$$\Phi = \begin{bmatrix} I_0 + I_1^m & L_{-1} & L_{-1} & \cdots & L_{-1} \\ I_0 & I_0 + I_1^m & \ddots & \ddots & \vdots \\ L_{-1} & \ddots & \ddots & \ddots & \vdots \\ \vdots & \ddots & \ddots & I_0 + I_1^m & L_{-1} \\ L_{-1} & \cdots & L_{-1} & I_0 & I_0 + I_1^m \end{bmatrix}$$

[Equation 26]

From Lemma 1, $\Phi$ is an invertible matrix, so that the H can be RU-encoded itself.

Figure 26A:
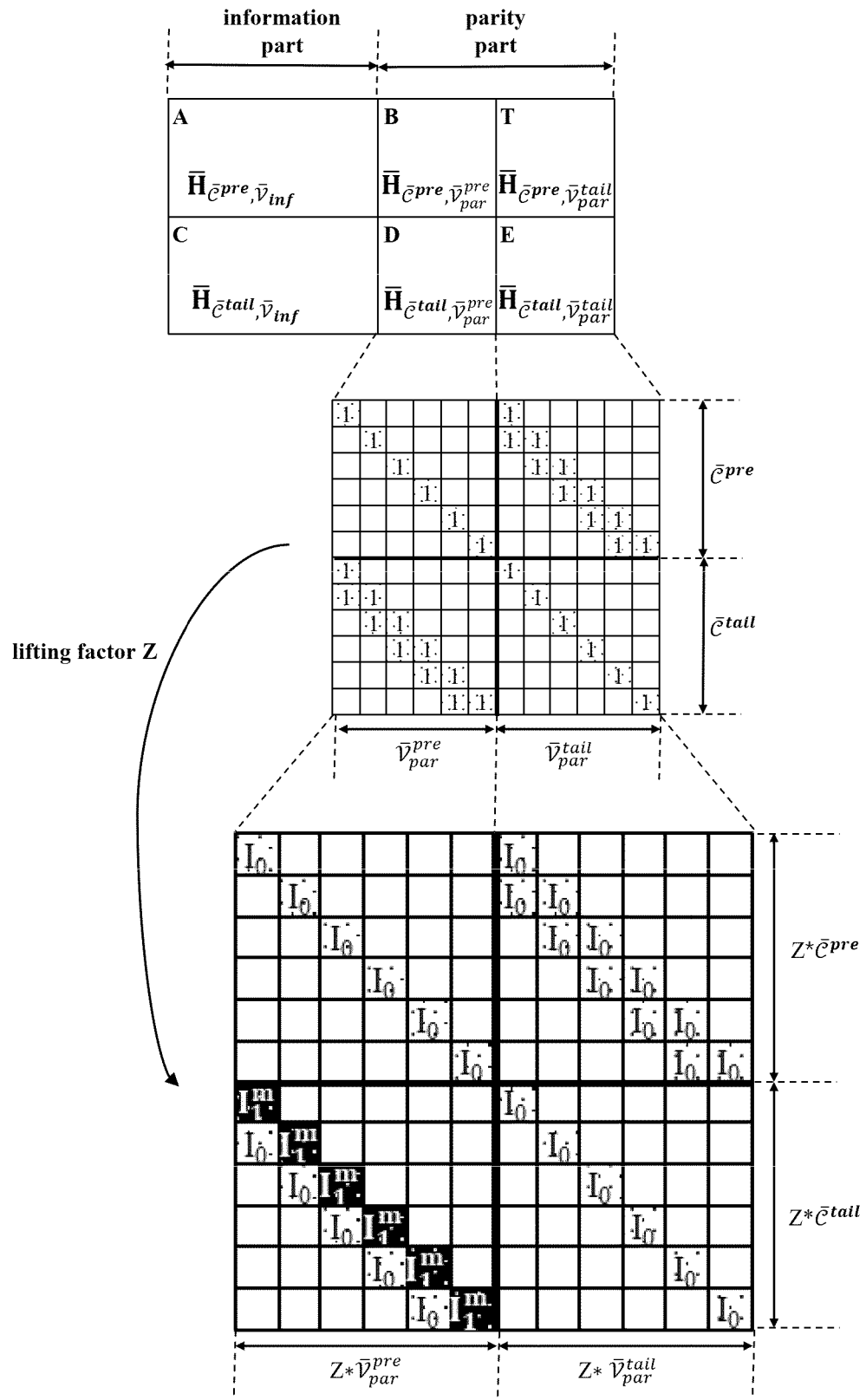
FIGS. 26A and 26B are diagrams illustrating methods for acquiring a parity check matrix (PCM) based on a basegraph.
Figure 26B:
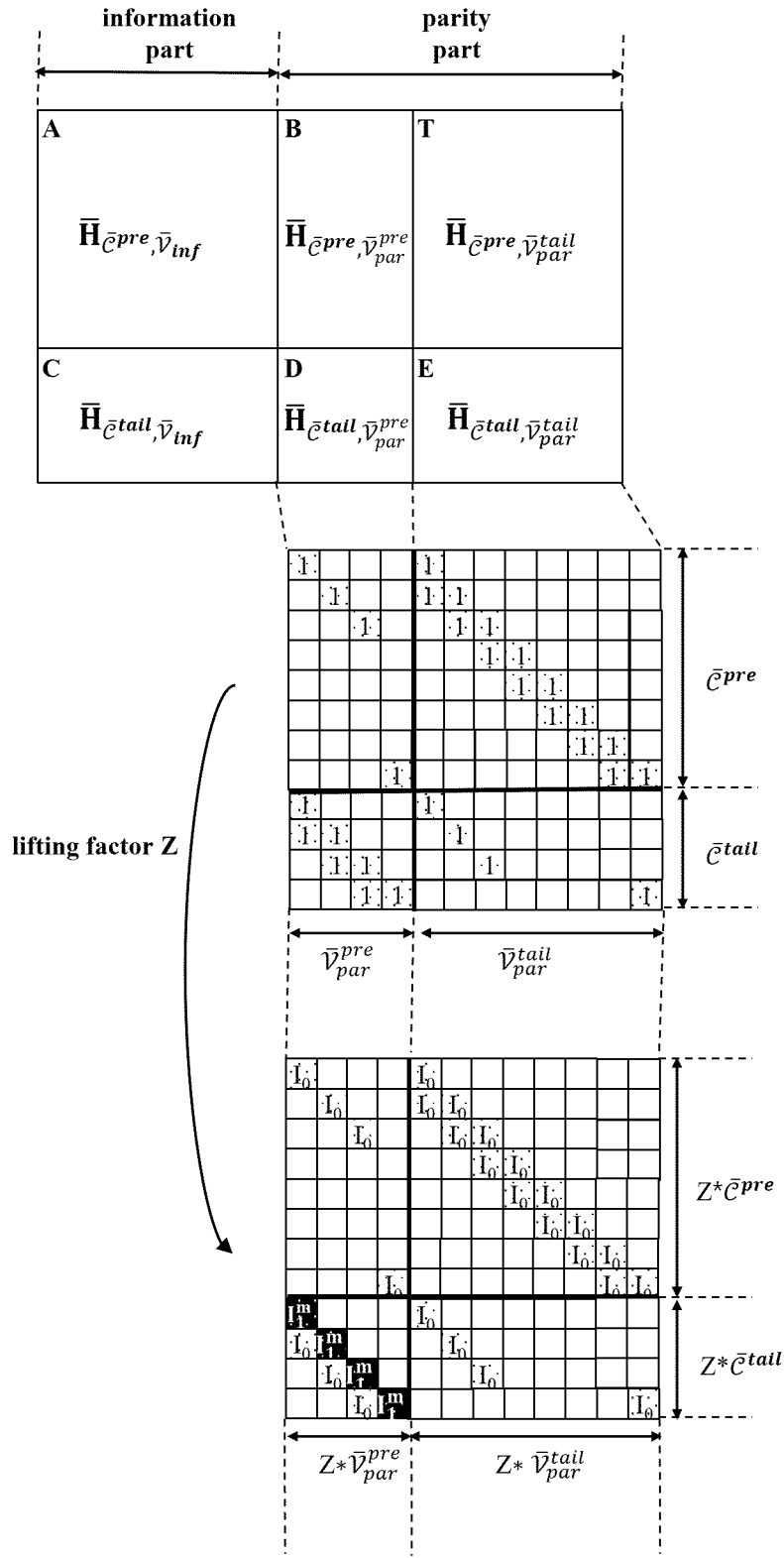

FIGS. 26A and 26B are diagrams illustrating methods for obtaining the parity check matrix (PCM) based on the basegraph.

The intermediate parts of FIGS. 26A and 26B illustrate the parity parts of the basegraphs shown in upper portions of FIGS. 26A and 26B according to Conditions of Definition 1. The hatched positions may represent 1s that are predetermined according to conditions of Definition 1.

The lower parts of FIGS. 26A and 26B illustrate the parity portion of the PCM that is constructed from the basegraph according to Definition 3.

SRJA code according to the present disclosure may have LMDG characteristics.

Unfortunately, it is impossible to acquire SRJA code using the check node splitting technology, so that the check node splitting theorem cannot guarantee LMDG characteristics of the SRJA code.

However, the present disclosure can guarantee LMDG characteristics of the SRJA code according to an alternative method.

Theorem 2

The PCM of SRJA code can always be converted into RMACA code.

Since RMACA code has LMDG characteristics, SRJA code can also obtain LMDG characteristics.

Assuming that H is a $|\overline{C}|Z \times |\overline{V}|Z$ PCM that is lifted from $\overline{H}$ according to Definition 3, $p = [p^{inf}, p^{par}]$ is a length-$|\overline{V}|$ column permutation order vector. $p^{inf}$ may be denoted by $p^{inf} = [\nabla_{inf}(l)]_{l=1}^{\bar{v}_{inf}}$. q is a length-$|\overline{C}|$ row permutation order vector.

$p^{par}$ and q can be described according to the following two cases 1) and 2).

That is, the first case [Case 1] is $|\nabla_{par}^{pre}| = |\nabla_{par}^{tail}|$, the second case [Case 2] is $|\nabla_{par}^{pre}| < |\nabla_{par}^{tail}|$.

1) [Case 1]: If $|\nabla_{par}^{pre}| = |\nabla_{par}^{tail}|$ is given, $p^{par}$ and q are determined using the following equation 27.

$$p^{par} = [\bar{v}_{par}^{pre}(l), \bar{v}_{par}^{tail}(l)]_{l=1}^{|\bar{v}_{par}^{pre}|},$$

[Equation 27]

and $$q = [\bar{c}^{pre}(l), \bar{c}^{par}(l)]_{l=1}^{|\bar{c}^{pre}|}.$$

2) [Case 2]: If $|\nabla_{par}^{pre}| < |\nabla_{par}^{tail}|$ is given, $p^{par}$ and q are determined as represented by the following equation 28.

$$p_i^{par} = \begin{cases} [\bar{v}_{par}^{pre}(l), \bar{v}_{par}^{tail}(l)]_{l=1}^{|\bar{v}_{par}^{pre}|-1}, & \text{if } i = 1, \\ [\bar{v}_{par}^{tail}(l)]_{l=|\bar{v}_{par}^{pre}|}^{|\bar{v}_{par}^{tail}|-1}, & \text{if } i = 2, \\ [\max(\bar{v}_{par}^{pre}), \max(\bar{v}_{par}^{tail})], & \text{else,} \end{cases}$$

[Equation 28]

and $$q_i = \begin{cases} [\bar{c}^{pre}(l), \bar{c}^{tail}(l)]_{l=1}^{|\bar{c}^{tail}|-1}, & \text{if } i = 1, \\ [\bar{c}^{pre}(l)]_{l=|\bar{c}^{tail}|}^{|\bar{c}^{pre}|-1}, & \text{if } i = 2, \\ [\max(\bar{c}^{pre}), \max(\bar{c}^{tail})], & \text{else.} \end{cases}$$

In Equation 28, $p^{par}$ is denoted by $p^{par} = [p_i^{par}]_{i=1}^{3}$, and q is denoted by $q = [q_i]_{i=1}^{3}$.

According to the above-mentioned row and column permutation order vectors (p and q), a permuted matrix of the matrix H can be defined as $H^* = \pi_r(\pi_c(H, p), q)$.

From the standpoint of a connection state of the corresponding permuted PCM (H*) and the encoder procedure, according to Condition 1 of Definition 1, SRJA code in which all information bits include at least degree-3 iterations (via direct or indirect branches) may be equivalent to RMACA code. In order to obtain the corresponding permuted PCM (H*), the degree-2 zigzag closed loop having one-bit masking may start by the accumulator including the interleaver. The RMACA code may have LMDG characteristics, so that the proposed SRJA code may always have LMDG characteristics.

FIG. 27 illustrates the results of examples in which SRJA code can be considered to be RMACA code.

SRJA codes shown in the upper part of FIG. 27 can be considered to be $R(AC)^5$ A codes, and SRJA codes shown in the lower part of FIG. 27 can be considered to be $R(AC)^3$ A codes.

Rate-compatible SRJA codes will hereinafter be described.

By using a methodology similar to rate-compatible ARCA Code, good families of the RC-SRJA codes can be proposed. In a similar way to the rate-compatible ARACA codes, the family of RC-SRJA codes can be designed in consideration of IRCs based on 1) SRJAC codes used as a kernel structure (i.e., high-speed code) that can satisfy an iterative decoding threshold, LMDG characteristics, and the efficient encoder structure and 2) SPC codes maintaining the efficient encoder/decoder structures and providing an additional coding gain only.

$$\mathcal{R} = \left\{ \frac{n-m}{n-p+l} \right\}_{l=0}^{L}$$

is the set of code rates for designing RC-SRJA codes. Each of 'n', 'm' and 'p' are positive integers, and $\mathcal{H} = \{\overline{H}^{(r)} | r \in \mathcal{R}\}$ is the set of corresponding basegraphs.

$$\overline{H}^{\left(\frac{n-m}{n-p}\right)}$$

is an m×n kernel basegraph, initial p columns may represent VNs having punctured high-degrees (i.e., weights). Based on the kernel basegraph $$\overline{H}^{\frac{n-m}{n-p}},$$

a row and a column may be sequentially added to $$H^{\left(\frac{n-m}{n-p-1+l}\right)},$$

so that (m+l)×(n+l) basegraph $$\overline{H}^{\left(\frac{n-m}{n-p+l}\right)}$$

(1≤l≤L) can be obtained.
The (m+l)×(n+l) basegraph $$\overline{H}^{\left(\frac{n-m}{n-p+l}\right)}$$

can be represented by the following equation 29.

$$\overline{H}^{\left(\frac{n-m}{n-p+l}\right)} = \begin{bmatrix} \overline{H}^{\left(\frac{n-m}{n-p-1+l}\right)} & 0 \\ \overline{h}_l^{IR} & 1 \end{bmatrix}$$ [Equation 29]

In Equation 29, $\overline{h}_l^{IR} = [\overline{h}_l^{IR}, 0_{l-1}^T]$ is given, $\overline{h}_l^{IR} = [\overline{h}_{l,i}^{IR}]_{i=1}^n$ is given, and $\overline{h}_{l,i}^{IR} \in \{0,1\}$ is obtained.

The corresponding first IRC may imply that the first IRC is a simple SPC code implemented with only the sum of binary vectors.

For given values 'm', 'n' and 'p', the second-best kernel basegraph is discovered from available candidates using the protograph extrinsic information transfer (PEXIT) chart analysis. In PEXIT, if a binary input additive white Gaussian noise (BI AWGN) kernel iteration decoding threshold is higher than the sum of a benchmark threshold (i.e., 5G-NR) and the given threshold ($\eta_{gap}$), searching is ended. There may be a tradeoff relationship between the waterfall and the error floor. A threshold of a well-designed LDPC code family can be used as a capacity threshold (i.e., Shannon limit).

In Equation 29, $\overline{h}_l^{IR}$ for l=1, . . . , L may be sequentially determined in consideration of the rates $$r = \frac{n-m}{n-p}, \ldots, \frac{n-m}{n-p+L}.$$

In order to limit the search space to a reasonable size, the elements of $\overline{h}_l^{IR}$ can be limited according to the following equation 30.

[Equation 30]
1) $1 \leq \sum_{i=1}^{p} \overline{h}_{l,i}^{IR} \leq p$ for $l = 1, \ldots, L,$ 2) $d_{min} \leq \|\overline{h}_l^{IR}\|_1 \leq d_{max},$ where $d_{min}$ and $d_{max}$ are small positive integers, 3) $\mathbb{1}\left(\sum_{l'=1}^{l} \overline{h}_{l'}^{IR}, \alpha_1 \gamma_l\right) \leq \beta_1 n$ and $\mathbb{1}\left(\sum_{l'=1}^{l} \overline{h}_{l'}^{IR}, \alpha_2 \gamma_l\right) \geq \beta_2 n$ for $2 \leq l \leq L$, where $\alpha_1 \geq 1$ and $0 \leq \alpha_2,$ $\beta_1, \beta_2 \leq 1$ and $\gamma_l = \left(\sum_{l'=1}^{l} \|\overline{h}_{l'}^{IR}\|_1\right)/n.$ In Equation 30, the first constraint may include the following requirements (1) the punctured VNs should be high-degree VNs, and should be coupled to CNs for improved iteration decoding threshold and (2) when any punctured VN further includes the adjacent remaining CNs connected to the transmitted VNs, the punctured VN can be recovered with reliable messages, so that the substantial CNs should be coupled to the punctured VN through a single edge.

In addition, although the degree of each CN is restricted to small integers, superior RC-LDPC codes can be designed, so that the second constraint is to limit the size of search spaces. In addition, the third constraint aims to control relatively-high VNs and relatively-low VNs to be properly mixed, and also aims to control edge connections from among IRCs to be well distributed for the better iteration decoding threshold. Based on the above-mentioned constraints, $\overline{h}_{IR}^{(l)}$ can be designed as follows.

1) One or more candidates may be randomly selected from the search space.

2) The surviving candidates in a state in which the selected candidate has a better iteration decoding threshold may be updated.

3) If the iteration decoding threshold of the surviving candidate is less than the sum of a benchmark threshold and a given threshold ($\eta_{gap}$), processing is stopped.

4) If the current iteration index is denoted by an integer multiple of $L_{max}$, $\eta_{gap} = \eta_{gap} + \epsilon$ for some $\epsilon > 0$ can be updated. Then, processing proceeds to step 1.

The rate-1/5 basegraph of the method proposed by the present disclosure can be represented by the following equation 31.

$$\overline{H}^{\left(\frac{1}{3}\right)} = \begin{bmatrix} \overline{H}^{\left(\frac{8}{11}\right)} & 0_{5\times 29} \\ \overline{H}^{IR} & 1_{29} \end{bmatrix}, \quad \text{[Equation 31]}$$

where $$\overline{H}^{\left(\frac{8}{11}\right)} = \begin{bmatrix} 1 & 1 & 1 & 0 & 1 & 1 & 0 & 1 & | & 1 & 0 & | & 1 & 0 & 0 \\ 1 & 0 & 1 & 1 & 1 & 1 & 1 & 1 & | & 0 & 0 & | & 1 & 1 & 0 \\ 1 & 1 & 1 & 1 & 0 & 1 & 1 & 1 & | & 0 & 1 & | & 0 & 1 & 1 \\ \hline 0 & 1 & 1 & 1 & 1 & 0 & 1 & 0 & | & 1 & 0 & | & 1 & 0 & 0 \\ 1 & 1 & 0 & 1 & 1 & 1 & 1 & 0 & | & 1 & 1 & | & 0 & 0 & 1 \end{bmatrix},$$

and $$\overline{H}^{IR} = \begin{bmatrix} 1 & 1 & 0 & 0 & 0 & 0 & 0 & 1 & 0 & 0 & 0 & 0 \\ 1 & 0 & 1 & 0 & 0 & 0 & 0 & 1 & 0 & 0 & 0 & 0 \\ 0 & 1 & 1 & 0 & 0 & 1 & 0 & 0 & 1 & 0 & 1 & 0 & 0 \\ 1 & 1 & 1 & 0 & 0 & 0 & 0 & 0 & 1 & 0 & 0 & 0 \\ 0 & 1 & 0 & 0 & 0 & 0 & 0 & 1 & 0 & 0 & 1 & 0 \\ 1 & 1 & 1 & 0 & 0 & 0 & 0 & 0 & 1 & 0 & 0 & 0 \\ 1 & 0 & 1 & 0 & 0 & 0 & 0 & 0 & 0 & 1 & 0 & 0 \\ 0 & 1 & 0 & 0 & 1 & 0 & 0 & 0 & 0 & 0 & 1 & 0 \\ 1 & 0 & 1 & 0 & 0 & 1 & 0 & 0 & 1 & 0 & 0 & 0 \\ 0 & 1 & 0 & 0 & 0 & 0 & 0 & 0 & 1 & 0 & 1 & 0 & 0 \\ 1 & 0 & 1 & 0 & 0 & 1 & 0 & 0 & 1 & 0 & 0 & 0 & 0 \\ 0 & 1 & 0 & 0 & 1 & 0 & 0 & 0 & 1 & 1 & 0 & 0 \\ 1 & 0 & 1 & 0 & 0 & 0 & 0 & 0 & 1 & 0 & 0 & 0 & 1 \\ 0 & 1 & 0 & 0 & 1 & 0 & 0 & 0 & 1 & 0 & 0 & 0 & 0 \\ 1 & 1 & 1 & 0 & 0 & 0 & 0 & 0 & 1 & 0 & 0 & 0 & 0 \\ 0 & 1 & 0 & 0 & 0 & 0 & 0 & 1 & 0 & 1 & 0 & 0 & 0 \\ 1 & 1 & 1 & 0 & 0 & 0 & 0 & 0 & 1 & 0 & 0 & 0 & 0 \\ 1 & 0 & 0 & 0 & 1 & 0 & 0 & 0 & 1 & 0 & 0 & 1 & 0 \\ 0 & 1 & 1 & 0 & 0 & 0 & 0 & 0 & 0 & 0 & 0 & 0 & 1 \\ 1 & 0 & 0 & 0 & 0 & 0 & 1 & 0 & 1 & 0 & 0 & 0 & 0 \\ 0 & 1 & 0 & 1 & 0 & 0 & 0 & 1 & 1 & 0 & 0 & 0 & 0 \\ 1 & 0 & 1 & 0 & 0 & 0 & 0 & 0 & 1 & 0 & 0 & 0 & 0 \\ 1 & 0 & 0 & 0 & 0 & 1 & 0 & 0 & 1 & 0 & 1 & 0 & 0 \\ 0 & 1 & 0 & 0 & 0 & 0 & 1 & 0 & 1 & 0 & 0 & 0 & 0 \\ 1 & 0 & 0 & 0 & 0 & 0 & 0 & 0 & 1 & 0 & 0 & 1 & 0 \\ 0 & 1 & 1 & 0 & 0 & 1 & 0 & 0 & 0 & 0 & 0 & 0 & 0 \\ 1 & 1 & 0 & 0 & 0 & 0 & 0 & 0 & 0 & 0 & 1 & 0 & 0 \\ 1 & 0 & 1 & 0 & 1 & 0 & 0 & 0 & 0 & 0 & 0 & 1 & 0 \\ 0 & 1 & 0 & 1 & 0 & 0 & 0 & 1 & 0 & 1 & 0 & 0 & 1 \end{bmatrix}.$$

In Equation 31, n=13, p=2, m=5 and $$\mathcal{R} = \left\{ \frac{8}{11+l} \mid l = 0, \ldots, 29 \right\}$$

are given. In addition, $d_{min}=3$, $d_{max}=5$, $\alpha_1=2$, $\alpha_2=0.75$, $\beta_1=0.2$, $\beta_2=0.4$, $\eta_{gap}=0.3$ dB and $L_{max}=50$ are also given.

The encoder and encoding method based on RC SRJA code will hereinafter be described.

$r_{max}=\max(\mathcal{R})$ and $r_{min}=\min(\mathcal{R})$ may represent a maximum code rate and a minimum code rate, respectively.

$\nabla_{tot}=\nabla\cup\nabla_{irc}(\overline{C}_{tot}=\overline{C}\cup\overline{C}_{irc})$ may represent the set of all VNs (CNs) of the basegraph having a minimum code rate, and $\nabla_{irc}'(\overline{C}_{irc}')$ may represent the set of VNs (CNs) corresponding to the IRC part other than the kernel part.

$H^{(r_{min})}$ may represent a parity check matrix constructed by lifting the value of $\overline{H}^{(r_{min})}$ using the lifting factor Z.

The parity part of $H^{(r_{max})}$ corresponding to the kernel structure may be constructed according to Definition 3, the parity part of IRCs may be lifted by the Z×Z identify submatrices, and the remaining parts can be constructed by any methodology. In addition, $x_i$ is the length-Z partial binary codeword column vector corresponding to VN $i \in \nabla_{tot}$ in $H^{(r_{min})}$. For a certain set VN set $\mathcal{A}$, $x_{\mathcal{A}} = \{x_i\}_{i \in \mathcal{A}}$ is decided. $H^{(r_{min})}x_{\nabla_{tot}}=0_{|\nabla_{tot}|Z}$ can be represented by the following equation 32.

$$\begin{bmatrix} H_{\overline{c},\overline{v}_{inf}} & H_{\overline{c},\overline{v}_{par}} & 0_{|\overline{c}|Z\times|\overline{v}_{inc}|Z} \\ H_{\overline{c}_{irc},\overline{v}_{inf}} & H_{\overline{c}_{irc},\overline{v}_{par}} & 1_{|\overline{v}_{irc}|Z} \end{bmatrix} \begin{bmatrix} x_{\overline{v}_{inf}} \\ x_{\overline{v}_{par}} \\ x_{\overline{v}_{irc}} \end{bmatrix} = 0_{|\overline{v}_{ox}|Z} \quad \text{[Equation 32]}$$

In Equation 32, $x_{\mathcal{A}}$ for $\mathcal{A}=\nabla_{par}$ (or $\nabla_{irc}$) can be obtained by the following equation 33.

$$x_{\mathcal{A}} = \begin{cases} \underbrace{H_{\overline{c},\overline{v}_{par}}^{-1} \underbrace{H_{\overline{c},\overline{v}_{inf}} x_{\overline{v}_{inf}}}_{(a)}}_{(b)}, & \text{if } \mathcal{A} = \overline{v}_{par}, \\ \underbrace{H_{\overline{c}_{inc},\overline{v}} x_{\overline{v}}}_{(c)}, & \text{if } \mathcal{A} = \overline{v}_{irc}. \end{cases} \quad \text{[Equation 33]}$$

The part (a) shown in Equation 33 can be represented by the following equation 34.

$$H_{\overline{c},\overline{v}_{inf}} x_{\overline{v}_{inf}} = \begin{bmatrix} \sum_{j \in S_{(\overline{v}_{inf},\overline{c}(1))}} \sigma(x_j, \hat{h}_{\overline{c}(1),j}) \\ \vdots \\ \sum_{j \in S_{(\overline{v}_{inf},\overline{c}(|\overline{c}|))}} \sigma(x_j, \hat{h}_{\overline{c}(|\overline{c}|),j}) \end{bmatrix} \stackrel{\Delta}{=} z_{\overline{c}} \quad \text{[Equation 34]}$$

In Equation 34, $S_{(\mathcal{A},i)}$ is a subset of VNs in the set $(\mathcal{A})$ connected to CN-1, and $\hat{h}_{i,j}$ is a shift value of $H_{i,j}$.

The part (b) of Equation 33 can be represented by the following equation 35.

$$H_{\overline{c},\overline{v}_{par}}^{-1} z_{\overline{c}} = \begin{bmatrix} x_{\overline{v}_{par}}^{pre} \\ T^{-1}\left(x_{\overline{c}}^{pre} \oplus Bx_{\overline{v}_{par}}^{pre}\right) \end{bmatrix},$$

$$= \begin{bmatrix} x_{\overline{v}_{par}}^{pre} \\ \mu\left(z_{\overline{c}}^{pre} \oplus \left[x_{\overline{v}_{par}(1:|\overline{v}_{par}^{pre}|-1)}^{pre}; \right. \right. \\ \left. \left. 0_{(|\overline{v}_{par}^{tail}|-|\overline{v}_{par}^{pre}|)Z}; x_{\overline{v}_{par}(|\overline{v}_{par}^{pre}|)}^{pre}\right]\right) \end{bmatrix} \quad \text{[Equation 35]}$$

In Equation 35, $x_{\overline{v}_{par}}^{pre}$ can be represented by the following equation 36.

$$x_{\overline{v}_{par}}^{pre} = \Phi^{-1}\left(ET^{-1}z_{\overline{c}}^{pre} \oplus z_{\overline{c}}^{tail}\right), \quad \text{[Equation 36]}$$

$$\stackrel{(a)}{=} \Phi^{-1}\left(\left[\left[\mu(z_{\overline{c}}^{pre})\right]_{1:|\overline{c}^{tail}|-1}; \left[\mu(z_{\overline{c}}^{pre})\right]_{|\overline{c}^{pre}|}\right] \oplus z_{\overline{c}}^{tail}\right),$$

$$\stackrel{\Delta}{=} \Phi^{-1}s,$$

$$\stackrel{(b)}{=} \begin{bmatrix} \mu_b([s]_1) \\ \mu_b(\mu_b([s]_1) \oplus [s]_2) \\ \mu_b(\mu_b(\mu_b([s]_1) \oplus [s]_2) \oplus [s]_3) \\ \vdots \\ \mu_b(\mu_b(\ldots \oplus [s]_{|\overline{c}^{tail}|-1}) \oplus [s]_{|\overline{c}^{tail}|}) \end{bmatrix}$$

In Equation 36, the part of the equal sign (a) can be obtained from Equation 24, Equation 25, and $E=B^T$.

In addition, the part of the equal sign (b) can be obtained from $\Phi^{-1}$ shown in the following equation 37.

$$\Phi^{-1} = \begin{bmatrix} A & I_{-1} & I_{-1} & \cdots & I_{-1} \\ A^2 & A & \ddots & \ddots & \vdots \\ A^3 & \ddots & \ddots & \ddots & \vdots \\ \vdots & \ddots & \ddots & A & I_{-1} \\ A^{|\bar{v}_{par}^{pre}|} & \cdots & A^3 & A^2 & A \end{bmatrix} \quad \text{[Equation 37]}$$

In Equation 37, A is a Z×Z square matrix in which all low triangles are set to 1.

In Equation 36, $x_{\bar{v}_{par}^{pre}(l)}$ can be represented by the following equation 38.

$$x_{\bar{v}_{par}^{pre}(l)} = \begin{cases} \mu_b\left(x_{\bar{v}_{par}^{pr}(l-1)} \oplus [s]_l\right), & \text{if } l > 1 \\ \mu_b([s]_1), & \text{else.} \end{cases} \quad \text{[Equation 38]}$$

The part (b) of Equation 33 may be expressed in a similar way to Equation 34.

Consequently, the calculations of the parts (a), (b), and (c) of Equation 33 require only the sum of binary vectors including some of bit-accumulations, so that the proposed encoding method may be very efficient in throughput.

Complexity of the proposed encoding method can be measured by the number of binary sums in the encoding procedure.

The proposed encoding procedure may be composed of three steps (a) to (c) shown in Equation 33. The number of binary sums required as the encoding complexity can be represented by $\Lambda = \Sigma_{i=1}^{3}\Lambda_i$, where $\Lambda_i$ can be represented by the following equation 39.

$$\Lambda_i = \begin{cases} W(\bar{H}_{\bar{c},\bar{v}_{inf}})z, & \text{if } i = 1, \\ (|\bar{v}_{par}| + 2|\bar{v}_{par}^{pre}| - 2)z, & \text{if } i = 2, \\ W(\bar{H}_{\bar{c}_{inc},\bar{v}})z, & \text{if } i = 3. \end{cases} \quad \text{[Equation 39]}$$

In Equation 39, the encoder complexity at 'i=1' and 'i=3' can be easily obtained based on Equation 34

The encoder complexity at 'i=2' can be obtained based on Equation 35, Equation 36 and Equation 38.

In more detail, $T^{-1}(z_{\bar{c}^{pre}} \oplus Bx_{\bar{v}_{par}^{pre}})$ shown in Equation 35 requires $(|\bar{v}_{par}|-1)Z$ binary sums.

In Equation 36, $\Phi^{-1}([[\mu(z_{\bar{c}_{pre}})]_{1:|\bar{c}^{tail}|-1}; [\mu(z_{\bar{c}^{pre}})]_{|\bar{c}^{pre}|}] \oplus z_{c^{tail}})$ and $$\begin{bmatrix} \mu_b([s]_1) \\ \mu_b(\mu_b([s]_1) \oplus [s]_2) \\ \mu_b(\mu_b(\mu_b([s]_1) \oplus [s]_2) \oplus [s]_3) \\ \vdots \\ \mu_b(\mu_b(\ldots \oplus [s]_{|\bar{c}^{tail}|-1}) \oplus [s]_{|\bar{c}^{tail}|}) \end{bmatrix}$$

may require $(2|\bar{v}_{par}^{pre}|-1)Z$ binary sums, so that a total number of required binary sums is $(|\bar{v}_{par}|+2|\bar{v}_{par}^{pre}|-2)Z$.

Figure 28:
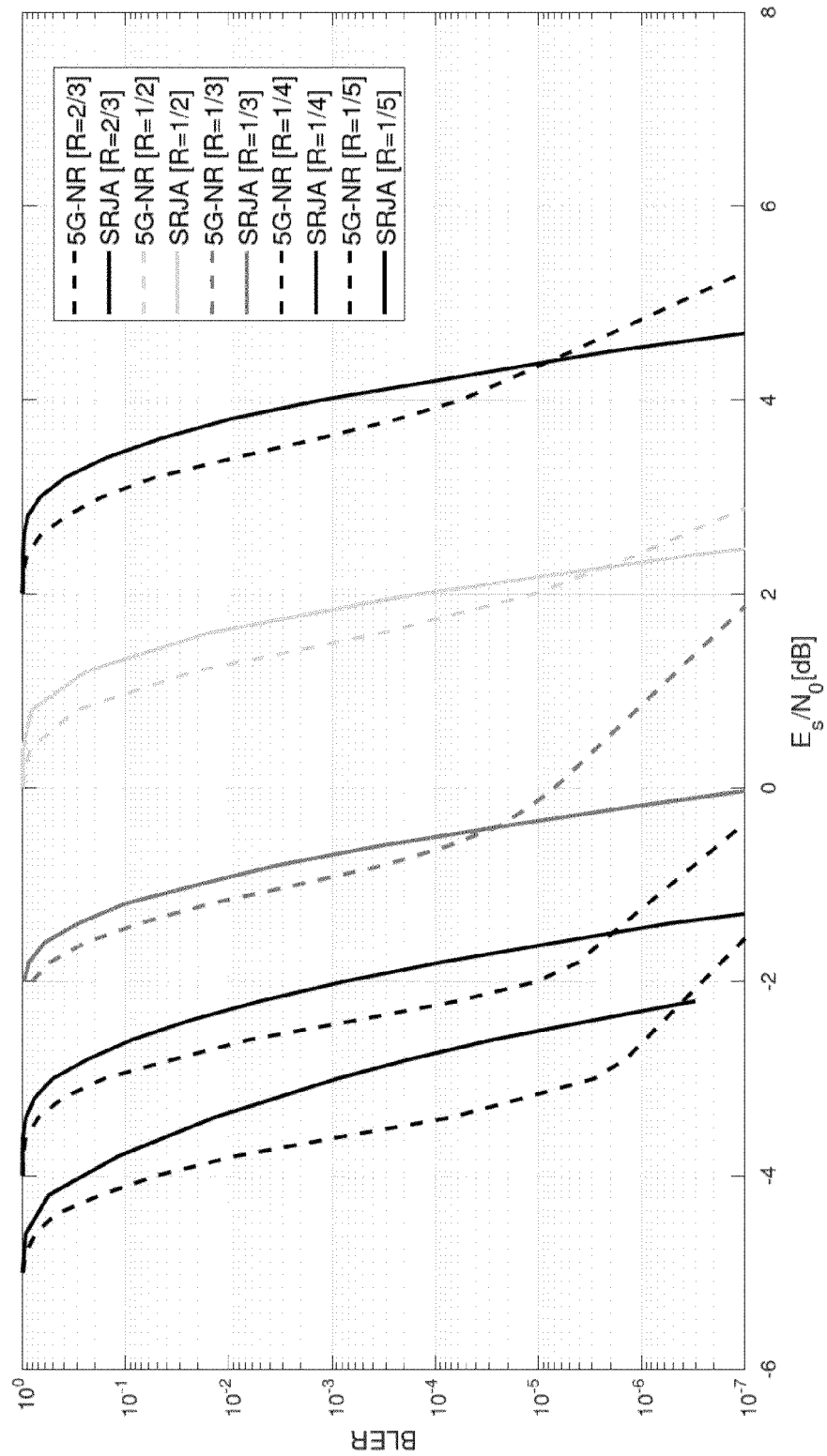
FIG. 28 is a diagram illustrating performance (BLER performance and encoding complexity) of SRJA code as compared to LDPC codes of 5G NR.

FIG. 28 is a diagram illustrating performance (BLER performance and encoding complexity) of SRJA code as compared to LDPC codes of 5G NR.

Parity check matrices (PCMs) of LDPC codes (BG2) of 5G NR have been used, and PCMs of the proposed SRJA codes have been constructed using the approximate cycle extrinsic (ACE) message degree from the basegraphs shown in Equation 31. The ACE algorithm is limited to a minimum girth of 6.

For representative performance evaluation, it is assumed that a standard flooding sum-product algorithm (SPA) based on a message-passing decoder having 50 iterations is used.

Iteration Decoding Threshold

As described above, the iteration decoding threshold can be obtained by PEXIT chart analysis, and the results of the proposed SRJA code and the 5G-NR LDPC code are shown in the following table.

The iterative decoding thresholds of the proposed SRJA code are not better than those of 5G-NR LDPC. However, the proposed SRJA code has LMDG characteristics, so that the BLER slope of the proposed SRJA code is steeper than the BLER slope of 5G-NR LDPC code, so that loss of a decoding threshold is typically negligible at a high-reliability level.

Table 13 shows the iteration decoding threshold and encoder complexity for each code rate of the 5G-NR LDPC code and the SRJA code.

TABLE 13

| code rate (r) | | 2/3 | 1/2 | 1/3 | 1/4 | 1/5 |
|---|---|---|---|---|---|---|
| 5G-NR LDPC Code | threshold | 1.30 dB | 0.46 dB | −0.28 dB | −0.47 dB | −0.70 dB |
| | Λ | 47Z | 67Z | 101Z | 120Z | 157Z |
| SRJA code | threshold | 1.74 dB | 0.87 dB | −0.02 dB | −0.23 dB | −0.32 dB |
| | Λ | 35Z | 51Z | 78Z | 99Z | 120Z |

Encoder Complexity

As described above, encoding complexity can be measured by the number of binary sums. The encoder complexity of the proposed SRJA code and the encoder complexity of the 5G-NR LDPC code are shown in Table 13.

The lifting size is set to Z, and the encoder complexity of the 5G-NR LDPC code can be obtained based on Equation 39.

Referring to Table 13, the proposed SRJA code is more complex than the 5G-NR LDPC code, because the SRJA code has a smaller graph than the 5G-NR LDPC code. However, for a given information length (K), the encoder complexity of the SRJA code may be almost identical to the encoder complexity of the 5G-NR LDPC code using a cyclic shift matrix larger than the 5G-NR LDPC code. However, for the same information length, since the cyclic shift matrices of the proposed SRJA code are greater than the cyclic shift matrices of the 5G-NR LDPC code, the proposed SRJA code can obtain higher parallelism than the 5G-NR LDPC code.

FIG. 28 is a diagram illustrating a BLER performance curve at the information length K=1000.

BLER Performance

Iterative Monte Carlo simulation is used until 200 frame errors are generated, the BLER performance results are obtained in AWGN channel based on QPSK modulation.

The solid lines may represent the SRJA code BLER curve, and the dashed lines may represent the 5G-NR LDPC code curve.

In 5G-NR LDPC code, the number of information columns of the basegraph is set to 10, and Z is set to 104 (i.e., Z=104). For rate matching, information shortening and parity puncturing have been selected. In SRJA code, Z=128, and the number of information columns of the basegraph is 8. A similar methodology has been adopted for rate matching.

Although the SRJA code uses a smaller basegraph than the 5G-NR LDPC code, the proposed SRJA code may indicate BLER performance similar to 5G-NR LDPC code at a low reliability reference (except the code rate 1/5). Further, at a high reliability reference, the SRJA code proposed is better than the 5G-NR LDPC code. This is because the error floor occurs in 5G-NR LDPC code. As the required reliability increases, the SRJA code does not suffer from the error floor, so that it will be important that the SRKA code has a higher performance gain than the 5G-NR LDPC code.

A special structure of the basegraph and the PCM parity part is an essential part of the SRJA code. The basegraph and the PCM parity part are divided into four portions (i.e., a left-top portion, a right-top portion, a left-bottom portion, and a right-bottom portion).

1) In a special structure in view of the basegraph, both of the left-bottom portion and the right-top portion are dual diagonal matrices, and the remaining parts (i.e., the left-top portion and the right-bottom portion) are diagonal matrices other than the left-top portion or the right-bottom portion. In addition, '1' is located at a maximum position of the right-bottom portion.

2) In the left-bottom portion In the standpoint of PCM, the left-bottom portion is constructed by left-1 cyclic shifted identity submatrices of identity submatrices masked with 1 bit, and the other parts are composed of identity submatrices only.

In addition, the SRJA code can be RU-encoded, and may have LMDG characteristics.

By simple recursive approach, superior basegraphs for the proposed RC-SRJA code have been proposed. The proposed basegraphs may have a significantly superior iteration decoding threshold along with LMDG characteristics.

In addition, an efficient and universal encoding method for the proposed SRJA code and the encoder complexity analysis for the corresponding encoding method are provided.

The simulation results indicate that the proposed SRJA code has better BLER performance than the 5G-NR LDPC code in a high-reliability situation. Meanwhile, the SRJA code has lower encoding complexity that is similar to or less than that of the 5G-NR LDPC code.

Thus, the proposed SRJA code may be a promising candidate for beyond-5G or 6G use cases that require super ultra-reliability and low-latency at a lower complexity.

Figure 29:
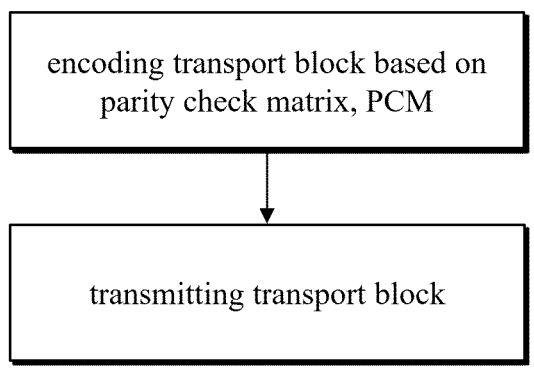
FIG. 29 is a flowchart illustrating a method for transmitting an information block based on a low density parity check (LDPC) code in a wireless communication system according to the present disclosure.

FIG. 29 is a flowchart illustrating a method for transmitting the information block based on the low density parity check (LDPC) code in a wireless communication system according to the present disclosure The method for transmitting the information block based on the LDPC code in a wireless communication system may include: encoding the information block based on the LDPC basegraph (H_BG) in which $$\begin{pmatrix} A\_BG & B\_BG & T\_BG \\ C\_BG & D\_BG & E\_BG \end{pmatrix}$$

is located at the left-upper end thereof; and transmitting the encoded information block. Each element of the LDPC basegraph (H_BG) is '0' or '1'. Each element '0' from among the elements of the basegraph (H_BG) may represent a (Z×Z) zero matrix. Each element '1' from among the elements of the basegraph (H_BG) may represent a (Z×Z) matrix obtained based on a circular permutation matrix obtained by cyclic-shifting the Z×Z identity matrix to the left or to the right. The submatrix (T_BG) of H_BG may be a dual diagonal matrix, and the submatrix (D_BG) of H_BG may be a dual diagonal matrix.

The information block can be encoded based on the parity check matrix (PCM) H in which $$\begin{pmatrix} A & B & T \\ C & D & E \end{pmatrix}$$

corresponding to the basegraph H_BG is located at the position of a left-upper end.

In the Z×Z matrix in which the respective diagonal elements of the submatrix D_BG are replaced with other elements, all elements of a first row of the Z×Z circular permutation matrix corresponding to the replaced Z×Z matrix may have value of zero (0).

The submatrix A_BG and the submatrix C_BG may correspond to the information part, and the information part B_BG, the submatrix D_BG, the submatrix T_BG, and the submatrix E_BG may correspond to the parity part.

The submatrix B_BG may be an M×M identity matrix (where M is an natural number), the submatrix E_BG may be an M×M identity matrix, the submatrix D_BG may be an (M×M) matrix, and the submatrix may be an M×M matrix.

The submatrix A_BG and the submatrix C_BG may correspond to the information part. The submatrix B_BG, the submatrix D_BG, the submatrix T_BG, and the submatrix E_BG may correspond to the parity part.

The submatrix D_BG may be an M1×M1 matrix (where M1 is an natural number). The submatrix T_BG may be an M2×M2 matrix (where M2 is an natural number). The submatrix B_BG may be an M2×M1 matrix. In the submatrix B_BG, the element of the last row of the last column is set to '1', and each element of the remaining rows of the last column is set to '0'. One element included in each of the columns ranging from the first column to the (M1−1)-th column of the submatrix B_BG may be set to '1'. The remaining elements included in each of the columns ranging from the first column to the (M1−1)-th column of the submatrix B_BG may be set to '0'. The submatrix E_BG is an M1×M2 matrix. The element of the last column of the last row of the submatrix E_BG may be set to '1'. Each element of the remaining columns of the last row of the submatrix E_BG may be set to '0'. One element included in each of the rows from the first row to the (M1−1) row of the submatrix E_BG may be set to' P. The remaining elements included in each of the columns ranging from the first row to the (M1−1)-th row of the submatrix E_BG may be set to '0'.

A method for transmitting the information block based on the LDPC code in a wireless communication system may include: encoding the information block based on the LDPC basegraph (H_BG) including $$\begin{pmatrix} A\_BG & B\_BG & T\_BG \\ C\_BG & D\_BG & E\_BG \end{pmatrix};$$

and transmitting the encoded information block. Each element of the basegraph H_BG may be set to '0' or '1'. Each element '0' from among the elements of the basegraph H_BG may represent a Z×Z zero matrix. Each element '1' from among the elements of the basegraph H_BG may represent a Z×Z matrix that is obtained based on a circular permutation matrix obtained by cyclic-shifting the Z×Z identity matrix to the left or to the right. The submatrix T_BG of the basegraph H_BG may be a dual diagonal matrix, and the submatrix D_BG of the basegraph H_BG may be a dual diagonal matrix.

Encoding the information block based on the basegraph H_BG may include encoding the information block based on the parity check matrix (PCM) H corresponding to the basegraph H_BG.

The cyclic shifting value (p) corresponding to each element '1' of the LDPC basegraph H_BG is predetermined, and The Z×Z circular permutation matrix may be obtained by cyclic-shifting the Z×Z identity matrix to the right by a specific value 'mod (p, Z)'. 'mod(p, Z)' is the remainder that is obtained by dividing the value of p by the value of Z.

The parity check matrix (PCM) H may include $$\begin{pmatrix} A & B & T \\ C & D & E \end{pmatrix}.$$

The submatrices A_BG, B_BG, C_BG, D_BG, E_BG, and T_BG may correspond to the submatrices A, B, C, D, E, and T, respectively. If the submatrix A_BG is an M1×K matrix, the submatrix A may be a (Z*M1)×(Z*K) matrix. If the systematic bit sequence (s), the first parity bit sequence (p1), and the second parity bit sequence (p2), that are calculated with the parity check matrix (PCM) H, are decided, the parameters s, p1, and p2 can be determined to satisfy Equation 15. The method for encoding the information block based on the LDPC code may include determining the parameters s, p1, and p.

The encoded information block may include the systematic bit sequence (s), the first parity bit sequence (p1), the second parity bit sequence (p2), and the third parity bit sequence (p3). Here, the values of p1, p2, and p3 can be determined to satisfy $$H \begin{pmatrix} s \\ p1 \\ p2 \\ p3 \end{pmatrix} = 0,$$

where p1 is denoted by $(ET^{-1}B+D)^{-1} (ET^{-1} A+C)s$ and p2 is denoted by $(T^{-1} A) s+(T^{-1}B)p1$.

In the Z×Z matrix represented by each of the diagonal elements of the submatrix D_BG, all elements of the first row of the corresponding Z×Z circular permutation matrix may be set to zero '0'. In general, calculation of the Z×Z circular permutation matrix may be performed by bit-shifting the input bit sequence in response to the degree of cyclic shifting, instead of by directly calculating the matrix calculation of the circular permutation matrix. In this case, only one element from among the first row of the Z×Z circular permutation matrix obtained by cyclic-shifting the Z×Z identity matrix may be set to '1'. The operation of changing only one element from among the elements of the first row to the value of '0' may also be referred to as masking of the one element.

The submatrix A_BG and the submatrix C_BG may correspond to the information part. The submatrix B_BG, the submatrix D_BG, the submatrix T_BG, and the submatrix E_BG may correspond to the parity part. The submatrix B_BG is an M×M identity matrix (where M is a natural number). The submatrix E_BG may be an M×M identity matrix. The submatrix D_BG may be an M×M identity matrix. The submatrix T_BG may be an M×M identity matrix.

The submatrix A_BG and the submatrix C_BG may correspond to the information part. The submatrix B_BG, the submatrix D_BG, the submatrix T_BG, and the submatrix E_BG may correspond to the parity part. The submatrix D_BG is an M1×M1 matrix (where M1 is a natural number). The submatrix T_BG may be an M2×M2 matrix (where M2 is a natural number). The submatrix B_BG may be an M2×M1 matrix. In the submatrix B_BG, the element of the last row of the last column is set to '1', each of the elements of the remaining rows of the last column is set to '0', one element included in each of the columns from the first column to the (M1−1)-th column of the submatrix B_BG is set to '1', and the remaining elements included in each of the columns from the first column to the (M1−1)-th column of the submatrix B_BG are set to '0'. The submatrix E_BG is an M1×M2 matrix, the element of the last column of the last row of the submatrix E_BG may be set to '1', each of the elements of the remaining columns of the last row of the submatrix E_BG may be set to '0', one element included in each of the rows from the first row to the (M1−1)-th row of the submatrix E_BG may be set to '1', and the remaining elements included in each of the rows from the first row to the (M1−1)-th row of the submatrix E_BG may be set to '0'.

A device for transmitting the information block based on the LDPC code in a wireless communication system according to the present disclosure may include a transceiver, a memory, and at least one processor connected to the transceiver and the memory.

When the memory is executed, the memory may store instructions that enable the at least one processor to perform operations. Here, the operations may include encoding the information block based on the LDPC basegraph H_BG including $$\begin{pmatrix} A\_BG & B\_BG & T\_BG \\ C\_BG & D\_BG & E\_BG \end{pmatrix},$$

and transmitting the encoded information block. Each element of the basegraph H_BG is set to '0' or '1'.

Each element '0' of the basegraph H_BG may represent a Z×Z zero matrix. Each element '1' of the basegraph H_BG may represent a Z×Z matrix obtained based on a circular permutation matrix that is obtained by cyclic-shifting the Z×Z identity matrix to the left or to the right. The submatrix T_BG of the basegraph H_BG may be a dual diagonal matrix. The submatrix D_BG of the basegraph H_BG may be a dual diagonal matrix.

The transmission (Tx) device according to the present disclosure can be mounted or embedded in an autonomous driving device that is configured to communicate with at least one of a mobile terminal, a base station (BS), and an autonomous vehicle.

Figure 30:
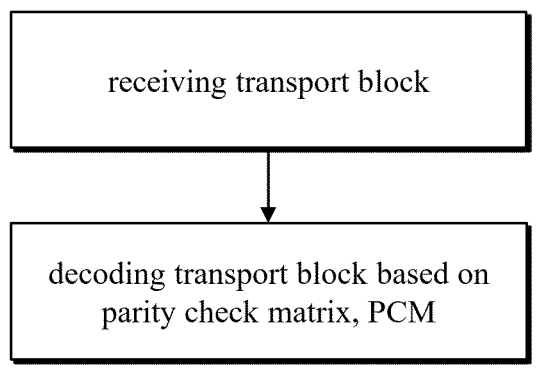
FIG. 30 is a flowchart illustrating a method for receiving an information block based on an LDPC code in a wireless communication system according to the present disclosure.

FIG. 30 is a flowchart illustrating a method for receiving the information block based on the LDPC code in a wireless communication system according to the present disclosure.

Referring to FIG. 30, a method for receiving the information block based on the LDPC code in a wireless communication system may include receiving the encoded information block, and decoding the information block based on the LDPC basegraph (H_BG) including $$\begin{pmatrix} A\_BG & B\_BG & T\_BG \\ C\_BG & D\_BG & E\_BG \end{pmatrix}.$$

Each element of the basegraph H_BG is set to '0' or '1'. Each element '0' of the basegraph H_BG may represent a Z×Z zero matrix. Each element '1' of the basegraph H_BG may represent a Z×Z matrix obtained based on a circular permutation matrix that is obtained by cyclic-shifting the Z×Z identity matrix to the left or to the right. The submatrix T_BG may be a dual diagonal matrix. The submatrix D_BG may be a dual diagonal matrix.

Encoding the information block based on the basegraph H_BG may include encoding the information block based on the PCM (H) corresponding to the basegraph H_BG.

The parity check matrix (PCM) H may include $$\begin{pmatrix} A & B & T \\ C & D & E \end{pmatrix}.$$

The submatrices A_BG, B_BG, C_BG, D_BG, E_BG, and T_BG may correspond to the submatrices A, B, C, D, E, and T, respectively. If the submatrix A_BG is an M1×K matrix, the submatrix A may be a (Z*M1)×(Z*K) matrix. The received encoded information block may include a systematic bit sequence (s), a first parity bit sequence (p1), and a second parity bit sequence (p2). By substituting the parameters s, p1, and p2 into Equation 15, it can be seen that the right side is zero (i.e., a zero matrix). Decoding the information block based on the LDPC code according to the present disclosure may include confirming whether Equation 15 is satisfied by substituting the parameters s, p1, and p2 into Equation 15.

The above-described embodiments correspond to combinations of elements and features of the present disclosure in prescribed forms. And, the respective elements or features may be considered as selective unless they are explicitly mentioned. Each of the elements or features can be implemented in a form failing to be combined with other elements or features. Moreover, it is able to implement an embodiment of the present disclosure by combining elements and/or features together in part. A sequence of operations explained for each embodiment of the present disclosure can be modified. Some configurations or features of one embodiment can be included in another embodiment or can be substituted for corresponding configurations or features of another embodiment. And, it is apparently understandable that an embodiment is configured by combining claims failing to have relation of explicit citation in the appended claims together or can be included as new claims by amendment after filing an application.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

A method and device for transmitting the information block based on the LDPC code in a wireless communication system according to the present disclosure can be industrially applied to a variety of wireless communication systems, for example, 3GPP based communication system (LTE/LTE-A system, a 5G communication system), and a Wi-Fi communication system.

What is claimed is:

1. A method for transmitting an information block based on a low density parity check (LDPC) code by a user equipment (UE) in a wireless communication system, the method comprising:
    encoding the information block based on a LDPC basegraph (H_BG);
    obtaining coded bits based on a result of the encoding;
    performing rate matching based on the coded bits;
    performing code block concatenation based on a result of the rate matching; and
    transmitting output bits obtained based on a result of the code block concatenation,
    wherein each element of the LDPC basegraph (H_BG) is '0' or '1',
    each element '0' from among elements of the LDPC basegraph (H_BG) represents a (Z×Z) zero matrix, and
    each element '1' from among elements of the LDPC basegraph (H_BG) represents a (Z×Z) matrix obtained based on a circular permutation matrix that is formed by cyclic-shifting a (Z×Z) identity matrix to the left or to the right,
    wherein the LDPC basegraph (H_BG) includes $$\begin{pmatrix} A\_BG & B\_BG & T\_BG \\ C\_BG & D\_BG & E\_BG \end{pmatrix},$$

a submatrix (T_BG) of the LDPC basegraph (H_BG) is a dual diagonal matrix, and
    a submatrix (D_BG) of the LDPC basegraph (H_BG) is a dual diagonal matrix.

2. The method according to claim 1,
    wherein the encoding of the information block based on the LDPC basegraph (H_BG) comprises encoding the information block based on a parity check matrix (PCM) (H) corresponding to the LDPC basegraph (H_BG).

3. The method according to claim 1,
    wherein a (Z×Z) matrix represented by each diagonal element of the submatrix (D_BG) is configured in a manner that all elements of a first row of a corresponding (Z×Z) circular permutation matrix are '0'.

4. The method according to claim 1,
    wherein a submatrix (A_BG) and a submatrix (C_BG) correspond to an information part and
    a submatrix (B_BG), a submatrix (D_BG), a submatrix (T_BG), and a submatrix (E_BG) correspond to a parity part,
    wherein the submatrix (B_BG) is an (M×M) identity matrix (where M is a natural number), the submatrix (E_BG) is an (M×M) identity matrix, the submatrix (D_BG) is an (M×M) matrix, and the submatrix (T_BG) is an (M×M) matrix.

5. The method according to claim 1,
    wherein a submatrix (A_BG) and a submatrix (C_BG) correspond to an information part, and a submatrix (B_BG), a submatrix (D_BG), a submatrix (T_BG), and a submatrix (E_BG) correspond to a parity part, wherein the submatrix (D_BG) is an (M1×M1) matrix (where M1 is a natural number), the submatrix (T_BG) is an (M2×M2) matrix (where M2 is a natural number), the submatrix (B_BG) is an (M2×M1) matrix, wherein an element of a last row of a last column of the submatrix (B_BG) is '1', each of elements of remaining rows of the last column is '0', one element included in each of columns from a first column to an (M1−1)-th column of the submatrix (B_BG) is to '1', and remaining elements included in each of the columns from the first column to the (M1−1)-th column of the submatrix (B_BG) are '0', wherein the submatrix (E_BG) is an (M1×M2) matrix, wherein an element of a last column of a last row of the submatrix (E_BG) is '1', each of elements included in remaining columns of the last row of the submatrix (E_BG) is '0', one element included in each of rows from a first row to an (M1−1)-th row of the submatrix (E_BG) is '1', and remaining elements included in each of the rows from the first row to the (M1−1)-th row of the submatrix (E_BG) are '0'.

6. A method for receiving an information block based on a low density parity check (LDPC) code in a wireless communication system, the method comprising:

receiving bits;

obtaining coded bits from the received bits; and decoding the coded bits based on a LDPC basegraph (H_BG) to obtain the information block, wherein each element of the LDPC basegraph (H_BG) is '0' or '1', each element '0' from among elements of the LDPC basegraph (H_BG) represents a (Z×Z) zero matrix, and each element '1' from among elements of the LDPC basegraph (H_BG) represents a (Z×Z) matrix obtained based on a circular permutation matrix that is obtained by cyclic-shifting a (Z×Z) identity matrix to the left or to the right, wherein the LDPC basegraph (H_BG) includes $$\begin{pmatrix} A\_BG & B\_BG & T\_BG \\ C\_BG & D\_BG & E\_BG \end{pmatrix},$$

a submatrix (T_BG) is a dual diagonal matrix, and a submatrix (D_BG) is a dual diagonal matrix.

7. The method according to claim 6, wherein the decoding of the information block based on the LDPC basegraph (H_BG) comprises decoding the information block based on a parity check matrix (PCM) (H) corresponding to the LDPC basegraph (H_BG).

8. The method according to claim 6, wherein a (Z×Z) matrix represented by each diagonal element of the submatrix (D_BG) is configured in a manner that all elements of a first row of a corresponding (Z×Z) circular permutation matrix are '0'.

9. The method according to claim 7, wherein a submatrix (A_BG) and a submatrix (C_BG) correspond to an information part, and a submatrix (B_BG), a submatrix (D_BG), a submatrix (T_BG), and a submatrix (E_BG) correspond to a parity part, wherein the submatrix (B_BG) is an (M×M) identity matrix (where M is a natural number), the submatrix (E_BG) is an (M×M) identity matrix, the submatrix (D_BG) is an (M×M) matrix, and the submatrix (T_BG) is an (M×M) matrix.

10. The method according to claim 6, wherein a submatrix (A_BG) and a submatrix (C_BG) correspond to an information part, and a submatrix (B_BG), a submatrix (D_BG), a submatrix (T_BG), and a submatrix (E_BG) correspond to a parity part, wherein the submatrix (D_BG) is an (M1×M1) matrix (where M1 is a natural number), the submatrix (T_BG) is an (M2×M2) matrix (where M2 is a natural number), the submatrix (B_BG) is an (M2×M1) matrix, wherein an element of a last row of a last column of the submatrix (B_BG) is '1', each of elements of remaining rows of the last column is '0', one element included in each of columns from a first column to an (M1−1)-th column of the submatrix (B_BG) is '1', and remaining elements included in each of the columns from the first column to the (M1−1)-th column of the submatrix (B_BG) are '0', wherein the submatrix (E_BG) is an (M1×M2) matrix, wherein an element of a last column of a last row of the submatrix (E_BG) is '1', each of elements of remaining columns of the last row of the submatrix (E_BG) is set to '0', one element included in each of rows from a first row to an (M1−1)-th row of the submatrix (E_BG) is '1', and remaining elements included in each of the rows from the first row to the (M1−1)-th row of the submatrix (E_BG) are '0'.

11. A device for transmitting an information block based on a low density parity check (LDPC) code in a wireless communication system, the device comprising:

a transceiver;

a memory; and at least one processor connected to the transceiver and the memory, wherein the memory is configured to store instructions causing, when executed, the at least one processor to perform operations comprising:

encoding the information block based on a LDPC basegraph (H_BG);

obtaining coded bits based on a result of the encoding;

performing rate matching based on the coded bits;

performing code block concatenation based on a result of the rate matching; and transmitting output bits obtained based on a result of the code block concatenation, wherein each element of the LDPC basegraph (H_BG) is '0' or '1', each element '0' from among elements of the LDPC basegraph (H_BG) represents a (Z×Z) zero matrix, and each element '1' from among elements of the LDPC basegraph (H_BG) represents a (Z×Z) matrix obtained based on a circular permutation matrix that is obtained by cyclic-shifting a (Z×Z) identity matrix to the left or to the right, wherein the LDPC basegraph (H_BG) includes $$\begin{pmatrix} A\_BG & B\_BG & T\_BG \\ C\_BG & D\_BG & E\_BG \end{pmatrix},$$

a submatrix (T_BG) of the LDPC basegraph (H_BG) is a dual diagonal matrix, and a submatrix (D_BG) of the LDPC basegraph (H_BG) is a dual diagonal matrix.

12. The device according to claim 11, wherein the operations further include:
   encoding the information block based on a parity check matrix (PCM) (H) corresponding to the LDPC basegraph (H_BG).
13. The device according to claim 11,
   wherein a (Z×Z) matrix represented by each diagonal element of the submatrix (D_BG) is configured in a manner that all elements of a first row of a corresponding (Z×Z) circular permutation matrix are '0'.
14. The device according to claim 11,
   wherein a submatrix (A_BG) and a submatrix (C_BG) correspond to an information part, and a submatrix (B_BG), a submatrix (D_BG), a submatrix (T_BG), and a submatrix (E_BG) correspond to a parity part,
   wherein the submatrix (B_BG) is an (M×M) identity matrix (where M is a natural number), the submatrix (E_BG) is an (M×M) identity matrix, the submatrix (D_BG) is an (M×M) matrix, and the submatrix (T_BG) is an (M×M) matrix.
15. The device according to claim 11,
   wherein a submatrix (A_BG) and a submatrix (C_BG) correspond to an information part, and a submatrix (B_BG), a submatrix (D_BG), a submatrix (T_BG), and a submatrix (E_BG) correspond to a parity part,
   wherein the submatrix (D_BG) is an (M1×M1) matrix (where M1 is a natural number), the submatrix (T_BG) is an (M2×M2) matrix (where M2 is a natural number), the submatrix (B_BG) is an (M2×M1) matrix,
   wherein an element of a last row of a last column of the submatrix (B_BG) is '1', each of elements of remaining rows of the last column is '0', one element included in each of columns from a first column to an (M1−1)-th column of the submatrix (B_BG) is '1', and remaining elements included in each of the columns from the first column to the (M1−1)-th column of the submatrix (B_BG) are '0',
   wherein the submatrix (E_BG) is an (M1×M2) matrix, and
   wherein an element of a last column of a last row of the submatrix (E_BG) is '1', each of elements of remaining columns of the last row of the submatrix (E_BG) is '0', one element included in each of rows from a first row to an (M1−1)-th row of the submatrix (E_BG) is '1', and remaining elements included in each of the rows from the first row to the (M1−1)-th row of the submatrix (E_BG) are '0'.
16. A device for receiving an information block based on a low density parity check (LDPC) code in a wireless communication system, the device comprising:
   a transceiver;
   a memory; and
   at least one processor connected to the transceiver and the memory,
   wherein the memory is configured to store instructions causing, when executed, the at least one processor to perform operations comprising:
   receiving bits;
   obtaining coded bits from the received bits; and
   decoding the coded bits based on a LDPC basegraph (H_BG) to obtain the information block,
   wherein each element of the LDPC basegraph (H_BG) is '0' or '1',
   each element '0' from among elements of the LDPC basegraph (H_BG) represents a (Z×Z) zero matrix, and
   each element '1' from among elements of the LDPC basegraph (H_BG) represents a (Z×Z) matrix obtained based on a circular permutation matrix that is obtained by cyclic-shifting a (Z×Z) identity matrix to the left or to the right,
   wherein the LDPC basegraph (H_BG) includes $$\begin{pmatrix} A\_BG & B\_BG & T\_BG \\ C\_BG & D\_BG & E\_BG \end{pmatrix},$$

a submatrix (T_BG) is a dual diagonal matrix, and
   a submatrix (D_BG) is a dual diagonal matrix.
17. The device according to claim 16, wherein the operations further include:
   decoding the information block based on a parity check matrix (PCM) (H) corresponding to the LDPC basegraph (H_BG).
18. The device according to claim 16,
   wherein a (Z×Z) matrix represented by each diagonal element of the submatrix (D_BG) is configured in a manner that all elements of a first row of a corresponding (Z×Z) circular permutation matrix are '0'.
19. The device according to claim 16,
   wherein a submatrix (A_BG) and a submatrix (C_BG) correspond to an information part, and a submatrix (B_BG), a submatrix (D_BG), a submatrix (T_BG), and a submatrix (E_BG) correspond to a parity part,
   wherein the submatrix (B_BG) is an (M×M) identity matrix (where M is a natural number), the submatrix (E_BG) is an (M×M) identity matrix, the submatrix (D_BG) is an (M×M) matrix, and the submatrix (T_BG) is an (M×M) matrix.
20. The device according to claim 16,
   wherein a submatrix (A_BG) and a submatrix (C_BG) correspond to an information part, and a submatrix (B_BG), a submatrix (D_BG), a submatrix (T_BG), and a submatrix (E_BG) correspond to a parity part,
   wherein the submatrix (D_BG) is an (M1×M1) matrix (where M1 is a natural number), the submatrix (T_BG) is an (M2×M2) matrix (where M2 is a natural number), the submatrix (B_BG) is an (M2×M1) matrix,
   wherein an element of a last row of a last column of the submatrix (B_BG) is '1', each of elements of remaining rows of the last column is '0', one element included in each of columns from a first column to an (M1−1)-th column of the submatrix (B_BG) is '1', and remaining elements included in each of the columns from the first column to the (M1−1)-th column of the submatrix (B_BG) are '0',
   wherein the submatrix (E_BG) is an (M1×M2) matrix, and
   wherein an element of a last column of a last row of the submatrix (E_BG) is '1', each of elements of remaining columns of the last row of the submatrix (E_BG) is '0', one element included in each of rows from a first row to an (M1−1)-th row of the submatrix (E_BG) is '1', and remaining elements included in each of the rows from the first row to the (M1−1)-th row of the submatrix (E_BG) are '0'.

* * * * *